United States Patent [19]

Hikawa et al.

[11] Patent Number: 5,526,306

[45] Date of Patent: Jun. 11, 1996

[54] SEMICONDUCTOR MEMORY DEVICE AND METHOD OF FABRICATING THE SAME

[75] Inventors: Tetsuo Hikawa; Akira Takata; Takashi Sawada, all of Suita, Japan

[73] Assignee: Mega Chips Corporation, Suita, Japan

[21] Appl. No.: 255,947

[22] Filed: Jun. 7, 1994

[30] Foreign Application Priority Data

Feb. 10, 1994 [JP] Japan .................................. 6-016637

[51] Int. Cl.⁶ ...................................................... G11C 11/34
[52] U.S. Cl. ........................... 365/182; 365/184; 365/168; 365/104; 257/390
[58] Field of Search .............................. 365/182, 94, 103, 365/104, 184, 168; 257/390, 391, 392

[56] References Cited

U.S. PATENT DOCUMENTS 4,990,999  2/1991  Oishi et al. .

FOREIGN PATENT DOCUMENTS

| | | |
|---|---|---|
| 55-80888 | 6/1980 | Japan . |
| 356103462 | 8/1981 | Japan ..................................... 257/390 |
| 58-209155 | 12/1983 | Japan . |
| 60-3711 | 1/1985 | Japan . |
| 61-41078 | 9/1986 | Japan . |
| 61-46065 | 10/1986 | Japan . |
| 61-263263 | 11/1986 | Japan . |
| 4-229493 | 8/1992 | Japan . |
| 4-257260 | 9/1992 | Japan . |
| 5-48044 | 2/1993 | Japan . |
| 5-235308 | 9/1993 | Japan . |
| 5-283654 | 10/1993 | Japan . |

OTHER PUBLICATIONS

Robert Lineback, Four-state cell called density key, Jun. 30, 1982 pp. 81–82.

Nikkei Microdevices, Dec. 1993, pp. 128–129, Yohei Mochizuki, "64M Mask ROM/Sharp Corporation".

Primary Examiner—David C. Nelms
Assistant Examiner—Huan Hoang
Attorney, Agent, or Firm—Oblon, Spivak, McClelland, Maier & Neustadt

[57] ABSTRACT

In order to improve the degree of storage data integration, side walls (32) are selectively formed on side surfaces of word lines (22) to serve as masks for changing ON-state current values of memory cells by changing widths or lengths of active regions (24) of the memory cells, thereby forming several of types of memory cells having different electrical properties. Storage data per memory cell is therefore so multivalued that the number of memory cells is reduced.

18 Claims, 62 Drawing Sheets

FIG. 7

| MEMORY CELL | ON-STATE CURRENT OF MEMORY CELL | OUTPUT OF SENSE CIRCUIT (A) (B) (C) | OUTPUT OF DECISION CIRCUIT (1) (2) |
|---|---|---|---|
| M3 | (iii) | L  L  L | L  L |
| M2 | (ii) | L  L  H | L  H |
| M1 | (i) | L  H  H | H  L |
| M0 | (0) | H  H  H | H  H |

F I G. 1 5
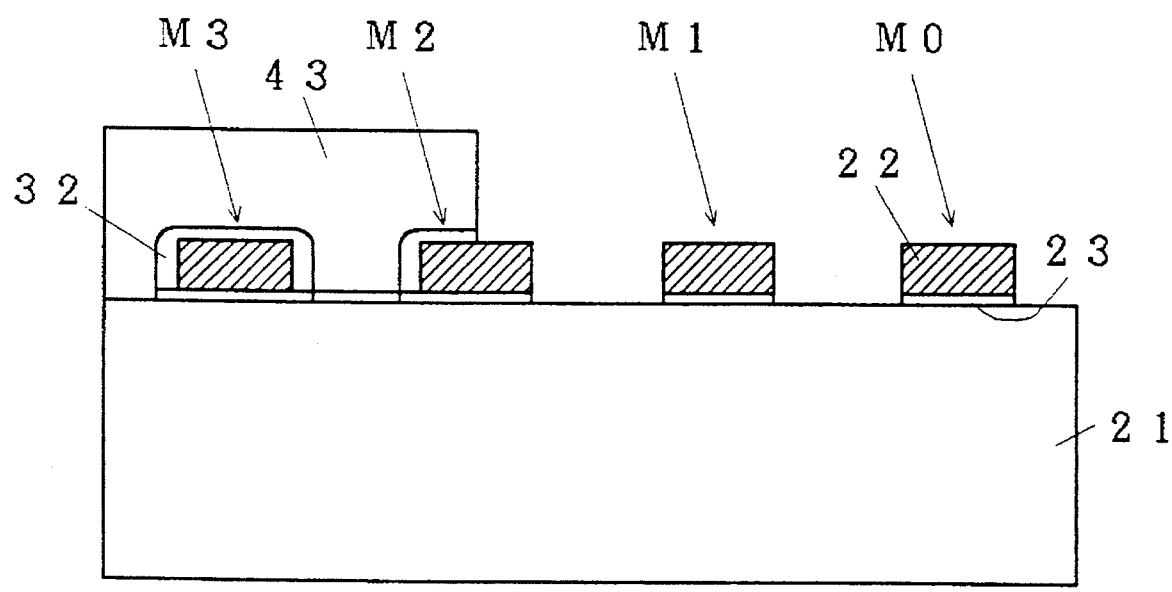

FIG. 33

| ON-STATE CURRENT OF MEMORY CELL TRANSISTOR | | OUTPUT OF SENSE CIRCUIT | | | | OUTPUT OF DECISION CIRCUIT | | |
|---|---|---|---|---|---|---|---|---|
| 36a | 36b | (A) | (B) | (C) | (D) | (1) | (2) | (3) |
| (ii) | (ii) | L | L | L | L | L | L | L |
| (ii) | (i) | L | L | L | H | L | L | H |
| (ii) | (0) | L | L | H | H | L | H | L |
| (i) | (ii) | L | H | L | L | L | H | H |
| (i) | (i) | L | H | L | H | H | L | L |
| (i) | (0) | L | H | H | H | H | L | H |
| (0) | (ii) | H | H | L | L | H | H | L |
| (0) | (i) | H | H | L | H | H | H | H |
| (0) | (0) | H | H | H | H | (ERROR DECISION) | | |

FIG. 60
PRIOR ART

| | B0 | G0 | B1 | G1 | B2 | G2 | B3 | G3 | B4 | G4 | B5 | G5 | B6 | G6 | B7 |
|---|---|---|---|---|---|---|---|---|---|---|---|---|---|---|---|
| S1 | H | H | L | H | H | L | L | L | L | L | L | L | L | L | L |
| S2 | L | L | H | H | L | H | H | L | L | L | L | L | L | L | L |
| S3 | L | L | L | L | H | H | L | H | H | L | L | L | L | L | L |
| S4 | L | L | L | L | L | L | H | H | L | H | H | L | L | L | L |
| S5 | L | L | L | L | L | L | L | L | H | H | L | H | H | L | L |
| S6 | L | L | L | L | L | L | L | L | L | L | H | H | L | H | H |

FIG. 62

| | B0 | G0 | B1 | G1 | B2 | G2 | B3 | G3 | B4 | G4 | B5 | G5 | B6 | G6 | B7 |
|---|---|---|---|---|---|---|---|---|---|---|---|---|---|---|---|
| S1 | H | H | H | L | L | L | L | L | L | L | L | L | L | L | L |
| S2 | L | L | H | H | H | L | L | L | L | L | L | L | L | L | L |
| S3 | L | L | L | L | H | H | H | L | L | L | L | L | L | L | L |
| S4 | L | L | L | L | L | L | H | H | H | L | L | L | L | L | L |
| S5 | L | L | L | L | L | L | L | L | H | H | H | L | L | L | L |
| S6 | L | L | L | L | L | L | L | L | L | L | H | H | H | L | L |
| S6 | L | L | L | L | L | L | L | L | L | L | L | L | H | H | H |

SEMICONDUCTOR MEMORY DEVICE AND METHOD OF FABRICATING THE SAME

BACKGROUND OF THE INVENTION

1. Field of the Invention

The present invention relates to a highly integrated read-only memory (ROM) which is at a low cost, and a method of fabricating the same.

2. Background of the Invention

In a mask ROM which is a nonvolatile memory, data are written in response to masking patterns in a stage of fabrication and a basic structure of each memory cell is formed by a 1-bit single transistor, whereby an occupied area per bit is small as compared with other reloadable memories. Thus, the mask ROM is suitable for mass storage and mass production. Through such characteristics, short delivery is strongly required in a mask ROM applied field of office automation products and games handling large quantities of fixed data in relation to implementation of mass storage, increase in speed and production cycles for attaining high function and high performance of products, and development has been made in order to cope with such requirement.

At present, 8-megabit memories are now in full-scale mass production, followed by 16-megabit ones. Further, 32-megabit memories are now reaching the end of development. In consideration of memory cell sizes, operating speeds and TAT (turn around time), memory cells of mask ROMS having basic structures of 1-bit single transistors are classified into two types including those of a NOR type flat memory cell system (first prior art) shown in FIG. 40 and a NAND type system (second prior art) shown in FIG. 43 in currently available 2-megabit mass storage ROMs or those of larger capacity.

[First Prior Art]

In the first prior art of the NOR type flat memory cell shown in FIGS. 40 to 42, $N^+$-type diffusion layers 1 for defining bit lines are formed and thereafter polycide gates 2 are formed to be perpendicular thereto as shown in FIGS. 40 to 42, in order to reduce a contact number per bit (contactless structure) thereby remarkably reducing memory cell areas and increasing the degree of integration. As to respective memory cells, intersections between the polycide gates 2 and the $N^+$-type diffusion layers 1 define sources/drains 3, and channels (active regions) 4 are formed in space portions between approximate pairs of the sources/drains 3. In such a structure, gate lengths of the respective memory cells are defined by space lengths between approximate $N^+$-type diffusion layers 1, while gate widths are defined by widths of the polycide gates 2. In the first prior art, a data writing operation (impurity implantation for programming) is carried out after formation of gate electrodes, whereby it is possible to cope with any data writing in relatively short delivery, so far as memory cell intermediate products after formation of the gate electrodes are prepared.

[Second Prior Art]

The second prior art shown in FIGS. 43 to 45 is a NAND type ROM. Referring to FIGS. 43 to 45, numeral 11 denotes $N^+$-type diffusion layers for defining bit lines, numeral 12 denotes polycide gates for defining word lines, numeral 13 denotes sources/drains, and numeral 14 denotes channels. In the second prior art, a plurality of memory cells are vertically stacked to form NAND with respect to the $N^+$-type diffusion layers 11 (bit lines), gate lengths are reduced by fine working and a process technique, and the memory cells are stacked by 16 stages, to improve the degree of integration. Since the memory cells are stacked by 16 stages with respect to the $N^+$-type diffusion layers 11 (bit lines), read currents for the memory cells are so small that it is necessary to devise the circuit design in order to attain a high speed and a low voltage. In the second embodiment, a data writing step is carried out before formation of the polycide gates 12, whereby the number of steps following the data writing step is increased and hence it is difficult to cope with short delivery as compared with the first prior art.

[Third Prior Art]

FIG. 46 is a plan view schematically showing a semiconductor memory device (sequential access memory) according to third prior art. Referring to FIG. 46, symbol WL denotes a word line, symbol BL denotes a bit line, symbol DXc denotes an X address decoder for decoding the word line WL, symbol DYc denotes a Y address decoder for decoding the bit line BL, symbol Dc denotes elements for selecting the word line WL or the bit line BL in the respective address decoders DXc and DYc, and symbol PL denotes a predecoding line. FIG. 47 is a circuit diagram schematically showing a portion around a decoder part of the semiconductor memory device according to the third prior art. Referring to FIG. 47, symbols Dc01, Dc02, . . . denote decoder parts, symbols Pd01, . . . denote predecoder parts, symbols PL01, PL02 and PL03 denote predecoding lines, symbol Cnt denotes a counter, symbol Lα denotes wires coupling the decoder parts Dc01, Dc02, . . . , with the predecoding lines PL01, PL02 and PL03.

According to the third prior art, outputs of the counter Cnt are decoded in two stages by the predecoder parts Pd01, . . . and the decoder parts Dc01, Dc02, . . . , to select any of the memory cells which are connected to the bit line BL and the word line WL, as shown in FIG. 47. Namely, signals which are once decoded by the predecoder parts Pd01, . . . are passed through the predecoding lines PL01, PL02 and PL03 along the direction X (word line WL) and the direction Y (bit line BL) of the memory cell array and again decoded by the X and Y address decoders DXc and DYc respectively as shown in FIG. 47, so that selection signals are finally transmitted to the word line WL and the bit line BL. According to the third prior art, the word line WL, the bit line BL and the predecoding lines PL01, PL02 and PL03 are connected with each other in a multiple bus system, with the plurality of predecoding lines PL01, PL02 and PL03 serving as bus bars.

[Fourth Prior Art]

FIG. 52 schematically shows a general memory cell array. In general, a transverse stage of blocks are selected in data reading. Referring to FIG. 52, a stage of blocks (0, 0), (1, 0), . . . are selected for data reading, for example. FIG. 53 shows a block structure of a memory cell array according to fourth prior art, and FIG. 54 shows a reference circuit (reference transistor array) structure for setting reference values for deciding types of memory cells. Referring to FIG. 53, symbols m0 to m7 denote memory cell transistors, symbols n0 to n9 denote nodes which are connected to respective sources/drains of the memory cell transistors m0 to m7, symbols m8 to m17 denote block selecting transistors, numeral 201 denotes a main bit line of aluminum or the like, numeral 202 denotes a virtual GND line of aluminum or the like, numeral 203 denotes local bit lines consisting of diffusion layers, symbol BWL0 denotes a block selecting word line which is gate-inputted in the block selecting transistors m8 to m12, symbol BWL1 denotes a block selecting word line which is gate-inputted in the block selecting transistors m13 to m17 similarly to the above, and symbols SWL0 to SWLn denote switching word lines for selecting the respective memory cell transistors. Referring to FIG. 54, symbol MA denotes a memory cell array, symbol SA denotes a differential sense amplifier, and symbol RA denotes a reference transistor mini array.

When data is read from the memory cell transistor m5 in FIG. 53, the word line BWL0 is set at a high level, the word line BWL1 is set at a low level, the word line SWLn is set at a high level and the remaining word lines SWL are set at low levels. Considering a current path between the main bit line 201 and the virtual GND line 202, a current flows from (1) the main bit line 201 through (2) the block selecting transistor m10, (3) the node n7, (4) the memory cell transistor m5, (5) the node n6 and (6) the block selecting transistor m9 in (7) the virtual GND line 202. According to the fourth prior art, the reference transistor mini array RA is arranged in the exterior of the memory cell array MA.

[Problems of First Prior Art and Second Prior Art]

In each of the first prior art and the second prior art described above, a determination is made as to whether data is "0" or "1" depending on whether or not a current flows to a single memory cell for data reading, i.e., across a source and a drain of a single transistor, as shown in FIG. 48. In other words, a single memory cell corresponds to 1-bit data in the conventional memory. Referring to FIG. 48, (0) denotes a memory cell which is not fed with a current in a turn-on time, and (i) denotes a memory cell which is fed with a current in a turn-on time respectively.

In such a structure, however, reduction in chip size of a ROM is limited. Particularly in a 32-megabit ROM, for example, about 90% of the chip area is occupied with a memory cell array. In order to remarkably reduce the chip size in the same degree of refinement, i.e., to improve the degree of data integration in the same area as the prior art, it is necessary to change the structure of the memory cell itself.

[Problem of Fourth Prior Art]

Also in the fourth prior art, a determination is made as to whether data is "0" or "1" depending on whether or not a current flows to a single memory cell for data reading, similarly to the first or second prior art. In order to implement a mass storage ROM in such a structure, the fabrication process must be refined to remarkably reduce the chip size, similarly to the first or second prior art.

Consider that data is read from the memory cell m5 in the fourth prior art, for example. In this case, the word lines BWL0 and SWLn are set at high levels and the remaining word lines SWL0, . . . and BWL1 are set at low levels, to select the memory cell m5.

At this time, a current path is formed between the main bit line 201 and the virtual GND line 202 along the main bit line 201→m10→n7→m5→n6→m9→the virtual GND line 202.

When the transistor m6 is in an ON state, a path is formed from the main bit line 201 along m11→n8→m6→n7. When the transistor m4 is in an ON state, on the other hand, a path is formed along n6→m4→n5→m8→the virtual GND line 202. Thus, the resistance value of the overall system between the main bit line 201 and the virtual GND line 202 extremely depends on whether the transistors m4 and m6 adjacent to the target memory cell m5 are programmed in ON or OFF states in the fourth prior art, and a virtual ON-state current value of the memory cell fluctuates in response. Thus, current errors are caused when reference is made on the memory cell data by a reference circuit which is provided in the exterior of the memory cell array.

[Problem of Third Prior Art]

In the semiconductor memory device according to the third prior art which drives the predecoding lines PL (PL01, PL02 and PL03) of the same lengths as the memory cell array as shown in FIG. 47, the decoder parts Dc01, Dc02, . . . are required in the same number as that of the word line WL and the bit line BL. Therefore, the predecoding lines PL (PL01, PL02 and PL03) are so lengthened with increase in storage capacity that lengths Wx and Wy appearing in FIG. 46 are increased to increase the areas of the address decoders DXc and DYc. Referring to FIG. 47, the number of the predecoder parts Pd01, . . . is limited to three and the data from the counter Cnt are limited to two bits, whereby only four wires are required in each of the predecoding lines PL01, PL02 and PL03, to require 12 wires as a whole. As shown in FIG. 47, the number of the wires Lα coupling the decoder parts Dc01, Dc02, . . . with the predecoding lines PL01, PL02 and PL03 is $2^6$ due to the multiple bus system. However, when this structure is applied to about 16 mega ($2^{24}$) bits or the like in practice, for example, 28 wires are required for the overall predecoding lines PL. Further, the number of the wires Lα is about $2^{11}$ for the X address decoder DXc and about $2^{13}$ for the Y address decoder DYc, and hence the length of each of the predecoder lines PL01, PL02 and PL03 must inevitably be increased. Due to such increase in length of the predecoding lines PL (PL01, PL02 and PL03), the processing speed is reduced and power consumption is increased. Further, the cost for the chip is increased due to increase of the area.

SUMMARY OF THE INVENTION

According to a first aspect of the present invention, a semiconductor memory device is provided with a plurality of memory cells having gates, gate dielectric films, active regions, sources and drains, and at least parts of the memory cells are set in any of a type 0 memory cell having a threshold voltage of the active region which is set to be different from those of the remaining memory cells, a type 1 memory cell which is made to have a first resistance value in the active region, and a type 2 memory cell which is made to have a second resistance value in the active region.

Preferably, active region widths of the type 1 and 2 memory cells are set to be different from each other.

According to a second aspect of the present invention, a semiconductor memory device which is provided with a plurality of memory cells having gates, gate dielectric films, active regions, sources and drains comprises a semiconductor substrate, a plurality of parallel strip-shaped bit lines for forming the sources and the drains on parts of an upper layer portion of the semiconductor substrate, and a plurality of parallel strip-shaped word lines which are provided on an upper side of the semiconductor substrate in a direction perpendicular to the bit lines for forming the gates for the respective memory cells, and the active regions are formed in regions which are held between the sources and the drains immediately under the word lines, isolating zones are formed for isolating the active regions of different memory cells from each other in regions between approximate word lines, the plurality of word lines are set at the same widths, side walls are formed at least on first ones of cross-directional side surfaces of parts of the plurality of word lines, the isolating zones are formed by impurity implantation which is carried out through the word lines and the side walls serving as masks, and widths of the active regions held between pairs of the isolating zones are set by presence/absence of the side walls.

Preferably, at least parts of the memory cells are set in any of a type 0 memory cell having a threshold voltage of the active region which is set to be different from those of the remaining memory cells, a type 1 memory cell which is made to have a first resistance value in the active region, and a type 2 memory cell which is made to have a second resistance value in the active region, the word line corresponding to the type 1 memory cell is provided with no side walls on its cross-directional side surfaces, and the side wall of the type 2 memory cell is formed at least on one of cross-directional side surfaces of the corresponding word line.

Preferably, the memory cells are set in any of a type 0 memory cell having a threshold voltage of the active region which is set to be different from those of the remaining memory cells, a type 1 memory cell which is made to have a first resistance value in the active region, a type 2 memory cell which is made to have a second resistance value in the active region, and a type 3 memory cell which is made to have a third resistance value in the active region, the word line corresponding to the type 1 memory cell is provided with no side walls on its cross-directional side surfaces, the side wall of the type 2 memory cell is formed only on one of cross-directional side surfaces of the corresponding word line, and the side walls of the type 3 memory cell are formed on both cross-directional side surfaces of the corresponding word line.

According to the first aspect of the present invention, active region lengths of the type 1 and 2 memory cells are preferably set to be different from each other.

According to a third aspect of the present invention, a semiconductor memory device comprises a semiconductor substrate, sources and drains which are formed on an upper layer part of the semiconductor substrate for respective memory cells, active regions which are held between the sources and the drains for the respective memory cells, a gate dielectric film which is formed at least on upper surfaces of the active regions, and a plurality of parallel strip-shaped word lines for forming gates on an upper surface of the gate dielectric film in regions immediately above the active regions, and the plurality of word lines are set at the same widths, side walls are formed at least on first ones of cross-directional side surfaces in parts of the plurality of word lines, and lengths of the active regions held between the sources and the drains are set by presence/absence of the side walls.

Preferably, at least parts of the memory cells are set in any of a type 0 memory cell having a threshold voltage of the active region which is set to be different from those of the remaining memory cells, a type 1 memory cell which is made to have a first resistance value in the active region, and a type 2 memory cell which is made to have a second resistance value in the active region, the word line corresponding to the type 1 memory cell is provided with no side walls on its cross-directional side surfaces, and the side wall of the type 2 memory cell is formed at least on one of cross-directional side surfaces of the corresponding word line.

Preferably, at least a part of the memory cells is set in any one of a type 0 memory cell having a threshold voltage of the active region which is set to be different from those of the remaining memory cells, a type 1 memory cell which is made to have a first resistance value in the active region, a type 2 memory cell which is made to have a second resistance value in the active region, and a type 3 memory cell which is made to have a third resistance value in the active region, the word line corresponding to the type 1 memory cell is provided with no side walls on its cross-directional side surfaces, the side wall of the type 2 memory cell is formed only on one of cross-directional side surfaces of the corresponding word line, and the side walls of the type 3 memory cell are formed on both cross-directional directional side surfaces of the corresponding word line.

According to a fourth aspect of the present invention, a semiconductor memory device is provided with a plurality of memory cells having gates, gate dielectric films, active regions, sources and drains, and at least parts of the memory cells are set in any of a type 0 memory cell which is made to have a zeroth threshold voltage in the active region, a type 1 memory cell which is made to have a first threshold voltage in the active region, and a type 2 memory cell which is made to have a second threshold voltage in the active region.

According to a fifth aspect of the present invention, a semiconductor memory device is provided with a plurality of memory cells having gates, gate dielectric films, active regions, sources and drains, and the memory cells are set in any of a type 0 memory cell which is made to have a zeroth threshold voltage in the active region, a type 1 memory cell which is made to have a first threshold voltage in the active region, a type 2 memory cell which is made to have a second threshold voltage in the active region, and a type 3 memory cell which is made to have a third threshold voltage in the active region.

According to a sixth aspect of the present invention, a semiconductor memory device comprises a semiconductor substrate, sources and drains which are formed on an upper layer part of the semiconductor substrate for respective memory cells, active regions which are held between the sources and the drains for the respective memory cells, a gate dielectric film which is formed at least on upper surfaces of the active regions, and a plurality of parallel strip-shaped word lines for forming gates on an upper surface of the gate dielectric film in regions immediately above the active regions, and the memory cells are set in any of a type 0 memory cell which is made to have a zeroth threshold voltage in the active region, a type 1 memory cell which is made to have a first threshold voltage in the active region, a type 2 memory cell which is made to have a second threshold voltage in the active region, and a type 3 memory cell which is made to have a third threshold voltage in the active region.

According to a seventh aspect of the present invention, a semiconductor memory device which is provided with a plurality of memory cells having gates, gate dielectric films, active regions, sources and drains comprises a semiconductor substrate, a plurality of parallel strip-shaped bit lines for forming the sources and the drains on parts of an upper layer portion of the semiconductor substrate, and a plurality of parallel strip-shaped word lines which are provided on an upper side of the semiconductor substrate in a direction perpendicular to the bit lines for forming the gates for the respective memory cells, and the memory cells are set in any of a type 0 memory cell which is made to have a zeroth threshold voltage in the active region, a type 1 memory cell which is made to have a first threshold voltage in the active region, a type 2 memory cell which is made to have a second threshold voltage in the active region, and a type 3 memory cell which is made to have a third threshold voltage in the active region.

According to the fourth aspect of the present invention, threshold voltages of the active regions of the respective type memory cells which are different from each other are preferably set by adjusting amounts of impurity implantation for programming.

According to the seventh aspect of the present invention, isolating zones are preferably formed to isolate the active regions of different memory cells from each other in regions between approximate word lines, and side walls are preferably formed at least on first ones of cross-directional side surfaces of the word lines, while the isolating zones are preferably formed by impurity implantation which is carried out through the word lines and the side walls serving as masks.

According to an eighth aspect of the present invention, a semiconductor memory device comprises a plurality of vertically and transversely arranged memory cells, a plurality of connection lines which are connected with the plurality of memory cells and arranged in parallel along one direction, and an address decoder for selecting the plurality of connection lines, and the address decoder comprises a shift register formed by flip-flops which are arranged in the form of a column to be connected to the connection lines respectively, a first bus bar for inputting a clock signal which is connected to the respective flip-flops of the shift register in a single bus system, and a second bus bar which is connected to the respective flip-flops of the shift register in a single bus system for inputting at least one of set and reset signals.

According to a ninth aspect of the present invention, a semiconductor memory device comprises a plurality of vertically and transversely arranged memory cells, a plurality of word lines which are connected with the plurality of memory cells and arranged in parallel along one direction, a plurality of bit lines, which are connected with the plurality of memory cells and perpendicular to the word lines, a first address decoder for selecting the plurality of word lines and a second address decoder for selecting the plurality of bit lines, and each of the first and second address decoders comprises a shift register formed by flip-flops, corresponding to the word lines or the bit lines respectively, which are arranged in the form of a column, a first bus bar for inputting a clock signal which is connected to the respective flip-flops of the shift register in a single bus system, and a second bus bar which is connected to the respective flip-flops of the shift register in a single bus system for inputting at least one of set and reset signals.

According to the ninth aspect of the present invention, a set input terminal of only a frontmost one of the flip-flops forming the shift register is preferably connected to the second bus bar, and reset terminals of the remaining flip-flops are preferably connected to the second bus bar.

According to the ninth aspect of the present invention, a high-speed clock generation circuit is preferably provided in the first bus bar.

According to the ninth aspect of the present invention, the shift registers of the first and second address decoders are preferably connected in series to each other.

The present invention is also directed to a method of fabricating a semiconductor memory device. According to a tenth aspect of the present invention, a method of fabricating a semiconductor memory device having gates, a gate dielectric film, active regions, sources and drains and being provided with at least three types of type 0 to type 2 memory cells in response to differences between characteristics of the active regions comprises a step of forming the gate dielectric film at least on a part of an upper surface of a semiconductor substrate, a step of forming a plurality of parallel strip-shaped bit lines on parts of an upper layer portion of the semiconductor substrate for forming the sources and the drains for the respective memory cells, a step of selectively forming a plurality of parallel strip-shaped word lines for forming the gates for the respective memory cells on an upper surface of the gate dielectric film in a direction perpendicular to the bit lines, a step of selectively forming a side wall at least on one of cross-directional side surfaces of that of the plurality of word lines corresponding to the type 2 memory cell, a step of carrying out impurity implantation in cell isolating regions of the semiconductor substrate through the word lines and the side wall serving as masks, and a step of carrying out impurity implantation for programming in a region of the semiconductor substrate provided with only the type 0 one of the plurality of memory cells thereby setting the active region of the type 0 memory cell at a threshold voltage which is different from those of the remaining memory cells.

According to an eleventh aspect of the present invention, a method of fabricating a semiconductor memory device having gates, a gate dielectric film, active regions, sources and drains and being provided with at least four types of type 0 to type 3 memory cells in response to differences between characteristics of the active regions comprises a step of forming the gate dielectric film at least on a part of an upper surface of a semiconductor substrate, a step of forming a plurality of parallel strip-shaped bit lines on parts of an upper layer portion of the semiconductor substrate for forming the sources and the drains for the respective memory cells, a step of selectively forming a plurality of parallel strip-shaped word lines for forming the gates for the respective memory cells on an upper surface of the gate dielectric film in a direction perpendicular to the bit lines, a step of selectively forming side walls on both cross-directional side surfaces of that of the plurality of word lines corresponding to the type 3 memory cell and selectively forming a side wall only on one of cross-directional side surfaces of that of the plurality of word lines corresponding to the type 2 memory cell, a step of carrying out impurity implantation in cell isolating regions of the semiconductor substrate through the word lines and the side walls serving as masks, and a step of carrying out impurity implantation for programming in a region of the semiconductor substrate provided with only the type 0 one of the plurality of memory cells thereby setting the active region of the type 0 memory cell at a threshold voltage which is different from those of the remaining memory cells.

According to a twelfth aspect of the present invention, a method of fabricating a semiconductor memory device having gates, a gate dielectric film, active regions, sources and drains and being provided with at least three types of type 0 to type 2 memory cells in response to differences between characteristics of the active regions comprises a step of forming the gate dielectric film at least on a part of an upper surface of a semiconductor substrate, a step of selectively forming the sources and the drains on parts of an upper layer portion of the semiconductor substrate for the respective memory cells, a step of forming a plurality of parallel strip-shaped word lines for forming the gates in regions immediately above the active regions held between the sources and the drains on the upper surface of the gate dielectric film, a step of carrying out impurity implantation into cell isolating regions of the semiconductor substrate through the word lines serving as masks, and a step of carrying out impurity implantation for programming into regions of the semiconductor substrate provided with at least parts of the memory cells for setting threshold voltages of the respective active regions, and the step of setting the threshold voltages includes a step of masking the type 2 memory cell for carrying out impurity implantation for programming into regions of the semiconductor substrate which are provided with the type 0 and 1 memory cells, and a step of making the type 1 and 2 memory cells for further carrying out impurity implantation for programming into a region of the semiconductor substrate provided with the type 0 memory cell.

According to a thirteenth aspect of the present invention, a method of fabricating a semiconductor memory device having gates, a gate dielectric film, active regions, sources and drains and being provided with at least four types of type 0 to type 3 memory cells in response to differences between characteristics of the active regions comprises a step of forming the gate dielectric film at least on a part of an upper surface of a semiconductor substrate, a step of selectively forming the sources and the drains on parts of an upper layer portion of the semiconductor substrate for the respective memory cells, a step of forming a plurality of parallel strip-shaped word lines for forming the gates in regions immediately above the active regions held between the sources and the drains on the upper surface of the gate dielectric film, a step of carrying out impurity implantation into cell isolating regions of the semiconductor substrate through the word lines serving as masks, and a step of carrying out program injection into regions of the semiconductor substrate provided with at least parts of the memory cells for setting threshold voltages of the respective active regions, and the step of setting the threshold voltages includes a step of masking the type 3 memory cell for carrying out impurity implantation for programming into regions of the semiconductor substrate which are provided with only the type 0 to 2 memory cells, a step of masking the type 2 and 3 memory cells for further carrying out impurity implantation for programming into regions of the semiconductor substrate provided with only the type 0 and 1 memory cells, and a step of masking the type 1, 2 and memory cells for further carrying out impurity implantation for programming into a region of the semiconductor substrate provided with only the type 0 memory cell.

According to a fourteenth aspect of the present invention, a method of fabricating a semiconductor memory device having gates, a gate dielectric film, active regions, sources and drains and being provided with at least three types of type 0 to type 2 memory cells in response to differences between characteristics of the active regions comprises a step of forming the gate dielectric film at least on a part of an upper surface of a semiconductor substrate, a step of forming a plurality of parallel strip-shaped word lines for forming the gates for the respective memory cells, a step of selectively forming a side wall at least on one of cross-directional side surfaces of that of the plurality of word lines corresponding to the type 2 memory cell, a step of carrying out impurity diffusion in parts of an upper layer portion of the semiconductor substrate through the word lines and the side wall serving as masks thereby forming the sources and the drains for the respective memory cells, and a step of carrying out impurity implantation for programming in a region of the semiconductor substrate provided with only the type 0 one of the plurality of memory cells thereby setting the active region of the type 0 memory cell at a threshold voltage which is different from those of the remaining memory cells.

According to a fifteenth aspect of the present invention, a method of fabricating a semiconductor memory device having gates, a gate dielectric film, active regions, sources and drains and being provided with at least four types of type 0 to type 3 memory cells in response to differences between characteristics of the active regions comprises a step of forming the gate dielectric film at least on a part of an upper surface of a semiconductor substrate, a step of forming a plurality of parallel strip-shaped word lines on an upper surface of the gate dielectric film for forming the gates for the respective memory cells, a step of selectively forming side walls on both cross-directional side surfaces of that of the plurality of word lines corresponding to the type 3 memory cell and selectively forming a side wall only on one of cross-directional side surfaces of that of the plurality of word lines corresponding to the type 2 memory cell, a step of carrying out impurity diffusion in parts of an upper layer portion of the semiconductor substrate through the word lines and the side walls serving as masks thereby forming the sources and the drains for the respective memory cells, and a step of carrying out impurity implantation for programming in a region of the semiconductor substrate provided with only the type 0 one of the plurality of memory cells thereby setting the active region of the type 0 memory cell at a threshold voltage which is different from those of the remaining memory cells.

According to a sixteenth aspect of the present invention, a method of fabricating a semiconductor memory device having gates, a gate dielectric film, active regions, sources and drains and being provided with at least three types of type 0 to type 2 memory cells in response to difference between characteristics of the active regions comprises a step of forming the gate dielectric film at least on a part of an upper surface of a semiconductor substrate, a step of forming a plurality of parallel strip-shaped word lines on an upper surface of the gate dielectric film for forming the gates for the respective memory cells, a step of carrying out impurity diffusion in parts of an upper layer portion of the semiconductor substrate through the word lines serving as masks thereby forming the sources and the drains for the respective memory cells, and a step of carrying out impurity implantation for programming in regions of the semiconductor substrate provided with at least parts of the plurality of memory cells thereby setting threshold voltages of the active regions, and the step of setting the threshold voltages includes a step of masking the type 2 memory cell for carrying out impurity implantation for programming into regions of the semiconductor substrate which are provided with the type 0 and 1 memory cells, and a step of masking the type 1 and 2 memory cells for further carrying out impurity implantation for programming in a region of the semiconductor substrate provided with the type 0 memory cell.

According to a seventeenth aspect of the present invention, a method of fabricating a semiconductor memory device having gates, a gate dielectric film, active regions, sources and drains and being provided with at least four types of type 0 to type 3 memory cells in response to difference between characteristics of the active regions comprises a step of forming the gate dielectric film at least on a part of an upper surface of a semiconductor substrate, a step of forming a plurality of parallel strip-shaped word lines on an upper surface of the gate dielectric film for forming the gates for the respective memory cells, a step of carrying out impurity diffusion in parts of an upper layer portion of the semiconductor substrate through the word lines serving as masks thereby forming the sources and the drains for the respective memory cells, and a step of carrying out impurity implantation for programming in regions of the semiconductor substrate provided with at least parts of the plurality of memory cells thereby setting threshold voltages of the active regions, and the step of setting the threshold voltages includes a step of masking the type 3 memory cell for carrying out impurity implantation for programming into regions of the semiconductor substrate which are provided with only the type 0 to 2 memory cells, a step of masking the type 2 and 3 memory cells for further carrying out impurity implantation for programming into regions of the semiconductor substrate provided with only the type 0 and 1 memory cells, and a step of masking the type 1, 2 and 3 memory cells for further carrying out impurity implantation for programming into a region of the semiconductor substrate provided with only the type 0 memory cell.

According to any of the second, third, sixth or seventh aspects of the present invention, the semiconductor memory device preferably further comprises a reference element which is provided every word line being connected to each memory cell for setting a reference value for deciding the type of each memory cell, and a comparison circuit for comparing currents or voltages of the reference element and each memory cell with each other.

According to the second or third aspect of the present invention, preferably a main bit line is provided for supplying currents to the bit lines, a plurality of memory cell current paths are formed for supplying currents from the main bit line to the respective memory cells through the bit lines, reference bit lines are formed to be connected to a plurality of reference elements which are provided for the respective word lines, and reference current paths are formed to supply currents to the respective reference elements through the reference bit lines, and the number of the memory cell current paths per memory cell is larger than that of the reference current paths per reference element.

According to the second or seventh aspect of the present invention, preferably a main bit line is provided for supplying currents to the bit lines, a plurality of memory cell current paths are formed for supplying currents from the main bit line to the respective memory cells through the bit lines, reference bit lines are formed to be connected to a plurality of reference elements which are provided for the respective word lines, and reference current paths are formed to supply currents to the respective reference elements through the reference bit lines, and the memory cell current paths per memory cell are identical in number and shape to the reference current paths per reference element, while a memory cell block selecting transistor is connected to each memory cell current path for selecting any one of blocks of the memory cells, and a reference block selecting transistor is connected to each reference current path for selecting any one of blocks of the reference elements, and the numbers of the block selecting transistors for the respective current paths are identical to each other.

In the semiconductor memory device according to the first aspect of the present invention, an external sense circuit detects values of currents flowing in the memory cells in reading, to decide threshold voltages and channel resistance values of the active regions. Through the combinations of the threshold voltages and the channel resistance values of the active regions as decided, a determination is made as to whether a target memory cell belongs to the type 0, the type 1 or the type 2. Thus, it is possible to multivalue data which are stored in the memory cells to at least three values, thereby remarkably improving the degree of data integration at the same areas as those of binary memory cells according to the prior art.

In the semiconductor memory device according to the first aspect of the present invention, the widths of the active regions may simply be made different from each other for setting the type 1 and type 2 memory cells at different channel resistance values, whereby it is possible to correctly set the channel resistance values of these memory cells for preventing a malfunction in reading. Particularly in the semiconductor memory device according to the second aspect of the present invention, the active region widths are set by simply selectively forming the side walls on the side portions of parts of the word lines, whereby it is possible to correctly set the channel resistance values by a simple method.

In the semiconductor memory device according to the first aspect of the present invention, the widths of the active regions may simply be made different from each other for setting the type 1 and type 2 memory cells at different channel resistance values, whereby it is possible to correctly set the channel resistance values of these memory cells for preventing a malfunction in reading. Particularly in the semiconductor memory device according to the third aspect of the present invention, the active region lengths are set by simply selectively forming the side walls on the side portions of parts of the word lines, whereby it is possible to correctly set the channel resistance values by a simple method.

In the semiconductor memory device according to the second or third aspect of the present invention, an external sense circuit detects values of currents flowing in the memory cells in reading, to decide threshold voltages and channel resistance values of the active regions. Through the combinations of the threshold voltages and the channel resistance values of the active regions as decided, a determination is made as to whether a target memory cell belongs to the type 0, the type 1, the type 2 or the type 3. Thus, it is possible to quaternarize data which are stored in the memory cells to be provided with a degree of general 2-bit data integration at the same areas as those of conventional binary memory cells, thereby substantially doubling area efficiency.

In the semiconductor device according to the fourth aspect of the present invention, an external sense circuit detects values of currents flowing in the memory cells in reading, to decide threshold voltages of the active regions. Through the threshold voltages of the active regions as decided, a determination is made as to whether a target memory cell belongs to the type 0, the type 1 or the type 2. Thus, it is possible to multivalue data which are stored in the memory cells to at least three values, thereby remarkably improving the degree of data integration at the same areas as those of conventional binary memory cells.

In the semiconductor device according to the fifth, sixth or seventh aspect of the present invention, an external sense circuit detects values of currents flowing in the memory cells in reading, to decide threshold voltages of the active regions. Through the threshold voltages of the active regions as decided, a determination is made as to whether a target memory cell belongs to the type 0, the type 1, the type 2 or the type 3. Thus, it is possible to quaternarize data which are stored in the memory cells to be provided with a degree of general 2-bit data integration art at the same areas as those of conventional binary memory cells, thereby substantially doubling area efficiency.

In the semiconductor memory device according to any of the fourth to seventh aspect of the present invention, it is possible to make threshold voltages of the active regions of the respective type memory cells different from each other by simply adjusting the amount of impurity implantation for programming, whereby data can be multivalued with no complication in structure of the respective memory cells.

In the semiconductor memory device according to the sixth or seventh aspect of the present invention, it is possible to narrow the widths of the isolating zones, employing the side walls as masks, by forming the side walls along the cross-directional side surfaces of the word lines. Namely, it is possible to increase the active region widths of the respective memory cells and to easily reduce the channel resistance values. Further, it is possible to clarify differences between the threshold voltages of the respective memory cells by increasing current efficiency.

In the semiconductor memory device according to the eighth or ninth aspect of the present invention, the address decoder comprises the shift registers, whereby bit-to-bit data propagation can be carried out through the shift registers. Thus, it is possible to remarkably reduce the number of wires as compared with the case of the third prior art carrying out data propagation in a multiple bus system, thereby remarkably reducing the internal area of the address decoder. Therefore, it is possible to reduce the chip size, improve the access speed and reduce power consumption.

In the semiconductor memory device according to the eighth or ninth aspect of the present invention, the set input terminal of only the frontmost one of the flip-flops is connected to the second bus bar, and reset terminals of the remaining flip-flops are connected to the second bus bar, whereby only single set input is required so that data propagation can be subsequently carried out in the shift registers. Thus, it is possible to simplify the operation of a data input external device, thereby reducing the area including that of the external device.

In the semiconductor memory device according to the eighth or ninth aspect of the present invention, the first bus bar is provided with a high-speed clock generation circuit, whereby data propagation in the shift registers can be synchronized with a clock signal received from the high-speed clock generation circuit, for remarkably improving the processing speed. Thus, it is possible to apply the technique according to the eighth or ninth aspect of the present invention to a random access memory or the like.

In the semiconductor memory device according to the ninth aspect of the present invention, the shift registers of the first and second address decoders are connected in series to each other, whereby only single set input is required for the first and second address decoders so that data propagation can be subsequently carried out in the shift registers. Thus, it is possible to simplify the operation of a data input external device, thereby reducing the area including that of the external device.

In the method of fabricating a semiconductor memory device according to any of the tenth, twelfth, fourteenth and sixteenth aspects of the present invention, it is possible to easily fabricate memory cells whose storage data are multivalued to at least three values, thereby implementing a semiconductor memory device having an extremely high degree of data integration.

In the method of fabricating a semiconductor memory device according to any of the eleventh, thirteenth, fifteenth and seventeenth aspects of the present invention, it is possible to easily fabricate memory cells whose storage data are quaternarized, thereby implementing a semiconductor memory device having an extremely high degree of data integration.

In the semiconductor memory device according to the second, third, sixth or seventh aspect of the present invention, the comparison circuit compares the current values (or voltage values) of the respective memory transistors with those of the reference elements, to decide the types of the memory cell transistors. At this time, the distances of the current paths from the main bit line depend on the arrangement of the memory cell transistors. When the distances of the current paths are increased, resistances are developed in the paths to cause errors in electrical properties, and hence it is difficult to compare these memory cell transistors in the same reference as that for the reference elements having a short current paths. In a multivalue ROM setting memory cell transistors in a number of types, excellent accuracy is required for deciding difference between characteristics of the active regions of respective memory cell transistors, while it may be difficult to make accurate decision for the aforementioned reason. According to this aspect, however, independent ones of the plurality of reference elements are connected to the same word lines as the respective memory cell transistors, whereby there are reference elements having substantially identical distances of current paths from the main bit line as to the respective memory cell transistors. Thus, it is possible to absorb dispersion of electrical properties based on differences between the distances of the current paths by comparing current values (or voltage values) of corresponding ones of the memory cell transistors and reference the elements with each other.

In the semiconductor memory device according to the second or seventh aspect of the present invention, the number of the memory cell current paths per memory cell is larger than that of the reference current paths per reference element, whereby it is possible to suppress a voltage drop toward each memory cell transistor below that toward each reference element. Therefore, it is possible to maintain the terminal potential of each memory cell transistor as high as possible, thereby reducing a leakage current from another current path such as that from an adjacent memory transistor and maintaining the electrical properties in high accuracy.

In the semiconductor memory device according to the second or seventh aspect of the present invention, the number of the memory cell current paths per memory cell is identical to that of the reference current paths per reference element and the same numbers of block selection transistors are connected to each memory cell current path and each reference current path, whereby resistances developed in the current paths are regularly at the same value when a current is fed to each memory cell and the reference element corresponding thereto, whereby it is possible to minimize difference between the values of currents flowing in these elements. Thus, it is possible to improve accuracy for deciding the types of the memory cells at the maximum.

Accordingly, an object of the present invention is to provide a semiconductor memory device which can reduce a chip size of a ROM and improve the degree of data integration substantially at the same degree of refinement of cells as the aforementioned first prior art, second prior art and fourth prior art, and a method of fabricating the same.

Another object of the present invention is to provide a semiconductor memory device which can correct current errors caused by resistances of current paths to memory cells in reference of memory cell data by reference circuits, and a method of fabricating the same.

Still another object of the present invention is to provide a semiconductor device which can implement a low cost, a high speed and low power consumption by reducing a layout area of peripheral circuits of a memory cell array.

According to an eighteenth aspect of the present invention, a plurality of memory cells are arranged, a current path is created which extends from a main bit line to an virtual GND line through each memory cell, and the current path includes a plurality of the power source side local bit lines each extending from an associated main bit line to each memory cell and a plurality of the ground side local bit lines each extending from each memory cell to an associated virtual GND line.

According to a nineteenth aspect of the present invention, a plurality of memory cells are arranged, a power source side current path is created which extends from a main bit line to each memory cell and a ground side current path is created which extends from each memory cell to an associated virtual GND line, the total length of the power source side current path and the ground side current path which are disposed for each memory cell is always constant, and the ground side current path includes a plurality of ground side local bit lines, each ground side local bit line being disposed for the associated virtual GND line.

In the semiconductor memory device according to the eighteenth aspect of the present invention, a plurality of the power source side local bit lines and a plurality of the ground side local bit lines are disposed for each memory cell. In the semiconductor memory device according to the nineteenth aspect of the present invention, a plurality of the power source side local bit lines are disposed for each virtual GND line. Hence, the resistance generated in the wires is smaller than where only one local bit line is disposed for each memory cell or each virtual GND line. Since the operation speed will not drop even if the memory cells are divided into a reduced number of blocks, the area the memory cell arrays as a whole occupy is smaller than that in the conventional device. As a result, large capacity storage ROMs can be manufactured at a reduced manufacturing cost with a high yield.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 7 illustrates output data in respective parts of the semiconductor memory device according to the first embodiment of the present invention;

FIG. 15 illustrates a step of fabricating the semiconductor memory device according to the first embodiment of the present invention;

FIG. 33 illustrates output data in respective parts of the semiconductor memory device according to the fifth embodiment of the present invention;

FIG. 60 is a view showing the levels of input signals which are supplied to gate electrodes of the selecting circuit for selecting a main bit line and an virtual GND line of the fourth prior art semiconductor memory device;

FIG. 62 is a view showing the levels of input signals which are supplied to gate electrodes of the selecting circuit for selecting a main bit line and an virtual GND line of the semiconductor memory device of the eleventh embodiment of the present invention.

DESCRIPTION OF THE PREFERRED EMBODIMENTS

[First Embodiment]
<Structure>

Figure 1:
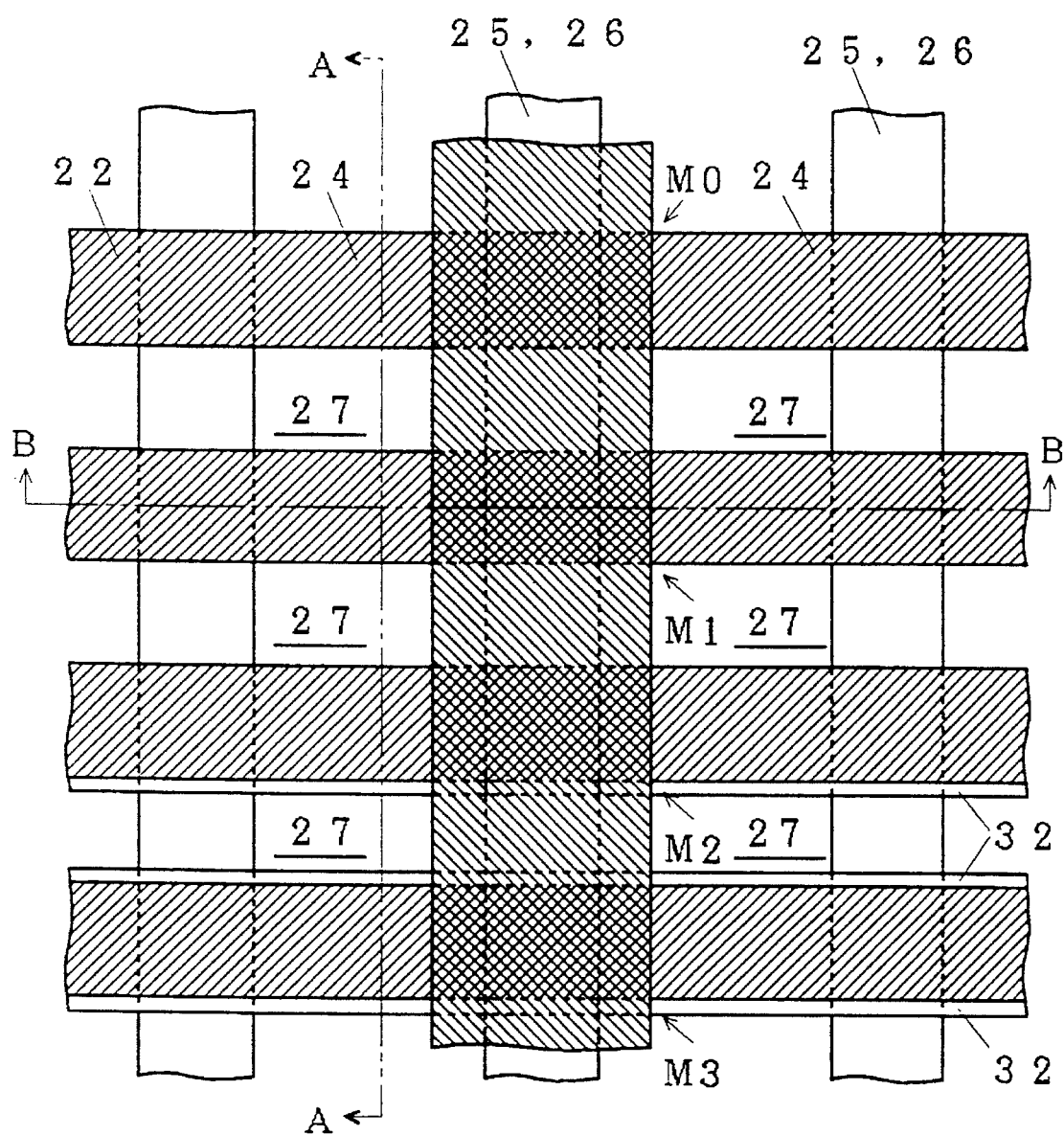
FIG. 1 is a plan view showing a semiconductor memory device according to a first embodiment of the present invention.
Figure 2:
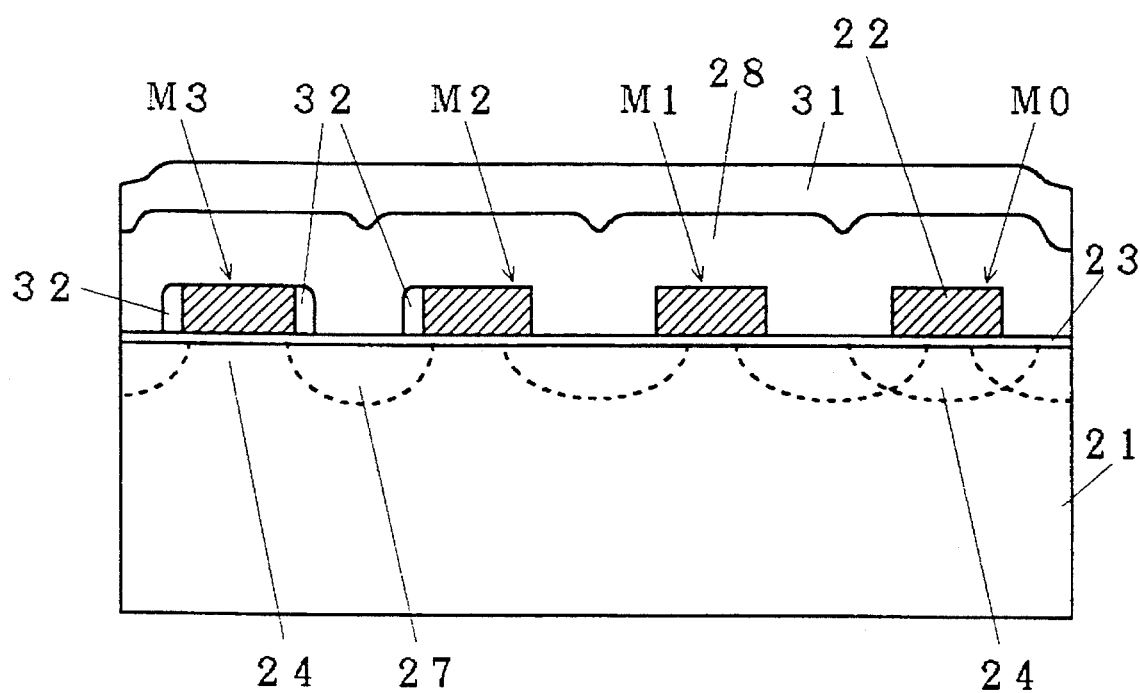
FIG. 2 is a sectional view taken along the line A—A in FIG. 1.
Figure 3:
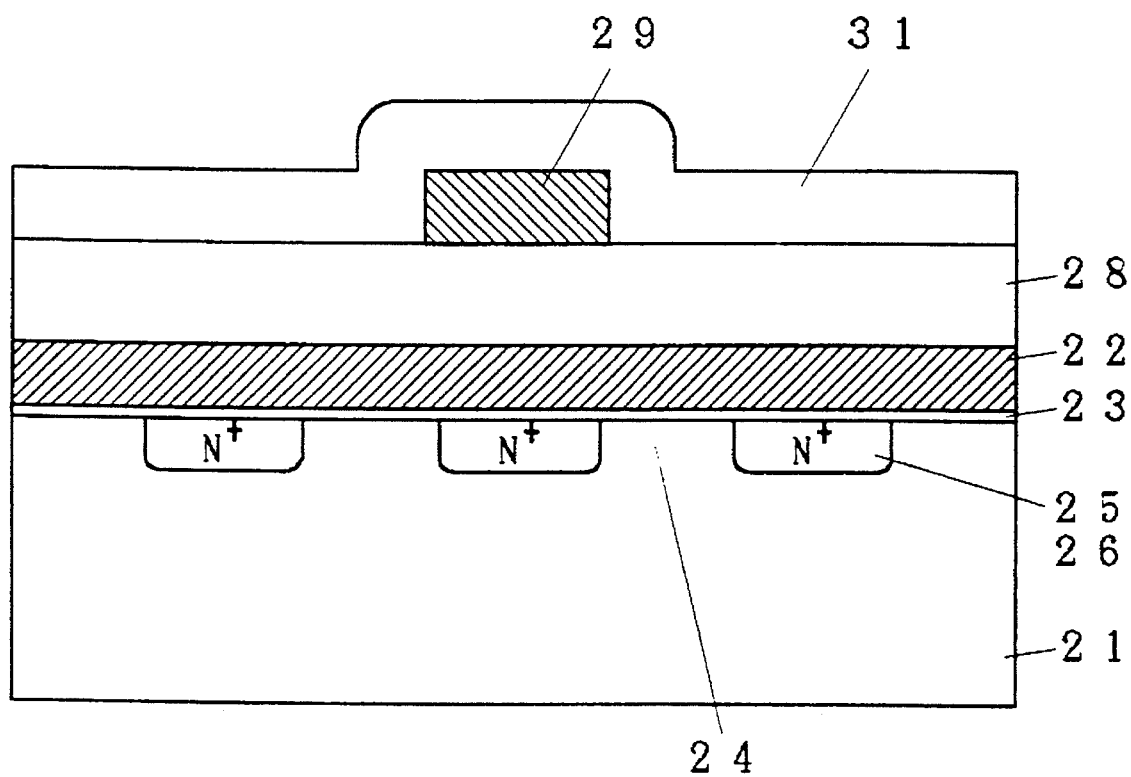
FIG. 3 is a sectional view taken along the line B—B in FIG. 1.

FIG. 1 is a plan view showing a semiconductor memory device according to a first embodiment of the present invention, FIG. 2 is a sectional view taken along the line A—A in FIG. 1, and FIG. 3 is a sectional view taken along the line B—B in FIG. 1. The semiconductor memory device according to this embodiment is a nonvolatile NOR flat cell semiconductor memory device (ROM) which is provided with a plurality of memory cells. Channel width control and threshold voltage control are combined to implement quaternary memory cells. Referring to FIGS. 1 to 3, symbols M0 to M3 denote memory cells, numeral 21 denotes a p-type semiconductor substrate of Si or the like, numeral 22 denotes word lines of polycide or the like for forming gates for the respective memory cells M0 to M3, numeral 23 denotes a gate dielectric film of an Si oxide film or the like, numeral 24 denotes channels (active regions) formed by parts of an upper layer portion of the p-type semiconductor substrate 21, numerals 25 and 26 denote bit lines serving as $n^+$-type diffusion layers for forming sources and drains for the respective memory cells M0 to M3, numeral 27 denotes isolating zones (isolating regions) for isolating the channels 24 of different ones of the memory cells M0 to M3 from each other in regions between approximate ones of the word lines 22, numeral 28 denotes an interlayer dielectric film, numeral 29 denotes a metal wire, numeral 31 denotes a surface protective film (passivation film) such as an Si oxide film or an Si nitride film, and numeral 32 denotes side walls which are formed at least on first ones of cross-directional side surfaces of parts of the plurality of word lines 22.

The word lines 22 are provided in parallel on an upper surface of the gate dielectric film 23 in the form of strips which extend perpendicularly to the bit lines 25 and 26. The plurality of word lines 22 are set at the same widths, for standardizing intermediate products after formation of the word lines 22. The channels 24 are formed in regions which are held between the bit lines 25 and 26 immediately under the word lines 22. The bit lines 25 and 26 are arranged in parallel in the form of plural strips. The isolating zones 27 are formed by impurity implantation carried out through the word lines 22 and the side walls 32 serving as masks.

The memory cells M0 to M3 are formed as enhancement type ones. The channel 24 of the memory cell M0 (type 0 memory cell) is set at a threshold voltage which is remarkably higher than those of the remaining memory cells M1 to M3. Further, the channel 24 of the memory cell M1 (type 1 memory cell) is set at a relatively large channel resistance value (first resistance value) and the memory cell M2 (type 2 memory cell) is set at an intermediate channel resistance value (second resistance value), while the memory cell M3 (type 3 memory cell) is set at a relatively small channel resistance value (third resistance value). The memory cell M0 (type 0 memory cell) is set at a large channel resistance value, similarly to the first resistance value. Such differences of the channel resistance values are set by making the widths (channel widths) of the respective channels 24 different from each other. The channel resistance values are reduced when the channel widths are large, while the former are increased when the latter are small. The channel widths are set depending on whether or not the side walls 32 are formed on cross-directional side surfaces of the word lines 22. The amounts of overlapping of the word lines 22 and the isolating zones 27 are varied with presence/absence of the side walls 32, while the channels 24 are increased by the widths of the side walls 32 since no currents flow in the isolating zones 27 even if the word lines 22 are selected by an external device.

In more concrete terms, no side walls are formed on the cross-directional side surfaces of the word line 22 corresponding to the type 1 memory cell M1, so that the memory cell M1 is set at a small channel width and hence a large channel resistance value. The side wall 32 of the type 2 memory cell M2 is formed only on one of the cross-directional side surfaces of the corresponding word line 22, so that the memory cell M2 is set at an intermediate channel width and hence an intermediate channel resistance value. The side walls 32 of the type 3 memory cell M3 are formed on both of the cross-directional side surfaces of the corresponding word line 22, so that the memory cell M3 is set at a large channel width and hence a small channel resistance value.

Thus, it is possible to provide four types of memory cell transistors by forming the three types of memory cells including that provided with the side walls 32 on both sides of the side walls of the word line 22 (type 3 memory cell M3), that provided with the side wall 32 on one side (type 2 memory cell M2) and those provided with no side walls 32 (type 1 and type 0 memory cells M1 and M0) and carrying out impurity implantation for programming in the channel of one (type 0 memory cell M0) of those provided with no side walls 32 for setting the same at a high channel threshold voltage, as follows:

Type 0 memory cell M0: channel width=small, threshold voltage=high (transistor is not turned on)

Type 1 memory cell M1: channel width=small, threshold voltage=enhancement

Figure 4:
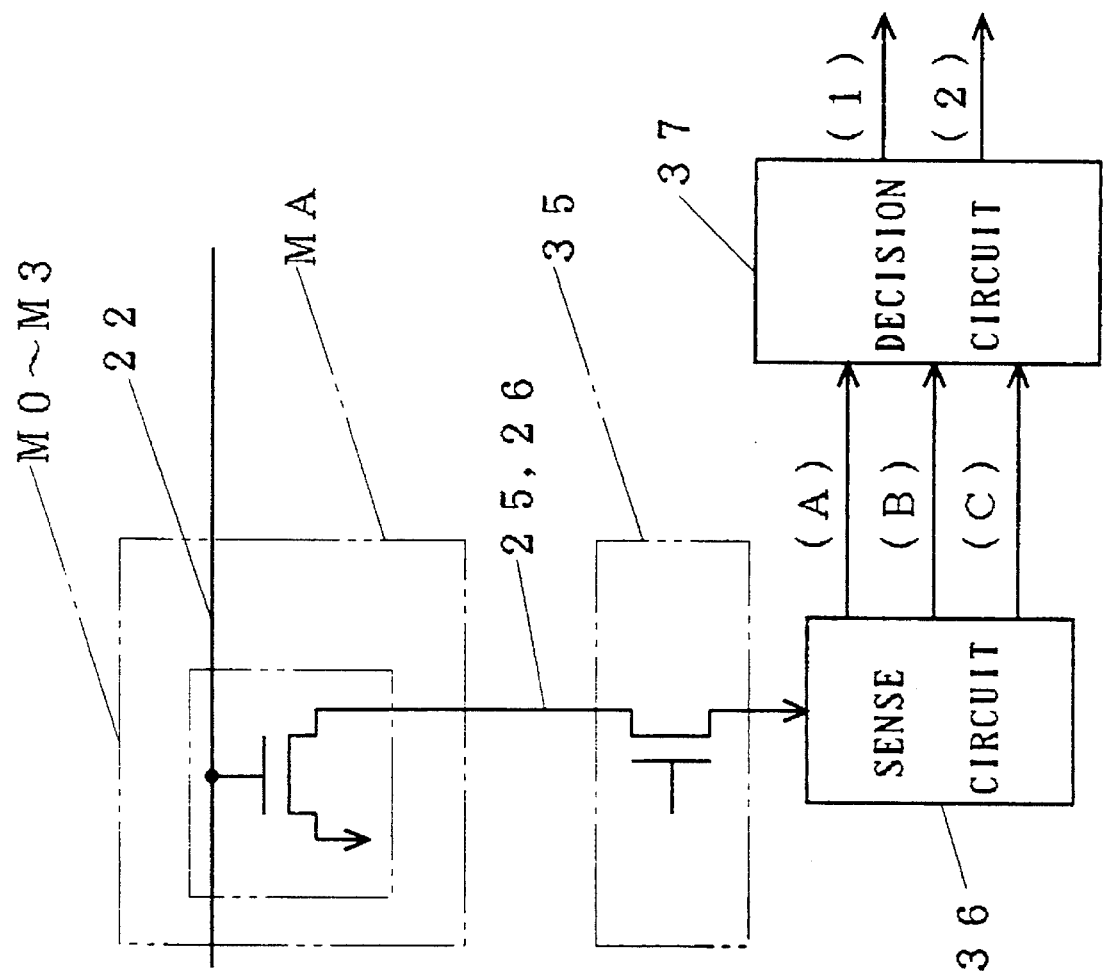
FIG. 4 is a block diagram showing peripheral circuits in the semiconductor memory device according to the first embodiment of the present invention.
Figure 5:
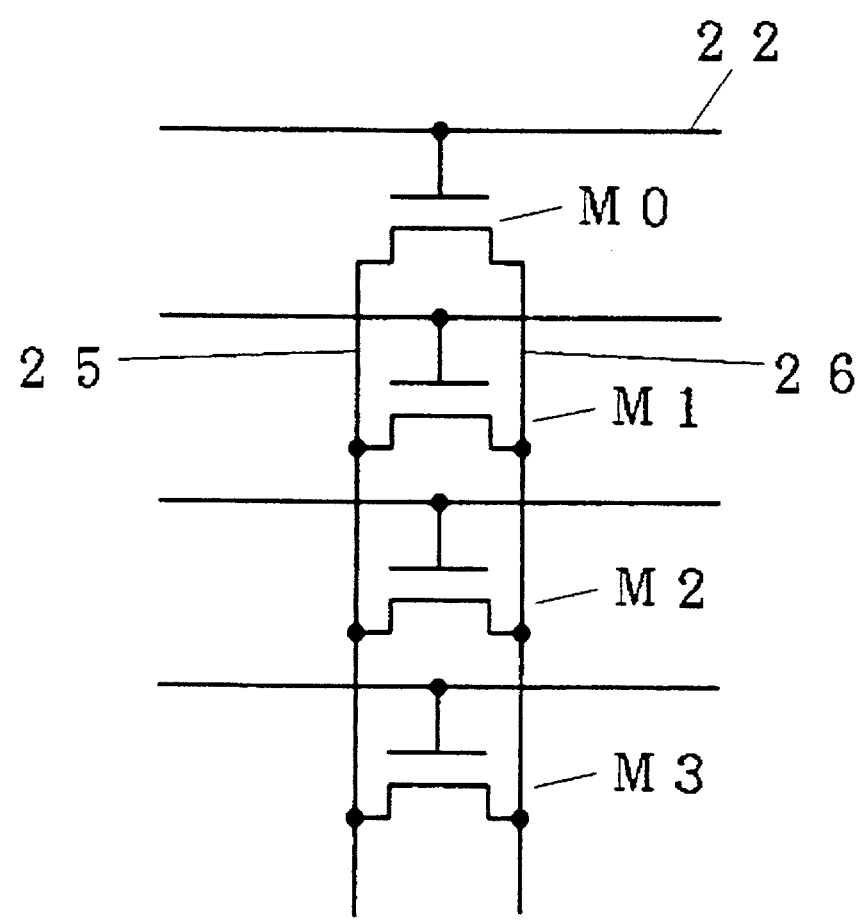
FIG. 5 is a circuit diagram showing a memory cell array of the semiconductor memory device according to the first embodiment of the present invention.
Figure 6:
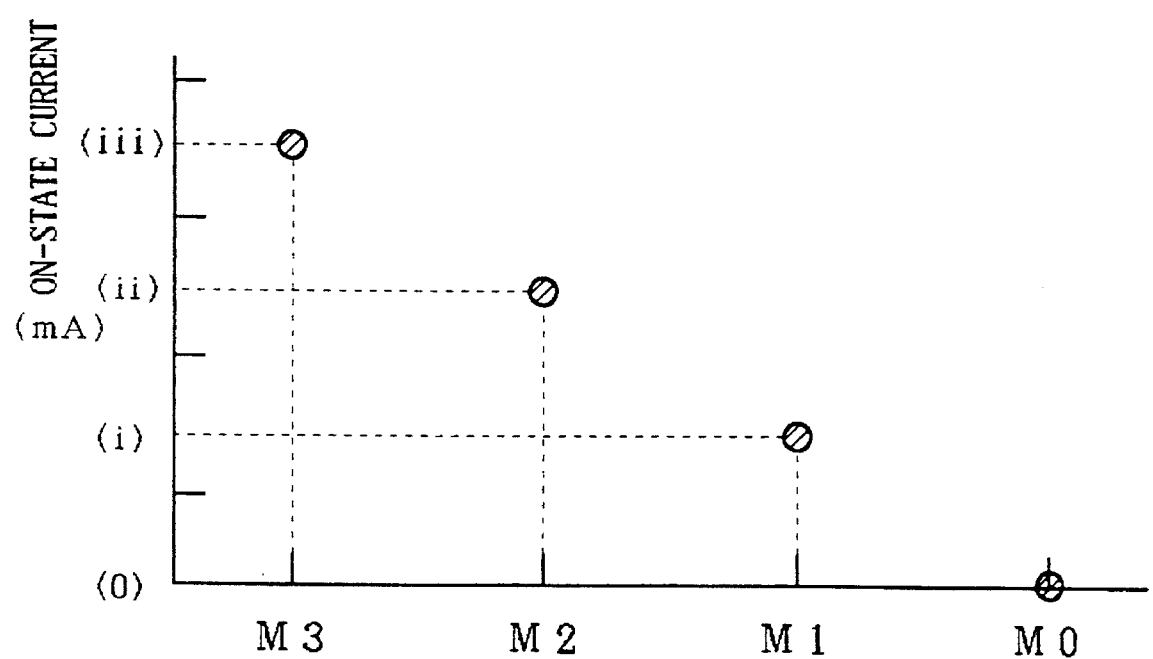
FIG. 6 illustrates relations between respective memory cells and ON-state current values in the semiconductor memory device according to the first embodiment of the present invention.

Type 2 memory cell M2: channel width=intermediate, threshold voltage=enhancement Type 3 memory cell M3: channel width=large, threshold voltage=enhancement As shown in FIG. 4, each of the bit lines 25 and 26 is connected to an external sense circuit 36 through a bit line selecting transistor 35. While a sense circuit is generally employed for reading ROM data, the sense circuit 36 is absolutely identical to a well-known one in a point that the same detects values of currents flowing in the memory cells M0 to M3. Namely, the sense circuit 36 is adapted to detect the range to which an ON-state current value of a selected memory cell belongs, for converting the same to three-dimensional data {(A), (B), (C)}. This sense circuit 36 has threshold voltages which can decide three types of current values, i.e., those which are set between (0) and (i), between (i) and (ii), and between (ii) and (iii) in FIG. 6 respectively. FIG. 5 is an internal circuit diagram of a memory cell array which is formed by the memory cells M0 to M3, and FIG. 6 shows values of currents (ON-state currents) which flow when prescribed voltages are applied to the word lines 22 (gates) and to the drains of the memory cells M0 to M3. As shown in FIG. 6, the memory cells M0 to M3 are set at different ON-state current values (0) to (iii). As shown in FIG. 4, the sense circuit 36 is connected to a decision circuit 37 through 3-bit output lines corresponding to the three-dimensional data {(A), (B), (C)} respectively. As shown in FIG. 7, the decision circuit 37 has functions of deciding which one of the type 0 to 3 memory cells M0 to M3 is selected on the basis of the three-dimensional data {(A), (B), (C)} received from the sense circuit 36 and converting the three-dimensional data {(A), (B), (C)} to 2-bit data ((1), (2)).

Figure 8:
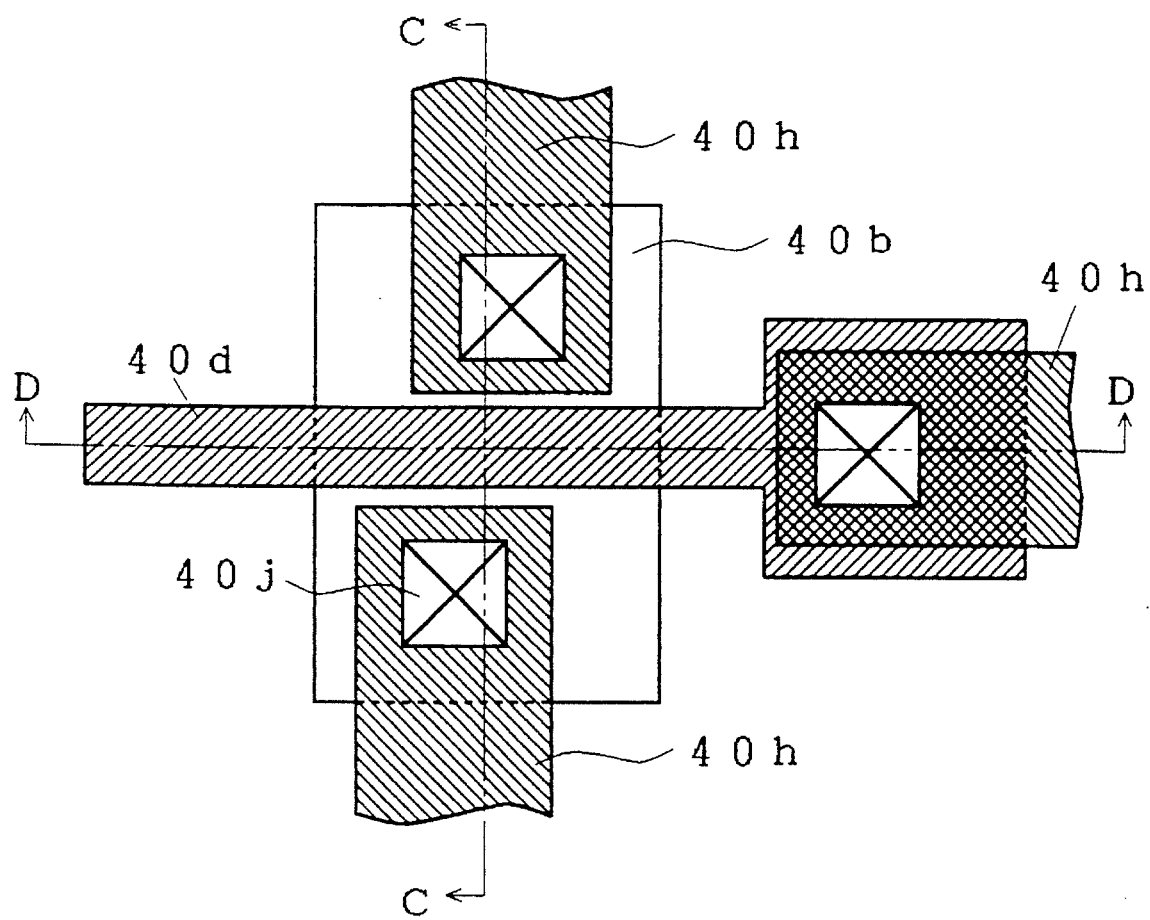
FIG. 8 is a plan view showing peripheral circuits of the semiconductor memory device according to the first embodiment of the present invention.
Figure 9:
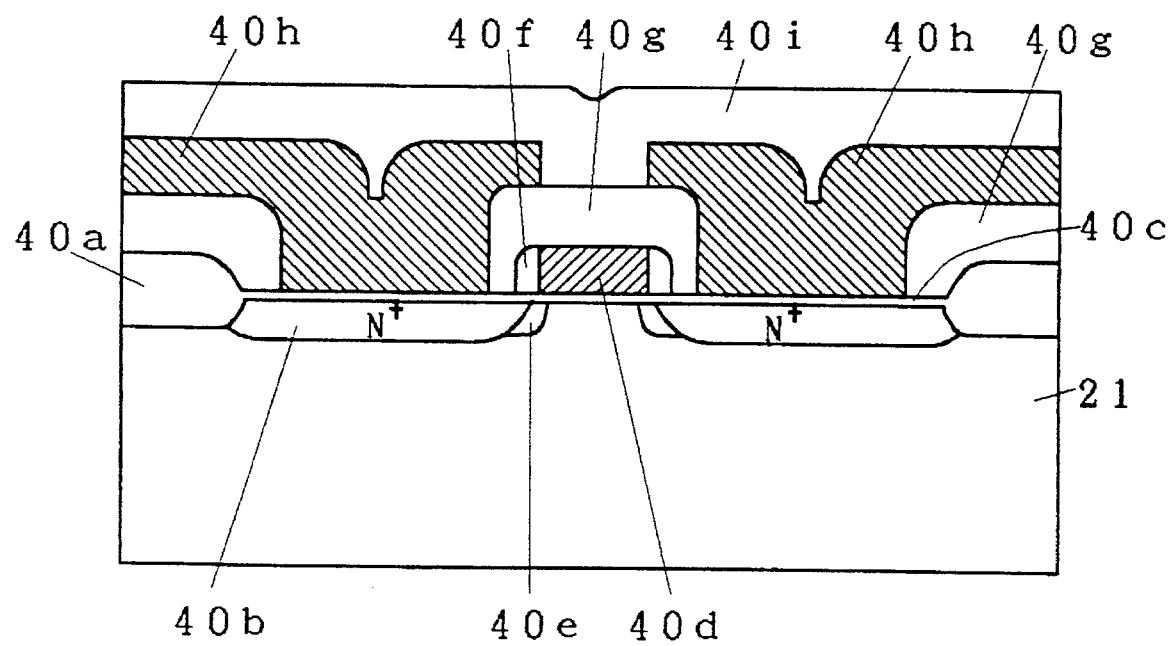
FIG. 9 is a sectional view taken along the line C—C in FIG. 8.
Figure 10:
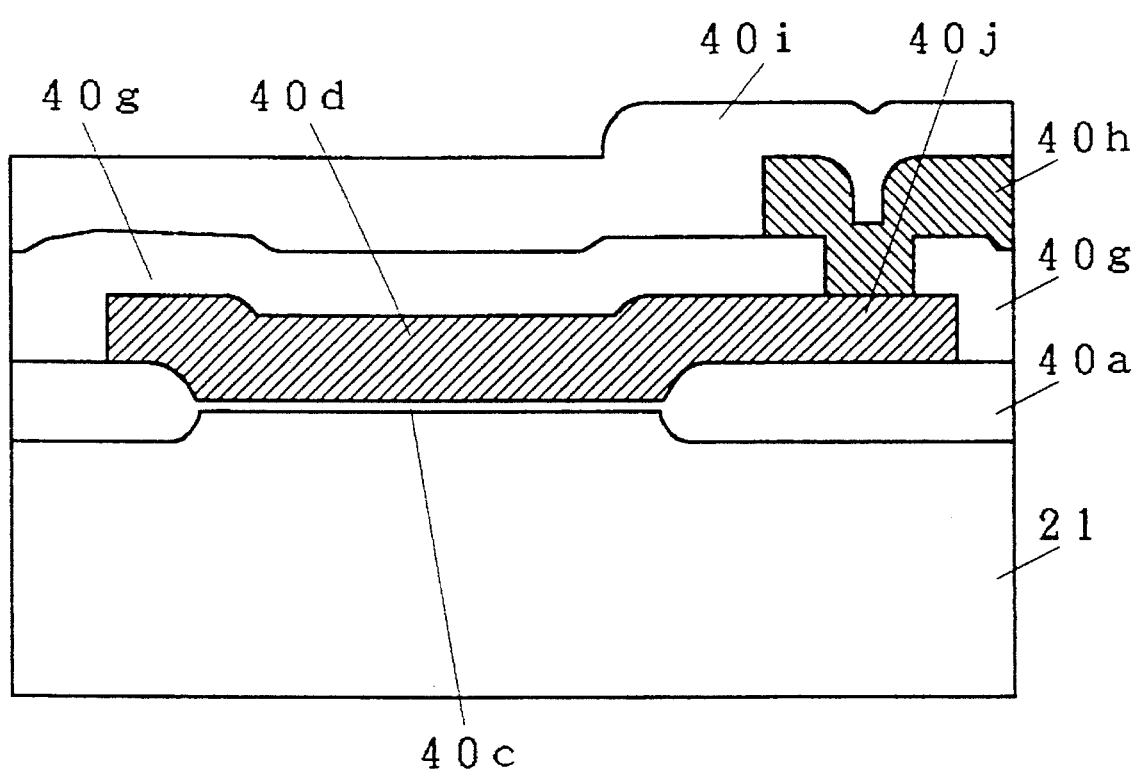
FIG. 10 is a sectional view taken along the line D—D in FIG. 8.

FIGS. 8, 9 and 10 are a plan view, a sectional view taken along the line C—C in FIG. 8 and a sectional view taken along the line D—D respectively, showing peripheral transistors of the bit line selecting transistor 35. The peripheral transistors are formed on the upper surface of the p-type semiconductor substrate 21 which is provided with the memory cells M0 to M3. Referring to FIGS. 8 to 10, numeral 40a denotes a LOCOS field oxide film, numeral 40b denotes $n^+$-type diffusion layers for forming a source and a drain, numeral 40c denotes a gate dielectric film, numeral 40d denotes a gate, numeral 40e denotes $n^-$-type diffusion regions for bringing the source and the drain into LDD structures, numeral 40f denotes side walls, numeral 40g denotes an interlayer dielectric film, numeral 40h denotes metal wires, numeral 40i denotes a surface protective film (passivation film) such as an Si oxide film or an Si nitride film, and numeral 40j denotes contact regions. Referring again to FIG. 4, symbol MA denotes a memory cell array.

<Employing Method>

In employment of the semiconductor memory device having the aforementioned structure, a prescribed voltage is applied to the word line 22 (gate) of that of the memory cells M0 to M3 for reading through the word line 22, while a prescribed voltage is applied to the gate 40d of the bit line selecting transistor 35 to electrically connect the bit lines 25 and 26 of the memory cells M0 to M3 to the sense circuit 36. At this time, the memory cells M0 to M3 have ON-state current values as shown in FIG. 6. In the type 0 memory cell M0, no transistor is turned on due to the high threshold voltage of the channel 24, and hence the current value (0) remains at zero. In the type 1 memory cell M1, the ON-state current value (i) is reduced due to the high channel resistance value. In the type 2 memory cell M2, the ON-state current value (ii) reaches an intermediate level due to the intermediate channel resistance value. In the type 3 memory cell M3, the ON-state current value (iii) is increased due to the low channel resistance value. The sense circuit 36 detects ranges to which the ON-state current values of the memory cells M0 to M3 belong, and converts the same to the three-dimensional data {(A), (B), (C)} as shown in FIG. 7.

In more concrete terms, {(A), (B), (C)} are ("H", "H", "H") for the type 0 memory cell M0, {"L", "H", "H"} for the type 1 memory cell M1, {"L", "L", "H"} for the type 2 memory cell M2, and {"L", "L", "L"} for the type 3 memory cell M3. The data {(A), (B), (C)} are transmitted to the decision circuit 37. The decision circuit 37 converts the three-dimensional data {(A), (B), (C)} received from the sense circuit 36 to 2-bit data ((1), (2)). In more concrete terms, ((1), (2))=(H, H) when {(A), (B), (C)}={"H", "H", "H"}, i.e., when the type 0 memory cell M0 is selected, ((1), (2))=(H, L) when {(A), (B), (C)}={"L", "H", "H"}, i.e., when the type 1 memory cell M1 is selected, ((1), (2))=(L, H) when {(A), (B), (C)}={"L", "L", "H"}, i.e., when the type 2 memory cell M2 is selected, and ((1), (2))=(L, L) when {(A), (B), (C)}={"L", "L", "L"}, i.e., when the type 3 memory cell M3 is selected.

Thus, each of the memory cells M0 to M3 has multivalue characteristics as 2-bit data ((1), (2)), whereby the number of memory cell transistors provided in the memory cell array can be halved as compared with the prior art in which a single memory cell transistor corresponds to 1-bit data, and the area of the memory cell array portion can also be halved. In other words, it is possible to double the storage capacity in the same area as that in the prior art. Thus, it is possible to improve the degree of data integration by remarkably reducing the chip size of the ROM at about the same degree of refinement as the prior art, thereby enabling cost reduction and implementation of mass storage. In more concrete terms, a 32-megabit ROM can be formed by about 16 mega memory cells according to the present invention, while about 32 mega memory cells are required in the prior art.

<Fabrication Method>

Figure 11:
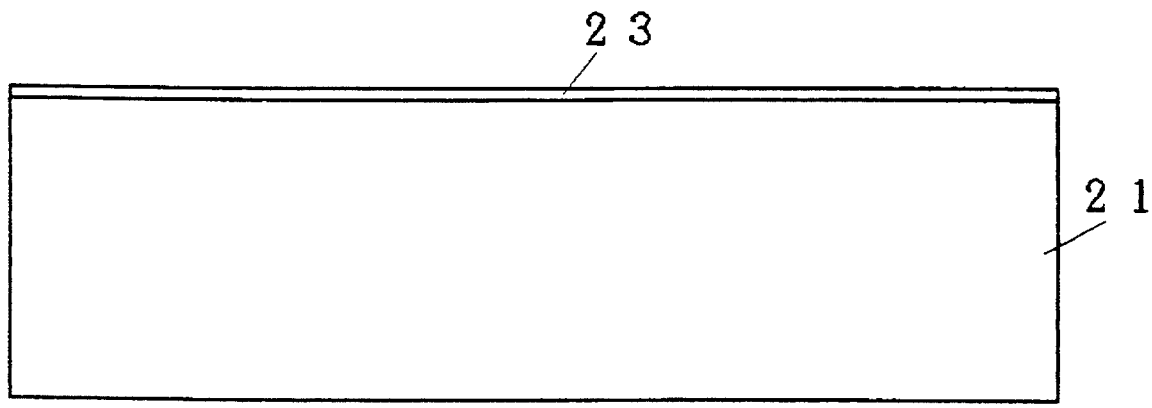
FIG. 11 illustrates a step of fabricating the semiconductor memory device according to the first embodiment of the present invention.
Figure 12:
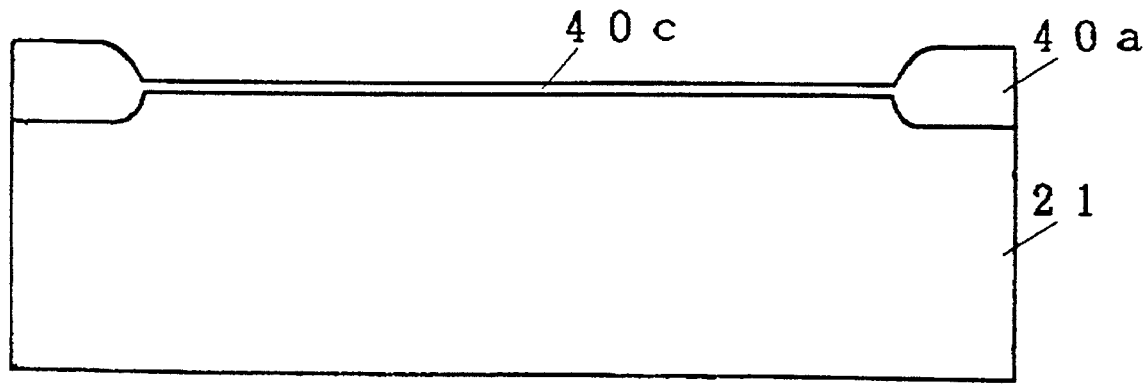
FIG. 12 illustrates a step of fabricating the semiconductor memory device according to the first embodiment of the present invention.

A method of fabricating the semiconductor memory device according to this embodiment is now described. FIGS. 11, 13, 15, 17 and 19 are sectional views showing steps of fabricating the memory cell array, and FIGS. 12, 14, 16, 18 and 20 are sectional views showing steps of fabricating each peripheral transistor. First, the LOCOS field oxide film 40a for defining isolating regions of the peripheral circuits is formed on a peripheral portion of the upper surface of the p-type semiconductor substrate 21. As shown in FIGS. 11 and 12, the gate dielectric films 23 and 40c are formed by thermal oxidation or the like, and an n⁺-type impurity is implanted into parts of upper layer portions of the p-type semiconductor substrate 21 corresponding to the respective memory cells after masking prescribed parts of the upper surface of the p-type semiconductor substrate 21 and diffused for forming the bit lines 25 and 26 (source and drain). The bit lines 25 and 26 may alternatively be formed in advance of formation of the gate dielectric film 23.

Figure 13:
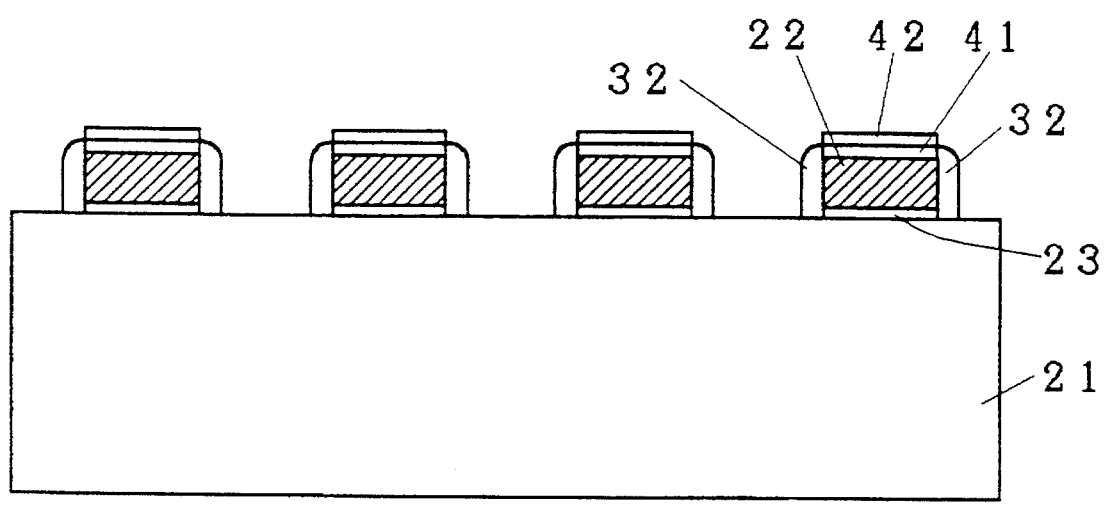
FIG. 13 illustrates a step of fabricating the semiconductor memory device according to the first embodiment of the present invention.
Figure 14:
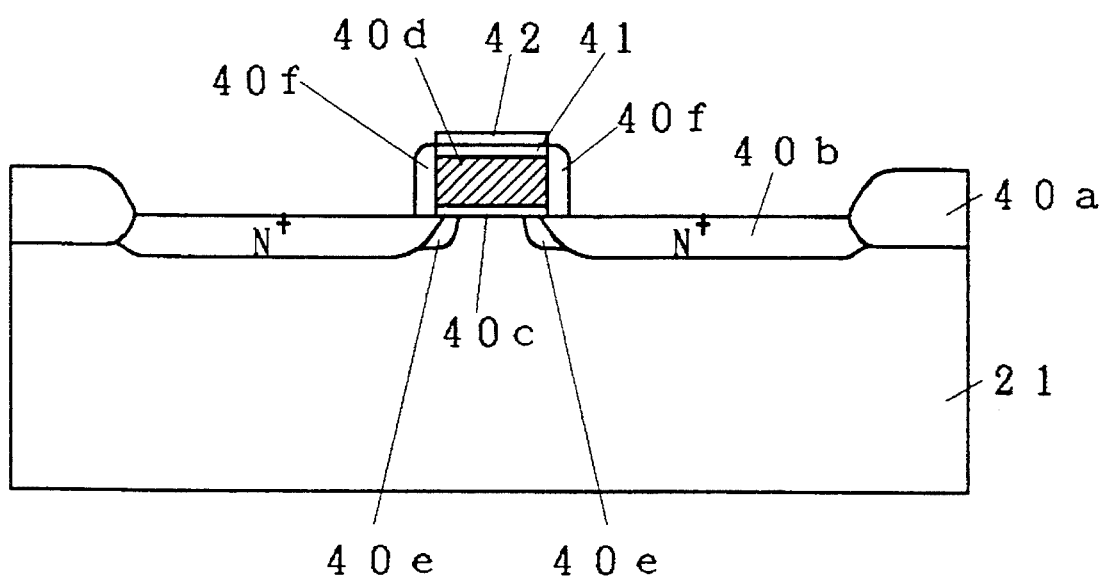
FIG. 14 illustrates a step of fabricating the semiconductor memory device according to the first embodiment of the present invention.

Then, the word lines 22 (gates) and the gate 40d of each peripheral transistor are stacked by CVD employing polysilicon or high melting point metal polycide, and thereafter Si oxide films 41 and Si nitride films 42 are successively stacked on upper surfaces of the word lines 22 and the gate 40d by CDV or the like. As shown in FIGS. 13 and 14, the prescribed regions of the polysilicon or high polycide films 22 and 40d, the Si oxide films 41 and the Si nitride films 42 are removed by lithography and etching, and thereafter an n⁻-type impurity such as P (phosphorus) is implanted into prescribed regions of the peripheral transistor to form the n⁻-type diffusion regions 40e. Then, an oxide film is stacked by CVD and thereafter overall anisotropic etching is carried out to form the side walls 32 and 40f on both cross-directional side surfaces of the word lines 22 of all memory cells M0 to M3 and the gate 40d of each peripheral transistor. The aforementioned steps are in common regardless of the types of the memory cells. Thus, the memory cells can be mass-produced as intermediate products in advance of decision of types thereof. When the side walls 32 are formed simultaneously with the side wall 40f for an LDD structure of each peripheral transistor for selecting bit lines or the like, it is possible to prevent addition of a new fabrication step.

Figure 16:
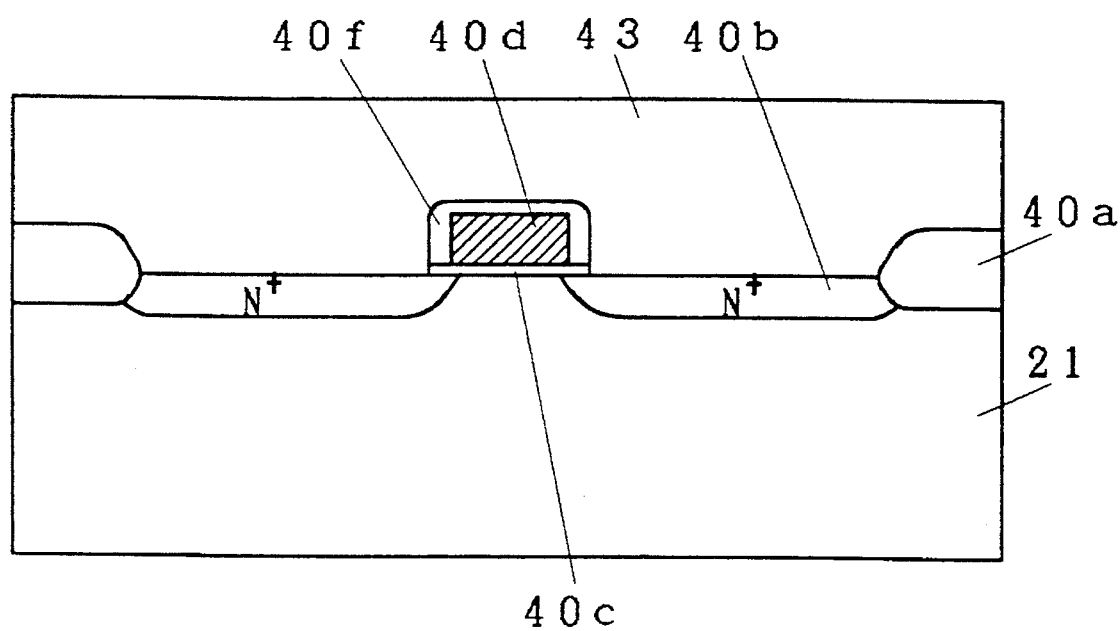
FIG. 16 illustrates a step of fabricating the semiconductor memory device according to the first embodiment of the present invention.

On the basis of ROM design, about half the type 2 memory cell M3, the overall type 3 memory cell M3 and the overall peripheral transistors are covered with a photoresist film 43 (photolithography step), to leave prescribed ones of the side walls 32 and 40f as shown in FIGS. 15 and 16. Thereafter the photoresist film 43 is removed.

Figure 17:
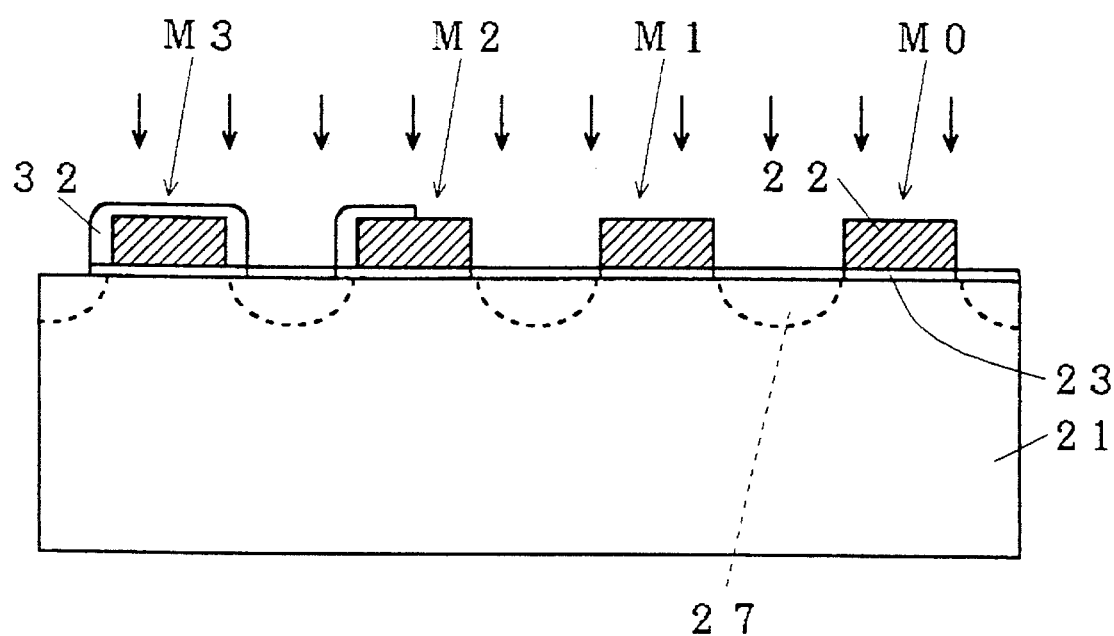
FIG. 17 illustrates a step of fabricating the semiconductor memory device according to the first embodiment of the present invention.
Figure 18:
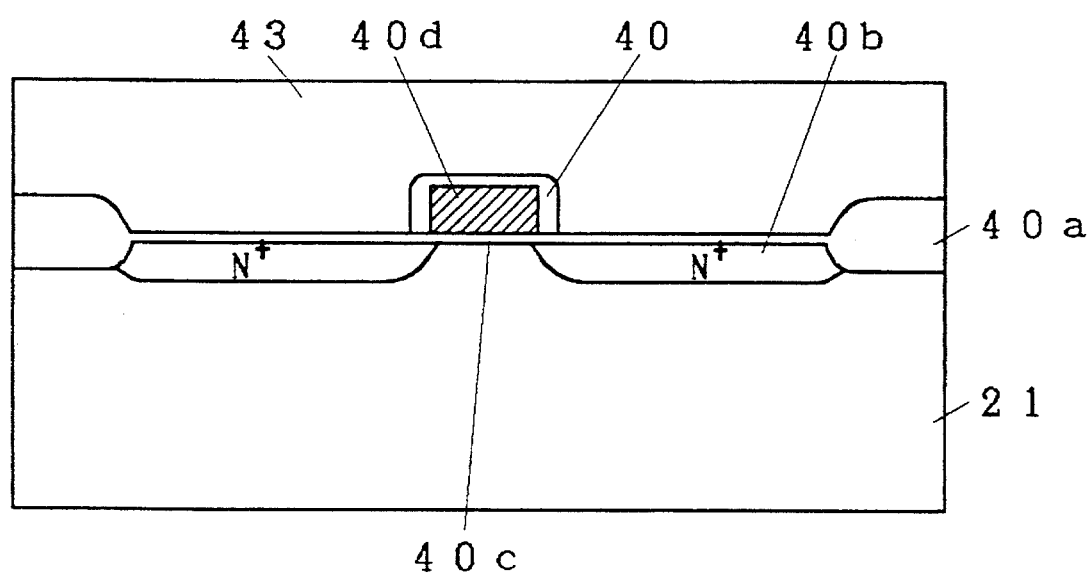
FIG. 18 illustrates a step of fabricating the semiconductor memory device according to the first embodiment of the present invention.

Then, an impurity such as boron (B) or $BF_2$ is ion-implanted between approximate ones of the memory cells M0 to M3, to form the isolating zones 27, as shown in FIGS. 17 and 18. At this time, the word lines 22 and the side walls 32 serve as implantation masks, whereby the amounts of overlapping of the isolating zones 27 and the word lines 22 deviate by the side walls 32. Thus, it is possible to adjust channel widths of the memory cells M0 to M3.

Figure 19:
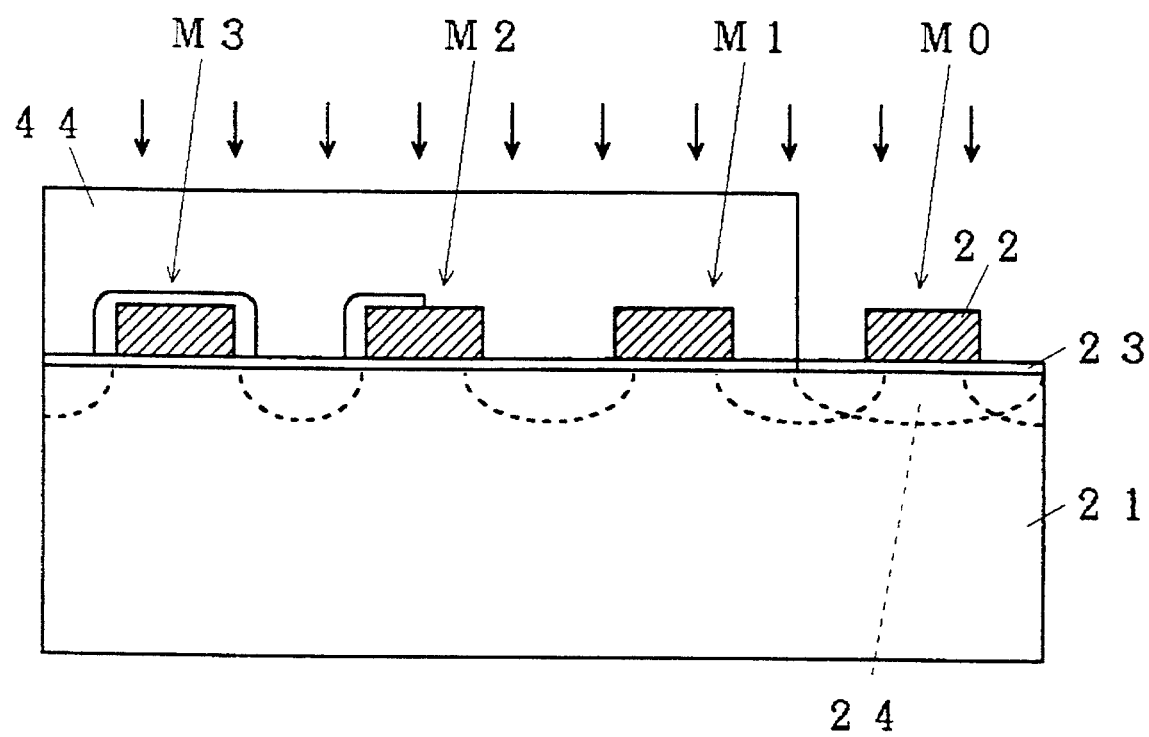
FIG. 19 illustrates a step of fabricating the semiconductor memory device according to the first embodiment of the present invention.
Figure 20:
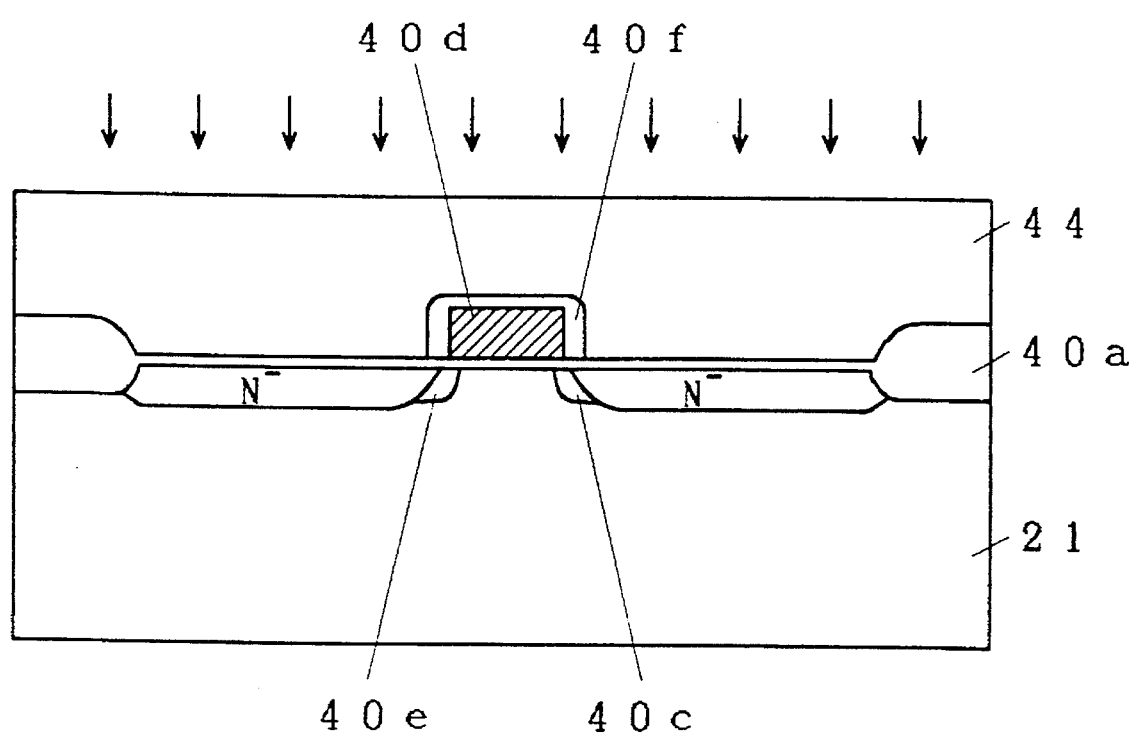
FIG. 20 illustrates a step of fabricating the semiconductor memory device according to the first embodiment of the present invention.

Thereafter a resist film 44 is formed on the overall region excluding the type 0 memory cell M0 as shown in FIG. 19, and impurity implantation for programming is carried out to set the channel 24 of the type 0 memory cell M0 at a sufficiently high threshold voltage. Then, the interlayer dielectric films 28 and 40, the metal wires 29 and 40h and the surface protective films 31 and 40i are formed to complete the semiconductor memory device shown in FIGS. 1 to 3.

Thus, the steps up to that for forming the side walls 32 and 40f on all memory cells M0 to M3 and all gates of the peripheral transistors are carried out to previously mass-produce the memory cells M0 to M3 as standard intermediate products with no regard to the ROM design so that the channel resistance values and the channel threshold voltages are made different from each other in later steps, whereby the fabrication period after the ROM design can be remarkably reduced as compared with a case of varying the characteristics of the respective memory cells at an initial stage.

[Second Embodiment]

<Structure>

Figure 21:
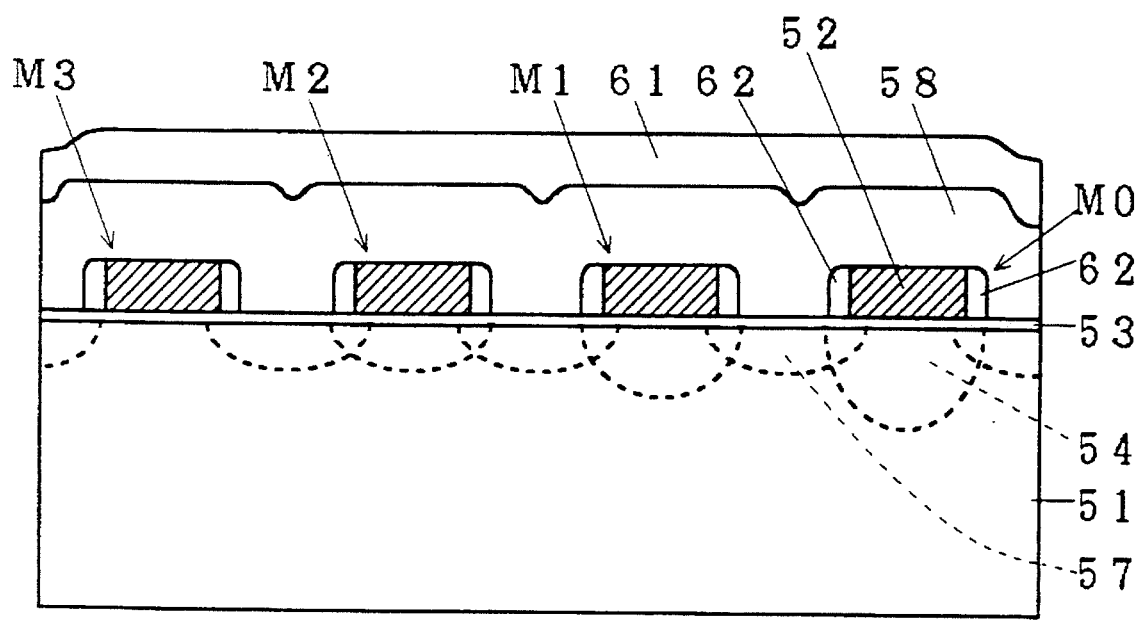
FIG. 21 is a sectional view showing a semiconductor memory device according to a second embodiment of the present invention.

FIG. 21 illustrates a semiconductor memory device according to a second embodiment of the present invention. The semiconductor memory device (ROM) according to this embodiment, which is a nonvolatile NOR fiat cell type one provided with a quaternary memory cells similarly to the first embodiment, is different from the first embodiment in a point that electrical properties of channels are achieved only by differences between threshold voltages. Referring to FIG. 21, symbols M0 to M3 denote memory cells, numeral 51 denotes a p-type semiconductor substrate of Si or the like, numeral 52 denotes word lines of polycide or the like for forming gates for the respective memory cells M0 to M3, numeral 53 denotes a gate dielectric film of an Si oxide film or the like, numeral 54 denotes channels (active regions) formed by parts of an upper layer portion of the p-type semiconductor substrate 51, numeral 57 denotes isolating zones (isolating regions) for isolating the channels 54 of different ones of the memory cells M0 to M3 from each other in regions between approximate ones of the word lines 52, numeral 58 denotes an interlayer dielectric film, numeral 61 denotes a surface protective film (passivation film) such as an Si oxide film or an Si nitride film, and numeral 62 denotes side walls which are formed at cross-directional side surfaces of parts of the plurality of word lines 52.

Similarly to the first embodiment shown in FIG. 1, the word lines 52 are formed in a direction perpendicular to bit lines (not shown). The channels 54 are formed in regions which are held between the bit lines immediately under the word lines 52. Respective threshold voltages of the channels 54 are set by adjusting amounts of impurity implantation for programming respectively. In more concrete terms, the threshold voltages of the memory cells M0 to M3 are set as follows:

Type 0 memory cell M1: threshold voltage D0=extremely high (no transistor is turned on)

Type 1 memory cell M1: threshold voltage D1=slightly high

Type 2 memory cell M2: threshold voltage D2=slightly low

Type 3 memory cell M3: threshold voltage D3=extremely low

The threshold voltages of the channels 54 of the respective types of memory cells M0 to M3 are thus varied so that four types of memory cell transistors can be formed as described above.

The isolating zones 57 are formed by impurity implantation carried out through the word lines 52 and the side walls 62 serving as masks. Thus, it is possible to narrow the widths of the isolating zones 57. Namely, it is possible to increase the channel widths of the memory cells M0 to M3 and to easily reduce channel resistance values. Further, it is possible to clarify differences between threshold voltages of the memory cells M0 to M3.

Similarly to the first embodiment shown in FIG. 4, bit lines 25 and 26 which are perpendicular to the word lines 52 are connected to an external sense circuit 36 through a bit line selecting transistor 35. The sense circuit 36 is connected to a decision circuit 37 through 3-bit output lines corresponding to {(A), (B), (C)} respectively. The bit line selecting transistor 35, the sense circuit 36 and the decision circuit 37 are similar in structure to those in the first embodiment, and hence redundant description is omitted.

<Employing Method>

In employment of the semiconductor memory device having the aforementioned structure, a prescribed voltage is applied to the word line 52 (gate) of that of the memory cells M0 to M3 for reading through the word lines 52, while a prescribed voltage is applied to the gate 40d of the bit line selecting transistor 35 to electrically connect the bit lines 25 and 26 of the memory cells M0 to M3 to the sense circuit 36. At this time, the memory cells M0 to M3 have ON-state current values as shown in FIG. 6, similarly to the first embodiment. In the type 0 memory cell M0, no transistor is turned on by the aforementioned voltage due to the extremely high threshold voltage D0 of the channel 24, and hence the ON-state current value (0) remains at zero. In the type 1 memory cell M1, the ON-state current value (i) is reduced due to the slightly high threshold voltage D1. In the type 2 memory cell M2, the ON-state current value (ii) is slightly increased due to the slightly low threshold voltage D2. In the type 3 memory cell M3, the ON-state current value (iii) is extremely increased due to the extremely low threshold voltage D3. The sense circuit 36 detects ranges to which the threshold voltages of the channels 54 of the memory cells M0 to M3 belong, and converts the same to three-dimensional data {(A), (B), (C)} as shown in FIG. 7, similarly to the first embodiment. In more concrete terms, {(A), (B), (C)} are {"H", "H", "H"} for the type 0 memory cell M0, {"L", "H", "H"} for the type 1 memory cell M1, {"L", "L", "H"} for the type 2 memory cell M2, and {"L", "L", "L"} for the type 3 memory cell M3. The data {(A), (B), (C)} are transmitted to the decision circuit 37. The decision circuit 37 converts the three-dimensional data {(A), (B), (C)} received from the sense circuit 36 to the 2-bit data ((1), (2)). In more concrete terms, ((1), (2))=(H, H) when {(A), (B), (C)}={"H", "H", "H"}, i.e., when the type 0 memory cell M0 is selected, ((1), (2))=(H, L) when {(A), (B), (C)}={"L", "H", "H"}, i.e., when the type 1 memory cell M1 is selected, ((1), (2))=(L, H) when {(A), (B), (C)}={"L", "L", "H"}, i.e., when the type 2 memory cell M2 is selected, and ((1), (2))=(L, L) when {(A), (B), (C)}={"L", "L", "L"}, i.e., when the type 3 memory cell M3 is selected.

Thus, each of the memory cells M0 to M3 has multivalue characteristics as 2-bit data ((1), (2)), whereby it is possible to improve the degree of data integration by reducing the chip size of the ROM at about the same degree of refinement as the prior art, similarly to the first embodiment.

<Fabrication Method>

A method of fabricating the semiconductor memory device according to this embodiment is now described. First, a LOCOS field oxide film is formed on a peripheral portion of an upper surface of the p-type semiconductor substrate 51 to define isolating regions for the peripheral circuits, along a procedure which is similar to that of the first embodiment. Then, the gate dielectric film 53, the bit lines, the word lines 52 (gates) and the gates of the peripheral transistors are successively formed, and thereafter impurity implantation is carried out with respect to the peripheral transistors for forming n⁻-type diffusion regions, and overall anisotropic etching is carried out to form the side walls 62 on both cross-directional side surfaces of the word lines 52 of all memory cells M0 to M3 and the gates of the peripheral transistors. Thereafter impurity implantation of $B^+$, $BF_2^+$ or the like is carried out in regions of the isolating zones 57.

Figure 22:
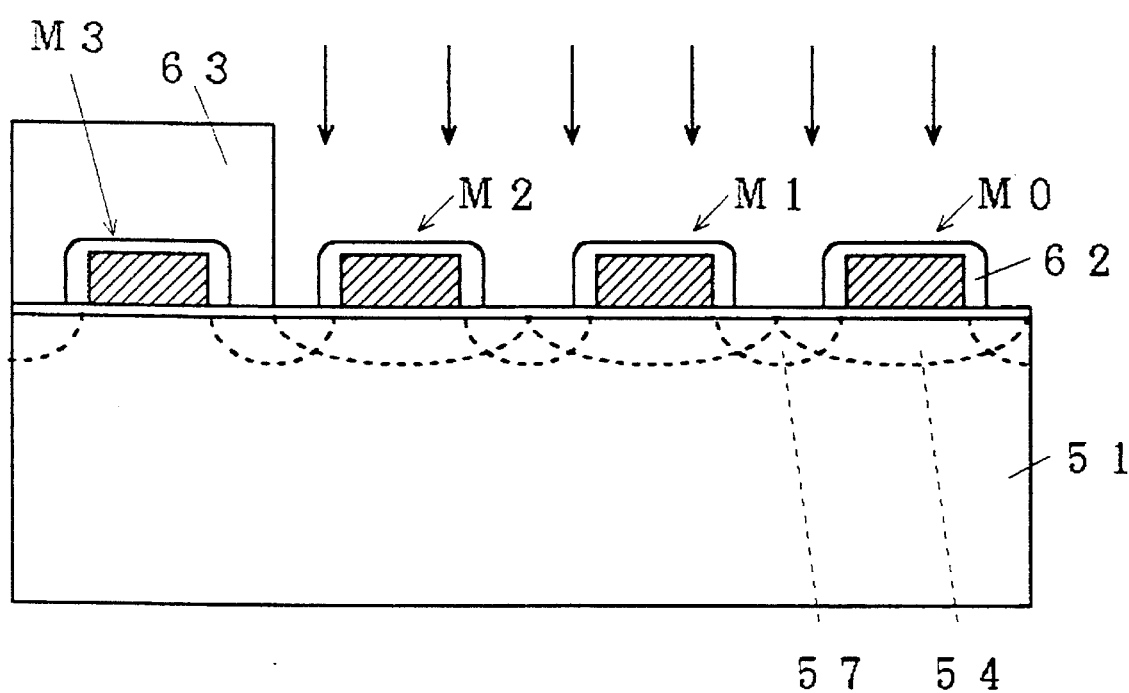
FIG. 22 illustrates a step of fabricating the semiconductor device according to the second embodiment of the present invention.
Figure 23:
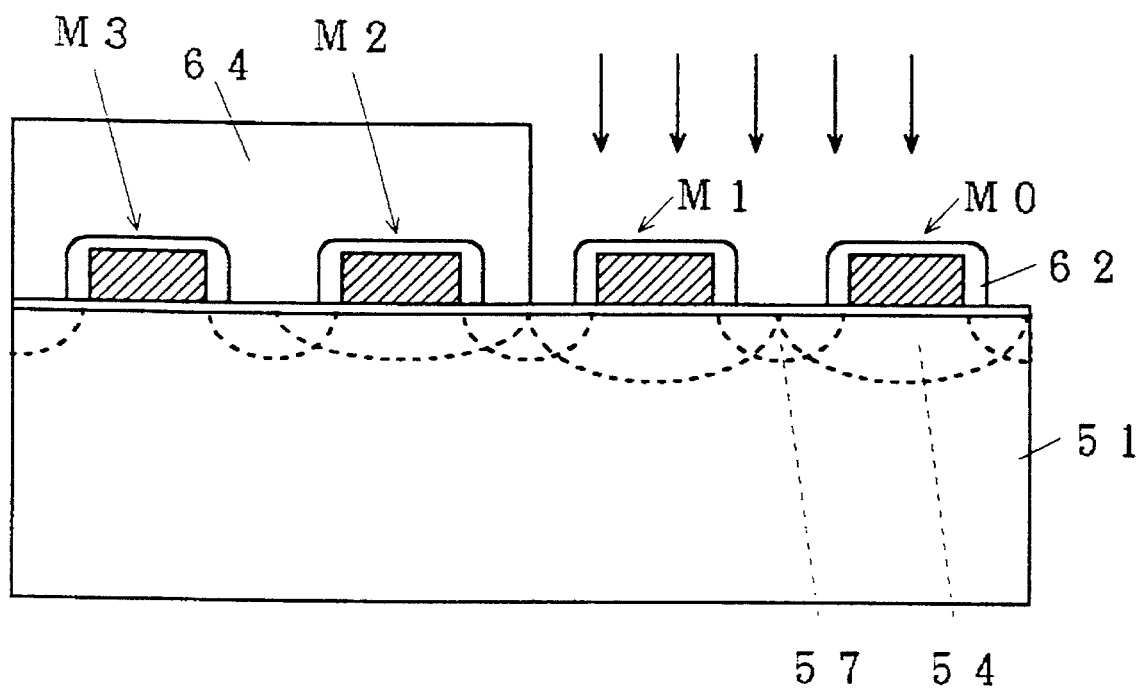
FIG. 23 illustrates a step of fabricating the semiconductor device according to the second embodiment of the present invention.

As shown in FIG. 22, only the memory cell M3 is masked with a photoresist film 63, and impurity implantation is carried out with B (boron) or the like from above the remaining memory cells M0 to M2, to increase threshold voltages thereof.

Figure 24:
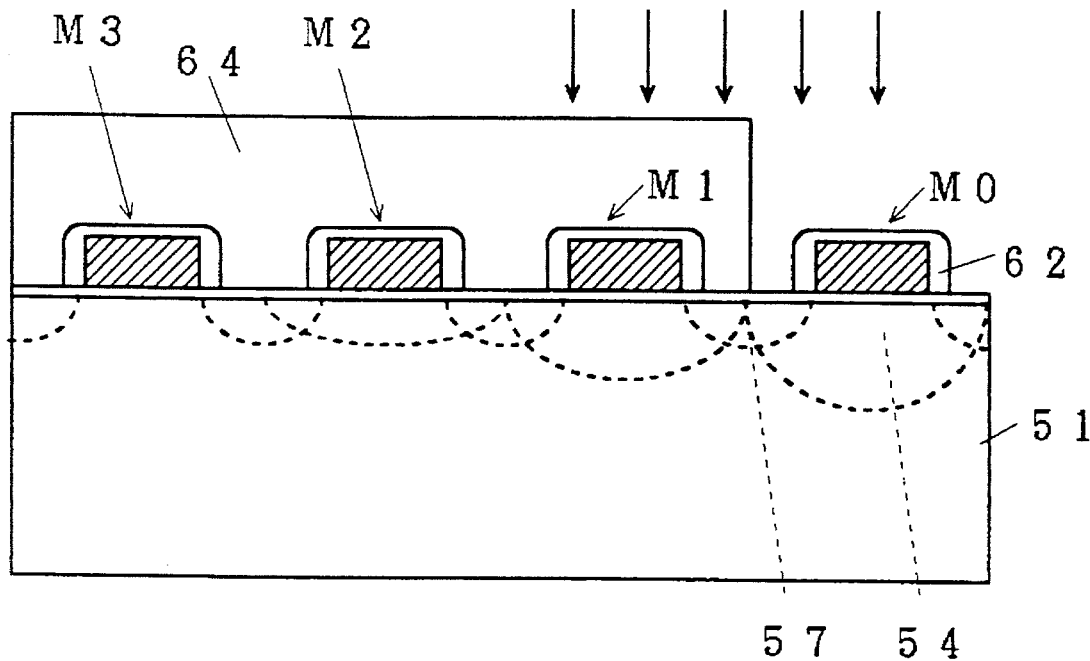
FIG. 24 illustrates a step of fabricating the semiconductor device according to the second embodiment of the present invention.

Then, the memory cells M2 and M3 are masked with another photoresist film 64 as shown in FIG. 24, and impurity implantation is carried out with B (boron) or the like into regions of the semiconductor substrate 51 provided with the remaining memory cells M0 and M1 to increase the threshold voltages thereof.

Finally, impurity implantation for programming is carried out only on the memory cell M0 as shown in FIG. 24, thereby forming four types of memory cell transistors having different threshold voltages. Then, the interlayer dielectric films 58, metal wires and the surface protective film 61 are formed to complete the semiconductor memory device shown in FIG. 21.

[Third Embodiment]

Figure 25:
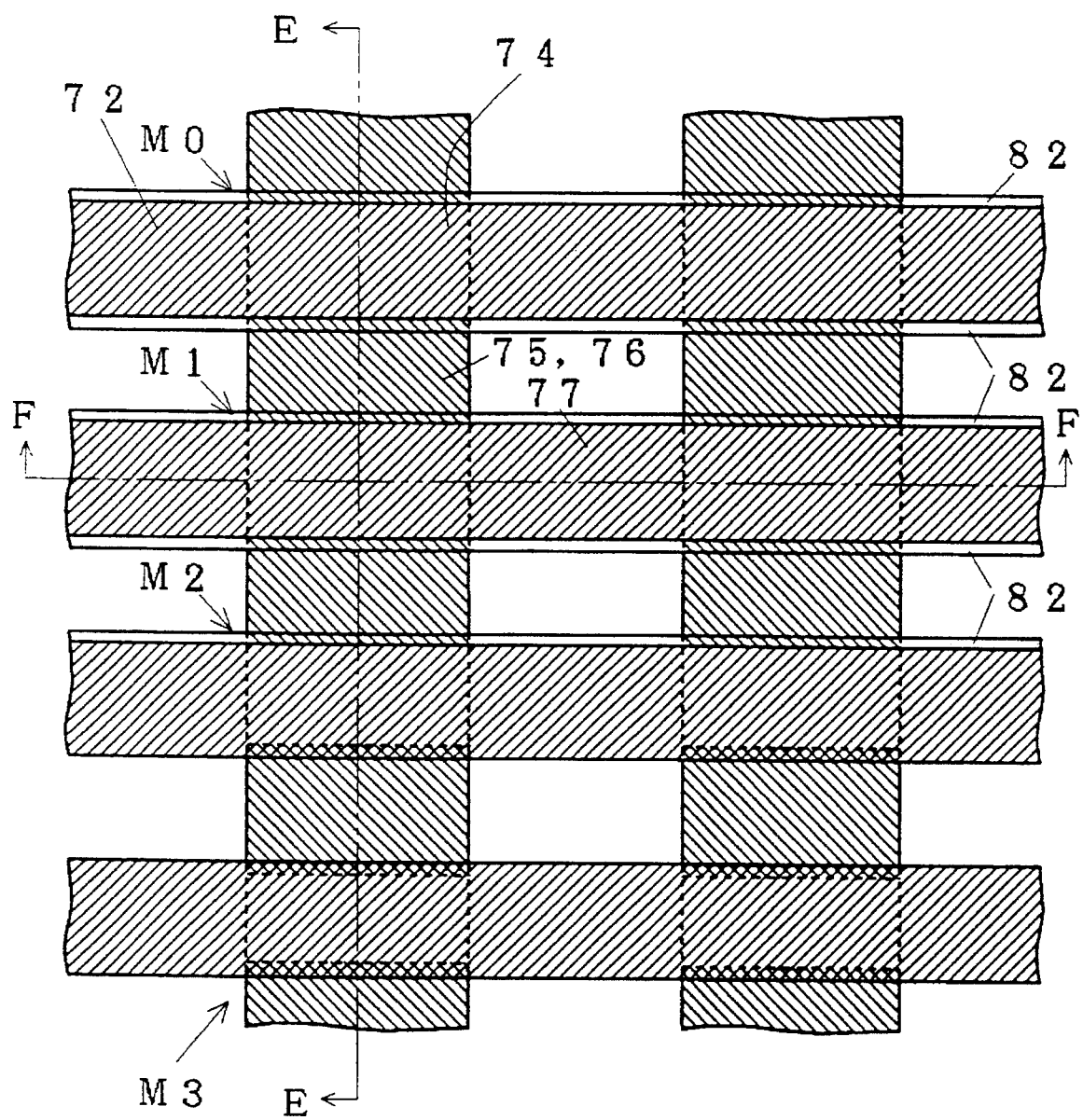
FIG. 25 is a plan view showing a semiconductor memory device according to a third embodiment of the present invention.
Figure 26:
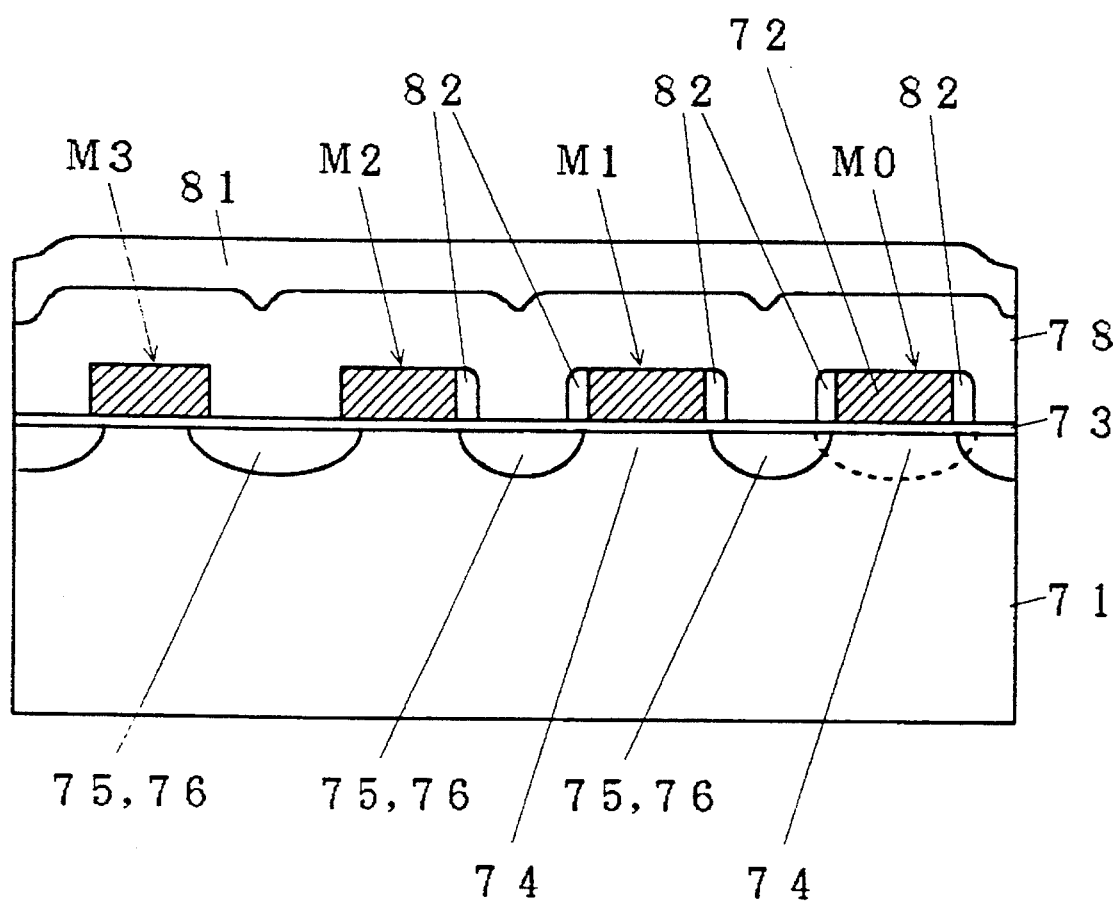
FIG. 26 is a sectional view taken along the line E—E in FIG. 25.
Figure 27:
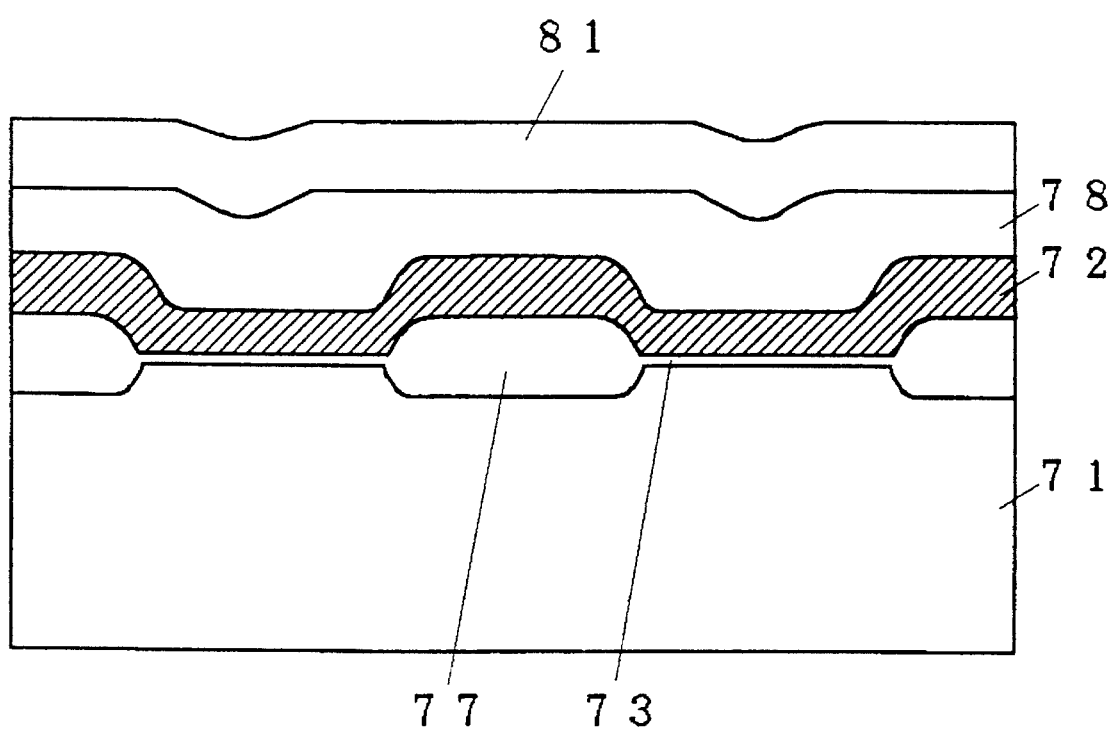
FIG. 27 is a sectional view taken along the line F—F in FIG. 25.
Figure 28:
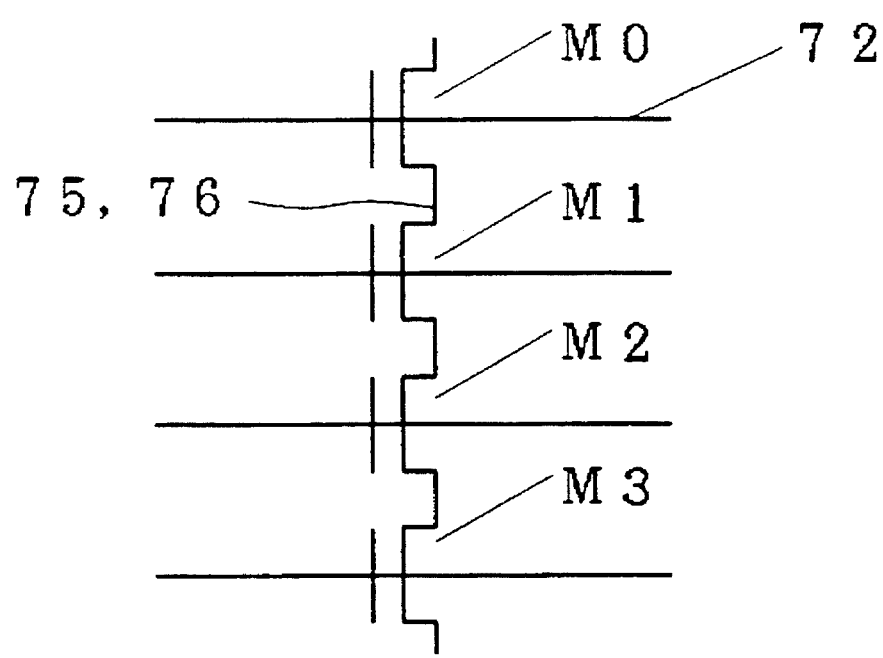
FIG. 28 is a circuit diagram showing memory cells of the semiconductor memory device according to the third embodiment of the present invention.

FIG. 25 is a plan view showing a semiconductor memory device according to a third embodiment of the present invention, FIG. 26 is a sectional view taken along the line E—E in FIG. 25, FIG. 27 is a sectional view taken along the line F—F in FIG. 25, and FIG. 28 is an internal circuit diagram showing a memory cell array. The semiconductor memory device according to this embodiment is similar to that according to the first embodiment in a point that channel length control and threshold voltage control are combined with each other to implement quaternary memory cells, while the former is different from the latter in a point that the same is of a NAND type structure. Referring to FIGS. 25 to 27, symbols M0 to M3 denote memory cells, numeral 71 denotes a p-type semiconductor substrate of Si or the like, numeral 72 denotes word lines of polycide or the like for forming gates for the respective memory cells M0 to M3, numeral 73 denotes a gate dielectric film of an Si oxide film or the like, numeral 74 denotes channels (active regions) formed on parts of an upper layer portion of the p-type semiconductor substrate 71, numerals 75 and 76 denote sources and drains which are formed for the respective memory cells M0 to M3 as n⁺-type diffusion layers, numeral 77 denotes isolating zones (LOCOS oxide film) for isolating the channels 74 of different ones of the memory cells M0 to M3 in regions between approximate ones of the word lines 72, numeral 78 denotes an interlayer dielectric film, numeral 81 denotes a surface protective film (passivation film) such as an Si oxide film or an Si nitride film, and numeral 82 denotes side walls which are formed at least on first ones of cross-directional side surfaces of parts of the plurality of word lines 72. The word lines 72 are set at the same widths.

In the semiconductor memory device according to this embodiment, the sources 75 and the drains 76 are formed through the word lines 72 and the side walls 82 serving as masks. Thus, lengths (channel lengths) of the channels 74 which are held between the sources 75 and the drains 76 are set depending on presence/absence of the side walls 82.

The channel 74 of the type 0 memory cell M0 is of an enhancement type, while the remaining memory cells M1 to M3 are of depression types. The type 1 memory cell M1 is set at a relatively large channel resistance value (first resistance value) and the type 2 memory cell M2 is set at an intermediate channel resistance value (second resistance value), while the type 3 memory cell M3 is set at a relatively small channel resistance value (third resistance value). The type 0 memory cell M0 is set at a large channel resistance value, similarly to the first resistance value. Such differences between the channel resistance values are set by making the respective channel lengths different from each other. Namely, the channel resistance values are increased if the channel lengths are large, while the former are reduced if the latter are small. The channel lengths are set depending on whether or not the side walls 82 are formed on cross-directional side surfaces of the word lines 72. Namely, the amounts of overlapping of the word lines 72 and the sources 75 and the drains 76 are varied with presence/absence of the side walls 82, and hence the channels 74 are lengthened by the widths of the side walls 82.

In more concrete terms, the side walls 82 are formed on both of the cross-directional side surfaces of the word line 72 corresponding to the type 1 memory cell M1, so that the memory cell M1 is set at a large channel length, and hence at a large channel resistance value. The side wall 82 of the type 2 memory cell M2 is formed only on one of the cross-directional side surfaces of the corresponding word line 72, so that the memory cell M2 is set at an intermediate channel length, and hence an intermediate channel resistance value. No side walls 82 are formed on the cross-directional side surfaces of the word line 72 corresponding to the type 3 memory cell M3, so that the memory cell M3 is set at a small channel length, and hence at a small channel resistance value. The side walls 82 of the type 0 memory cell M0 is formed on both of the cross-directional side surfaces of the corresponding word line 72 similarly to the type 1 memory cell M1, so that the memory cell M0 is set at a large channel length and hence at a large channel resistance value.

Thus, it is possible to form four types of memory cell transistors by forming the three types of memory cells including those provided with the side walls 82 on both sides of the side walls of the word lines 72 (type 0 and 1 memory cells M0 and M1), that provided with the side wall 82 on one side (type 2 memory cell M2) and that provided with no side wall 82 (third memory cell M3) and carrying out impurity implantation for programming in the channel 74 of one (type 0 memory cell M0) of those provided with the side walls 82 on both sides for setting the same at a high channel threshold voltage, as follows:

Type 0 memory cell M0: channel length=large, threshold voltage=enhancement

Type 1 memory cell M1: channel length=large, threshold voltage= depression

Type 2 memory cell M2: channel length=intermediate, threshold voltage=depression Type 3 memory cell M3: channel length=small, threshold voltage=depression Also according to this embodiment, it is possible to store 2-bit data (four values) in a single memory cell transistor.

In order to fabricate the semiconductor memory device according to this embodiment, the side walls 82 may be formed on the side surfaces of the word lines 72 of all memory cells M0 to M3 so that masks are formed on required portions by photoresist films or the like to selectively remove the side walls 82 from both sides of the type 3 memory cell M3 and one side of the type 2 memory cell M2 by etching. According to this embodiment, it is possible to attain an effect which is similar to that of the first embodiment.

[Fourth Embodiment]

Figure 29:
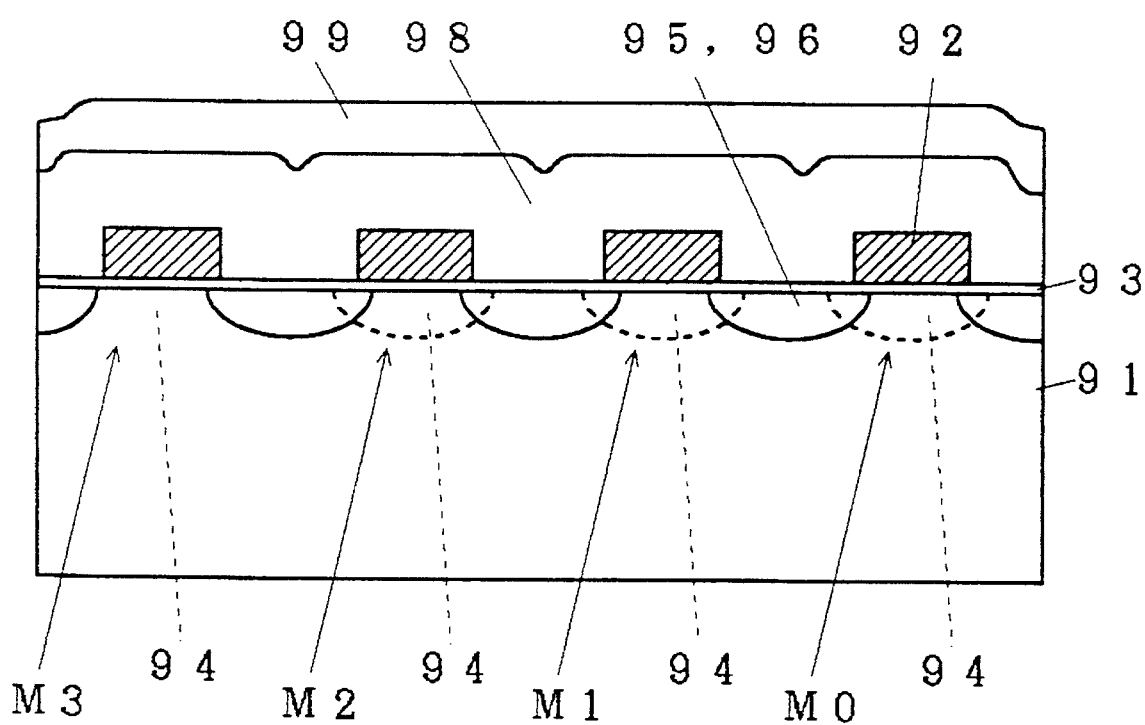
FIG. 29 is a sectional view showing a semiconductor device according to a fourth embodiment of the present invention.

FIG. 29 is a sectional view showing a semiconductor memory device according to a fourth embodiment of the present invention. This embodiment is similar to the second embodiment in a point that electrical properties of channels are achieved only by differences between threshold voltages, but the former is different from the latter in a point that the same is of a NAND type system. Referring to FIG. 29, symbols M0 to M3 denote memory cells, numeral 91 denotes a p-type semiconductor substrate of Si or the like, numeral 92 denotes word lines of polycide or the like for forming gates for the respective memory cells M0 to M3, numeral 93 denotes a gate dielectric film of an Si oxide film or the like, numeral 94 denotes channels (active regions) formed on parts of an upper layer portion of the p-type semiconductor substrate 91, numerals 95 and 96 denote sources and drains which are formed for the respective memory cells M0 to M3 as n⁺-type diffusion layers, numeral 98 denotes an interlayer dielectric film, and numeral 99 denotes a surface protective film (passivation film) such as an Si oxide film or an Si nitride film.

The channels 94 are formed in regions which are held between the bit lines immediately under the word lines 92. Respective threshold voltages of the channels 94 are set by adjusting amounts of implanted impurity respectively. In more concrete terms, the threshold voltages of the memory cells M0 to M3 are set as follows:

Type 0 memory cell M0: threshold voltage D0=enhancement

Type 1 memory cell M1: threshold voltage D1=strong depression

Type 2 memory cell M2: threshold voltage D2=intermediate depression

Type 3 memory cell M3: threshold voltage D3=weak depression

Also according to this embodiment, it is possible to store 2-bit data (four values) in a single memory cell transistor, similarly to the third embodiment.

[Fifth Embodiment]

<Structure>

When a quaternary memory cell array is to be formed with further cell refinement as compared with those in the first and third embodiments, it may be difficult to correctly form a photoresist film to an intermediate portion of the type 2 memory cell M2 in the step of forming the side wall 32 of the type 2 memory cell M2 only on one of the cross-directional side surfaces of the word line 22 shown in FIG. 15, for example. In consideration of such difficulty, a semiconductor memory device according to a fifth embodiment of the present invention is formed by a ternary memory cell array. This semiconductor memory device (ROM) is of a NOR flat cell system. In more concrete terms, the memory cell array of this embodiment is formed by a type 0 memory cell M0 having a channel 24 whose threshold voltage is set at a value being different from those of other memory cells M1 and M2, a type 1 memory cell M1 provided with absolutely no side walls (i.e., having a high channel resistance value), and a type 2 memory cell M2 provided with side walls 32 on both sides. Since this embodiment is of the NOR flat cell system, the type 0 memory cell M0 is provided with no side walls. Thus, it is not necessary to correctly form a photoresist film to an intermediate portion of the memory cell M2 shown in FIG. 15, dissimilarly to the first embodiment. This embodiment is similar in other structure to the first embodiment, and hence members having the same functions as those in the first embodiment are denoted by the same reference numerals.

<Employing Method>

Figure 31:
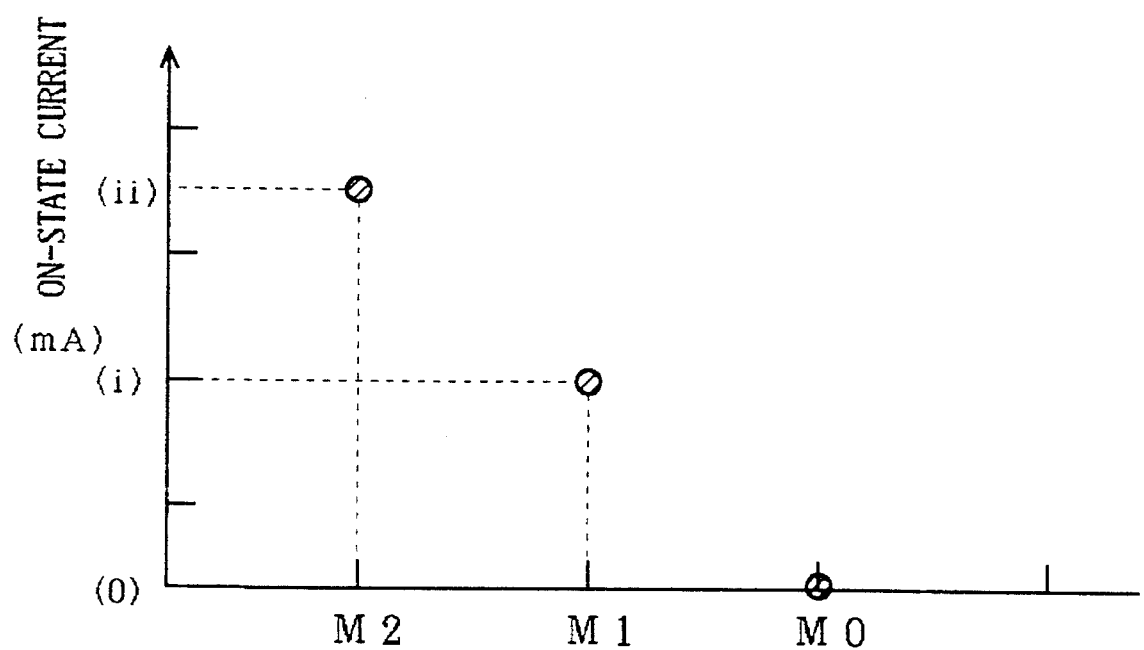
FIG. 31 illustrates relations between respective memory cells and ON-state current values in the semiconductor memory device according to the fifth embodiment of the present invention.
Figure 32:
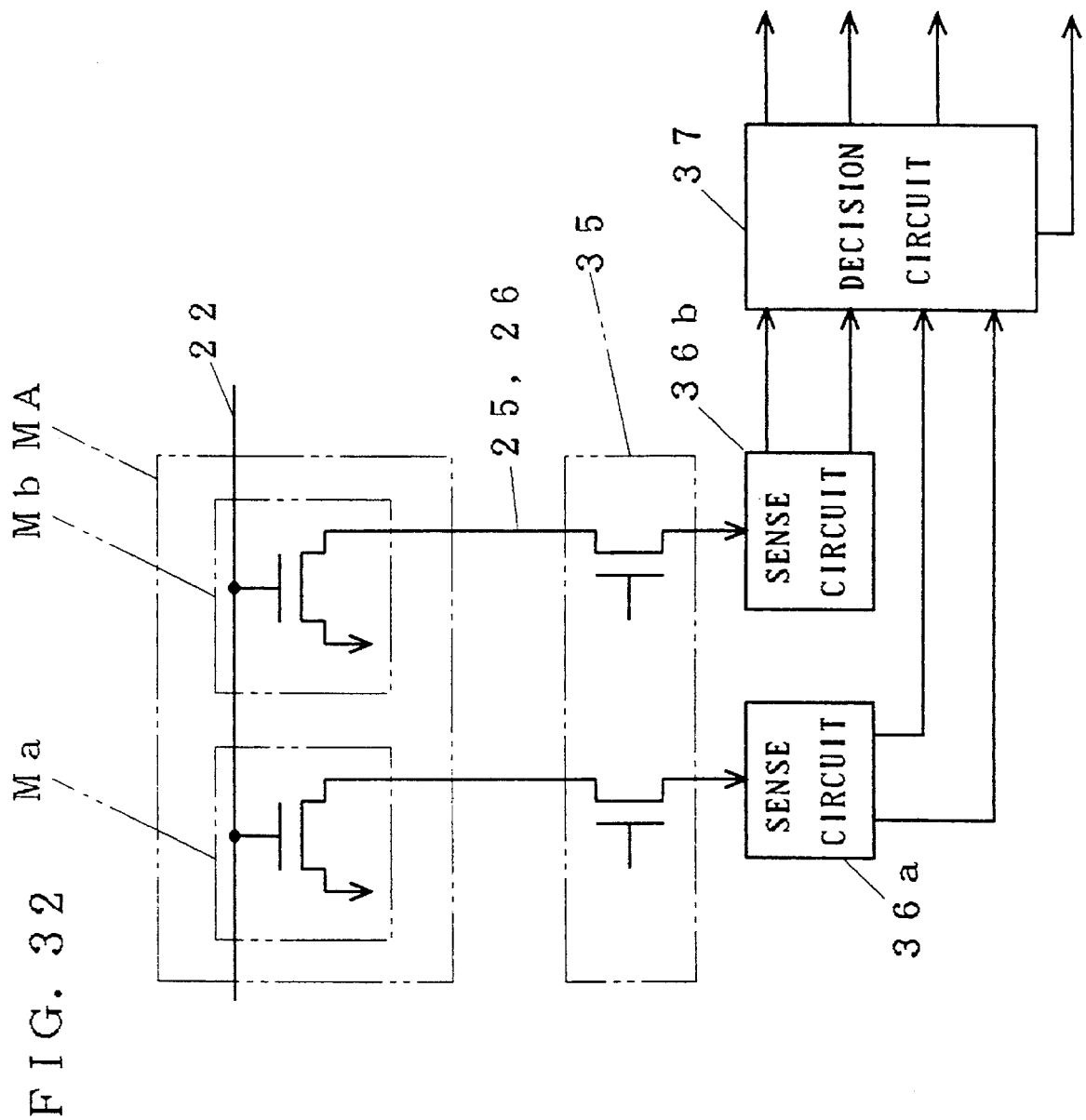
FIG. 32 is a block diagram showing peripheral circuits in the semiconductor memory device according to the fifth embodiment of the present invention.

A method of reading storage data is now described. FIG. 31 illustrates exemplary output data (ON-state current values) in the respective memory cells each storing three values, and FIG. 32 is a block diagram showing a readout circuit (sense circuits etc.) for the memory cell array. As shown in FIG. 32, two memory cells Ma and Mb are selected according to this embodiment so that ON-state current values of the memory cells Ma and Mb are detected by sense circuits 36a and 36b and 3-bit data are read by decision in a decision circuit 37. In more concrete terms, the memory cells Ma and Mb have different ON-state currents (0), (i) and (ii) shown in FIG. 31. As shown in FIG. 33, output signals {(A), (B)} are {"H", "H"} when the memory cell Ma belongs to the type 0 (M0), {"L", "H"} when the same belongs to the type 1 (M), and {"L", "L"} when the same belongs to the type 2 (M2). Similarly, output signals {(C), (D)} of the sense circuit 36b are {"H", "H"} when the memory cell Mb belongs to the type 0 (M0), {"L", "H"} when the same belongs to the type 1 (M), and {"L", "L"} when the same belongs to the type 2 (M2).

On the basis of the output signals {(A), (B), (C), (D)} of the sense circuits 36a and 36b obtained in the aforementioned manner, the decision circuit 37 converts the same to 3-bit data ((1), (2), (3)). In more concrete terms, ((1), (2), (3))=(L, L, L) when {(A), (B), (C), (D)}=("L", "L", "L", "L"), i.e., when both of Ma and Mb are M2, ((1), (2), (3))=(L, L, H) when {(A), (B), (C), (D)}=("L", "L", "L", "H"), i.e., when Ma and Mb are M2 and M1 respectively, ((1), (2), (3))=(L, H, L) when {(A), (B), (C), (D)}=("L", "L", "H", "H"), i.e., when Ma and Mb are M2 and M0 respectively, ((1), (2), (3)) = (L, H, H) when {(A), (B), (C), (D)}=("L", "H", "L", "L"), i.e., when Ma and Mb are M1 and M2 respectively, ((1), (2), (3))=(H, L, L) when {(A), (B), (C), (D)}=("L", "H", "L", "H"), i.e., when both of Ma and Mb are M1, ((1), (2), (3))=(H, L, H) when {(A), (B), (C), (D)}= ("L", "H" "H" "H"), i.e., when Ma and Mb are M1 and M0 respectively, ((1), (2), (3))= (H, H, L) when {(A), (B), (C), (D)}=("H", "H", "L", "L"), i.e., when Ma and Mb arc M0 and M2 respectively, and ((1), (2), (3))=(H, H, H) when {(A), (B), (C), (D)}=("H", "H", "L", "H"), i.e., when Ma and Mb arc M0 and M1 respectively. According to this embodiment, the decision circuit 37 has $2^3$=8 output combinations while the pair of sense circuits 36a and 36b have $3^2$=9 output combinations, and hence the remaining outputs of the sense circuits 35a and 36b, i.e., {(A), (B), (C), (D)}=("H", "H", "H", "H") when both of Ma and Mb arc M0, are employed as error detection data.

Thus, it is possible to multivalue the storage data with respect to transistors forming the memory cells. While a single memory cell transistor corresponds to 1-bit data in the prior art, a single memory cell transistor can store 1.5-bit data in each of the ternary memory cells according to this embodiment, whereby the number of the memory cell transistors can be reduced to ⅔ as compared with the prior art, in relation to memory devices (ROMs) of the same storage capacity. Thus, it is possible to remarkably reduce the chip size, thereby enabling cost reduction and mass storage.

<Fabrication Method>

Figure 30:
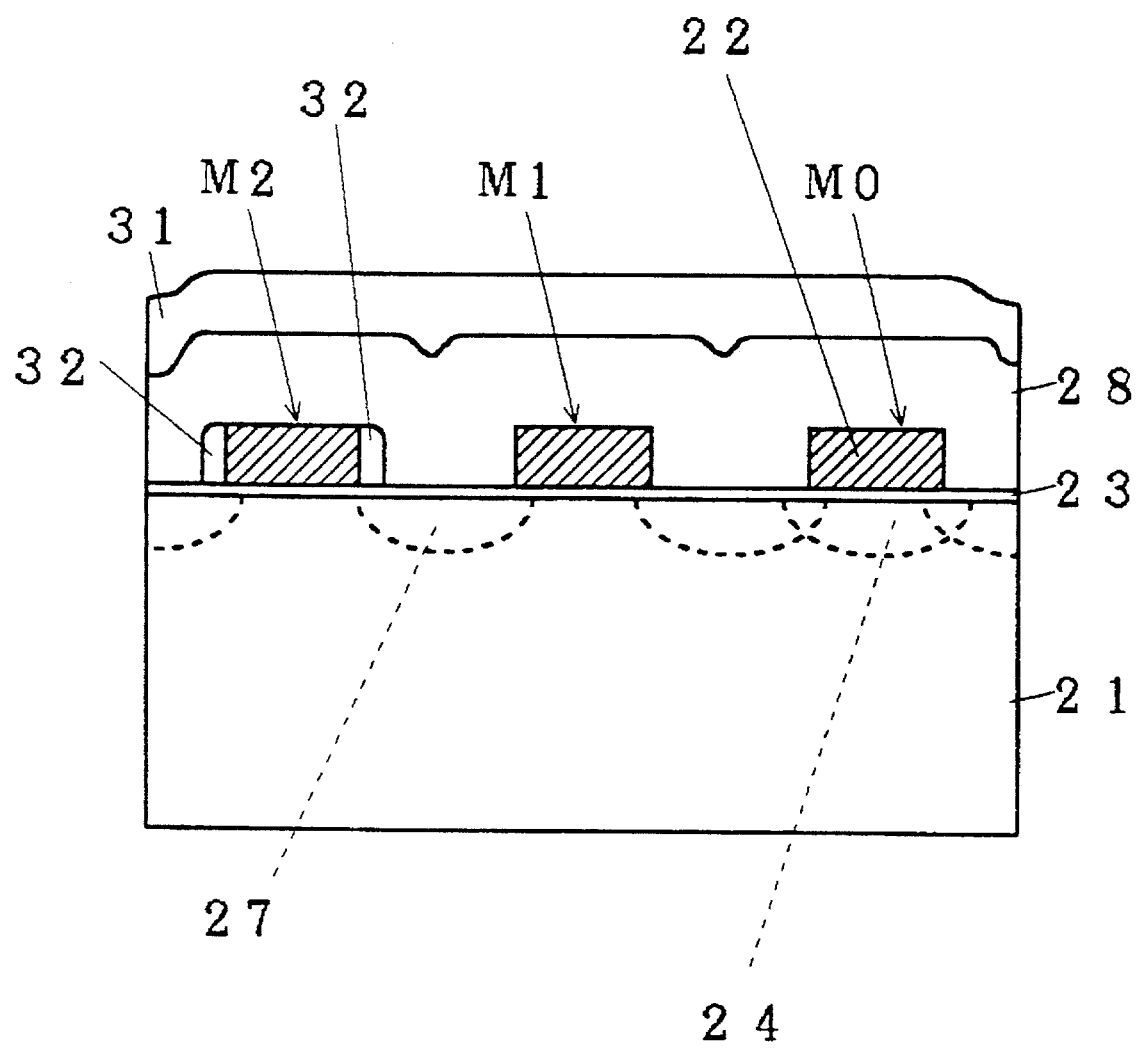
FIG. 30 is a sectional view showing a semiconductor device according to a fifth embodiment of the present invention.

A method of fabricating the semiconductor memory device according to this embodiment is now described. Similarly to the first embodiment shown in FIGS. 11 and 13, bit lines 25 and 26 and word lines 22 are stacked on a p-type semiconductor substrate 21, and thereafter side walls 32 are formed on both cross-directional side surfaces of the word lines 22 of all memory cells M0 to M3. On the basis of ROM design, the overall region of the type 2 memory cell M2 is covered with a photoresist film (photolithography Step) and a surface oxide film is removed by etching, to leave the side walls 32 of the type 2 memory cell M2. At this time, it is not necessary to accurately cover the memory cell M2 with the photoresist film to its intermediate portion, whereby it is possible to cope with an extremely fine memory cell array. Thereafter the word lines 22 and the side walls 32 are employed as masks to ion-implant an impurity such as boron (B) or $BF_2$, to form isolating zones 27. The amounts of overlapping of the isolating zones 27 and the word lines 22 deviate by the widths of the side walls 32. Thus, it is possible to adjust channel widths of the memory cells M0 to M2. Thereafter impurity implantation for programming is carried out to set the type 0 memory cell M0 at a sufficiently high threshold voltage, and interlayer dielectric films 28, metal wires 29 and a surface protective film 31 are formed to complete the semiconductor memory device shown in FIG. 30.

[Sixth Embodiment]

Figure 34:
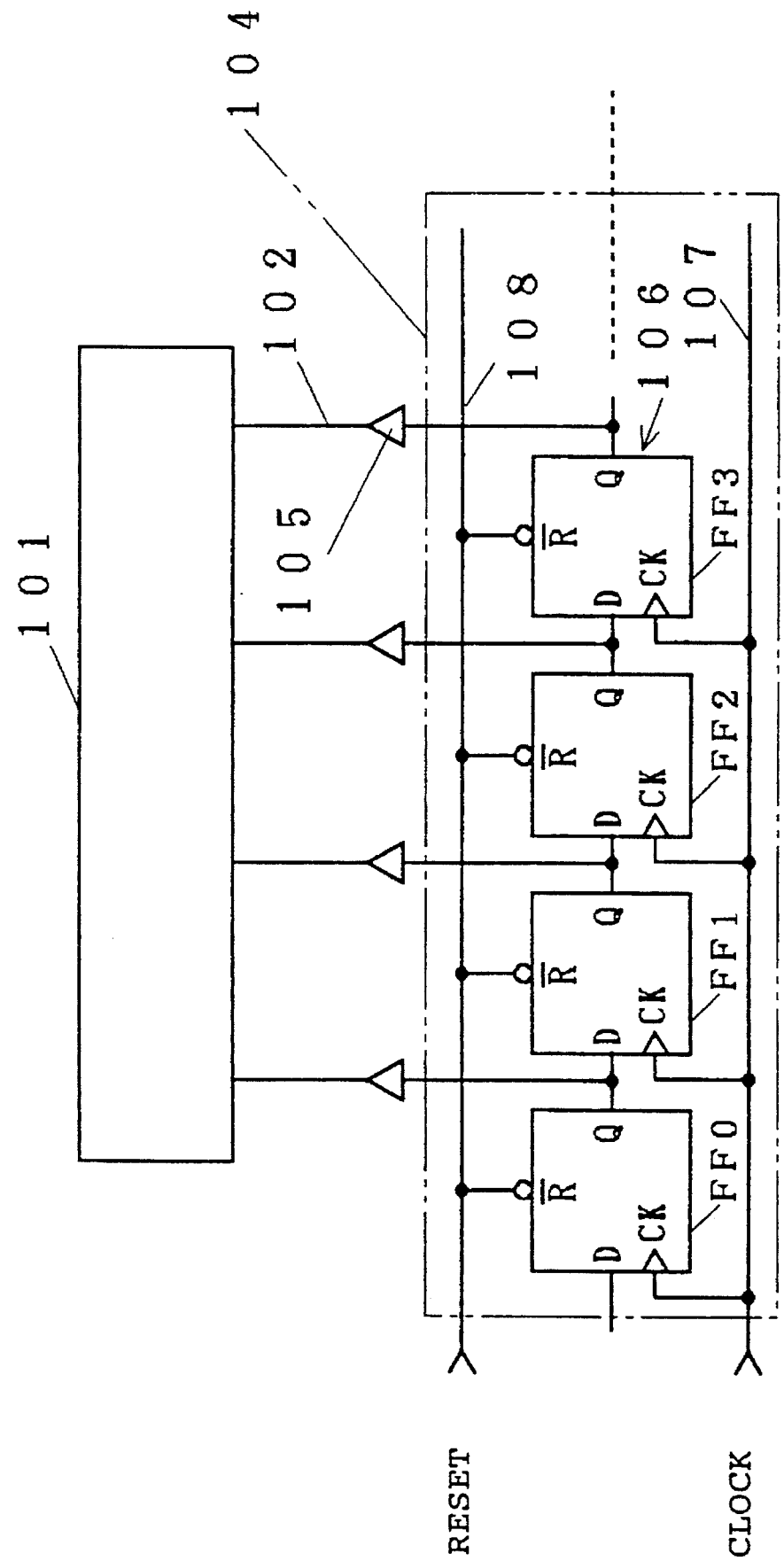
FIG. 34 is a circuit diagram schematically showing a semiconductor memory device according to a sixth embodiment of the present invention.

In order to substitute a semiconductor memory device (mask ROM) for a CD-ROM, for example, high capacity, a low speed and a low cost are required. Particularly in substitution for a CD-ROM, the mask ROM sufficiently serves its function in sequential access. A semiconductor memory device according to a sixth embodiment of the present invention is a sequential access memory (ROM), as shown in FIG. 34, which comprises a memory cell array 101 provided with a plurality of vertically and transversely arranged memory cells, a plurality of connection lines 102 which are connected with the plurality of memory cells provided in the memory cell array 101 and arranged in parallel along a single direction, and an address decoder 104 for selecting the plurality of connection lines 102.

The memory cell array 101 may be formed by a ROM array similarly to each of the first to fifth embodiments, or a reloadable memory array such as that of an EPROM, an EEPROM, a flash memory or a RAM.

The connection lines 102 include all of gate input word lines and drain signal input bit lines for the respective memory cells provided in the memory cell array 101, while the word lines and the bit lines are formed to intersect with each other. The connection lines 102 are made to have buffers 105 for amplifying respective bit outputs and transmitting selection signals to the respective memory cells.

The address decoder 104 includes both of a first address decoder (X address decoder) for selecting the plurality of word lines, and a second address decoder (Y address decoder) for selecting the plurality of bit lines. This address decoder 104 comprises a shift register 106 which is formed by a column of flip-flops FF0 to FF3 corresponding to the respective connection lines 102, a first bus bar 107 (clock line) for inputting a clock signal which is connected to clock input terminals (CK) of the flip-flops FF0 to FF3 forming the shift register 106 in a single bus system, and a second bus bar 108 (set/reset line) for inputting a reset signal which is connected to reset input terminals/R of the flip-flops FF0 to FF3 forming the shift register 106 in a single bus system. Data output terminals Q of the flip-flops FF0 to FF2 forming the shift register 106 are connected to data input terminals D of the adjacent flip-flops FF1 to FF3 respectively, while a data input terminal D of the frontmost (first) flip-flop FF0 is connected with a data output terminal Q of the rearmost flip-flop FF3. The data input terminals D of the flip-flops FF0 to FF3 are connected to the buffers 105 of the connection lines 102. Thus, the address decoder 104 requires only an area which is sufficient for forming the shift register 106 and the first and second bus bars 107 and 108, whereby the area can be sufficiently reduced as compared with the third prior art having wires connected in a multiple bus system, to attain reduction in cost.

When power is applied or the chip is reset in the aforementioned structure, the second bus bar 108 supplies a reset signal to reset the shift register 106. At this time, the memory cells are in nonselected states.

In starting of sequential access, data "1" is inputted in the data input terminal D of the frontmost (first) flip-flop FF0. Thus, data arrangement of (FF0, FF1, FF2, FF3) becomes (1, 0, 0, 0), whereby only the buffer 105 of the connection line 102 corresponding to the frontmost (first) flip-flop FF0 is turned on while the buffers 105 of the connection lines 102 corresponding to the remaining flip-flops FF1 to FF3 are turned off. Then, the first bus bar 107 transmits a clock signal to drive the shift register 106, whereby the data "1" is propagated through the shift register 106 to be transmitted to subsequent flip-flops. At this time, data "0" is inputted in the data input terminal D of the frontmost (first) flip-flop FF0. Then, (FF0, FF1, FF2, FF3)=(0, 1, 0, 0), whereby only the buffer 105 of the connection line 102 corresponding to the second flip-flop FF1 is turned on. Thereafter data "0" is inputted in the data input terminal D of the frontmost (first) flip-flop FF0 every time the first bus bar 107 transmits a clock signal. Then, (FF0, FF1, FF2, FF3) are changed as (0, 0, 1, 0) and (0, 0, 0, 1), so that only the buffers 105 of the connection lines 102 corresponding to the flip-flops FF2 and FF3 respectively are successively turned on. Thereafter data "1" is inputted in the data input terminal D of the frontmost (first) flip-flop FF0 every change of a sector address. The aforementioned operation is so repeated that the outputs of the flip-flops FF0 to FF3 forming the shift register 106 are amplified by the buffers 105 and selection signals are successively transmitted to the connection lines 102 (word lines or bit lines), whereby it is possible to sequentially access the memory cells.

According to this embodiment, it is possible to implement an operation which is similar to that of the third prior art while reducing the areas of the respective address decoders as described above. Thus, it is possible to reduce power consumption as well as to improve the processing speed by reducing the number of wires through area reduction. In more concrete terms, a sector access time tas is 2.0 µs at the maximum, an in-sector access time taa is 500 µs at the maximum, a cycle time tcyc is 500 µs (2 MHz) at the minimum, a chip selection access time tce is 2.0 µs at the maximum and an OE access time toe is 100 µs at the maximum in a structure of 2 megawords×16 bits (=32 megabits) or 4 megawords×16 bits (=64 megabits). A CD-ROM has an access time (in continuous reading excluding a seeking time) of 6.7 µs/byte=13.4 µs/word and a quadruple speed CD-ROM has an access time of 3.35 µs/word. Thus, it is possible to remarkably reduce the access time as compared with the CD-ROM.

[Seventh Embodiment]

A semiconductor memory device according to a seventh embodiment of the present invention is a sequential access mask ROM similarly to the sixth embodiment, while the former is different from the latter in structure of a shift register 106 provided in an access decoder 104.

Figure 35:
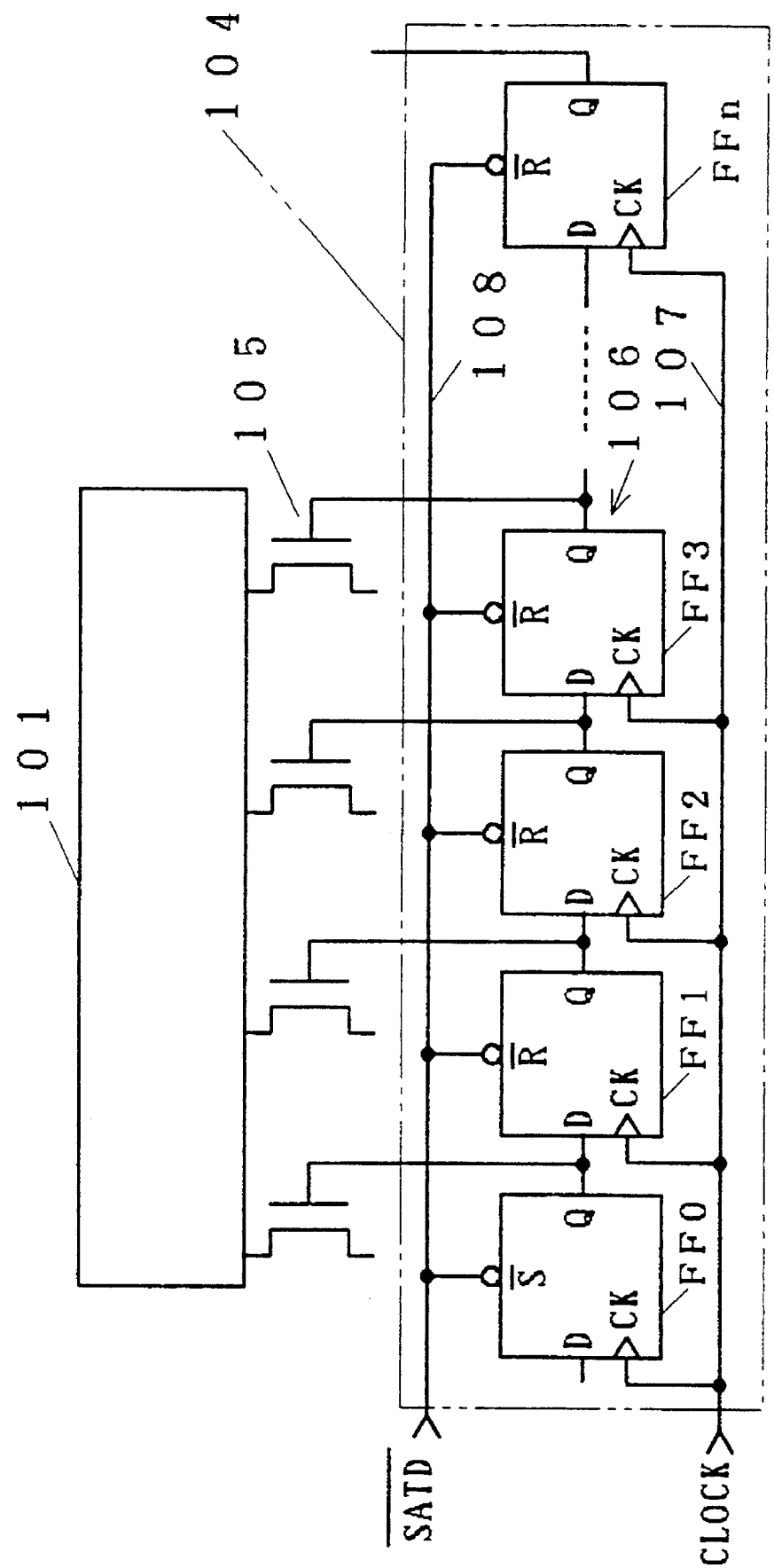
FIG. 35 is a circuit diagram schematically showing a semiconductor memory device according to a seventh embodiment of the present invention.
Figure 36:
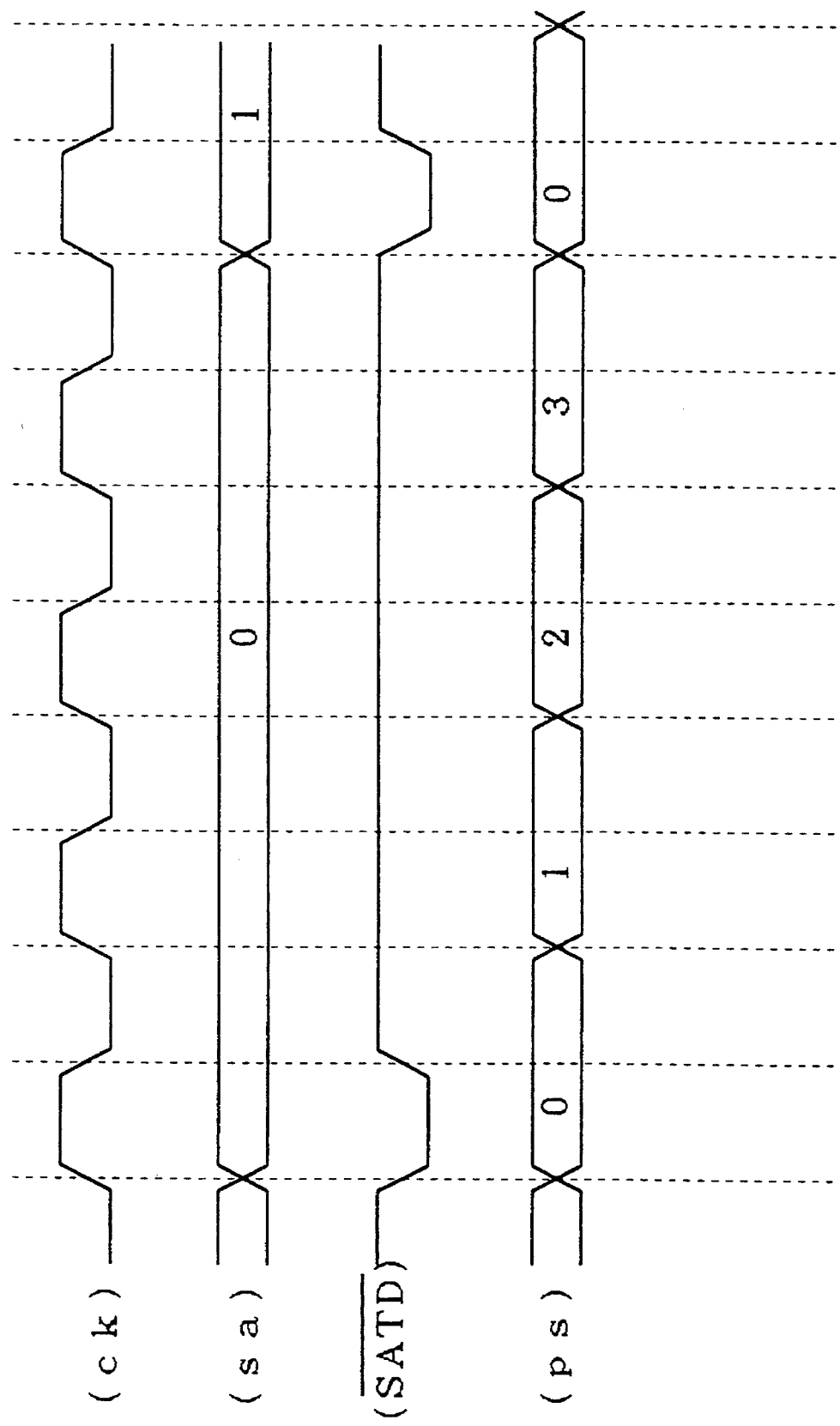
FIG. 36 illustrates waveforms in respective parts of the semiconductor memory device according to the seventh embodiment of the present invention.

As shown in FIG. 35, the semiconductor memory device according to this embodiment is a mass storage sequential access mask ROM. A second bus bar 108 is connected to a set input terminal/S of a frontmost (first) flip-flop FF0, among flip-flops FF0 to FFn forming the shift register 106. The second bus bar 108 is also connected to reset input terminals/R of the remaining flip-flops FF1 to FFn. The second bus bar 108 is further connected to a pulse unit/SATD which outputs a low pulse as an SATD signal in address transition of a sector address (X address). Other structure of this embodiment is similar to that of the sixth embodiment. FIG. 36 illustrates relations between a clock signal ck, a sector address sa and a selected bit line ps and the pulse SATD from the pulse unit/SATD. Thus, the pulse unit /SATD generates a low pulse in transition of the sector address to set the frontmost (first) flip-flop FF0 forming the shift register 106 while resetting the remaining flip-flops FF1 to FFn with this signal. A subsequent operation is similar to that of the sixth embodiment. According to this embodiment, it is possible to attain an effect which is similar to that of the sixth embodiment.

[Eighth Embodiment]

Figure 37:
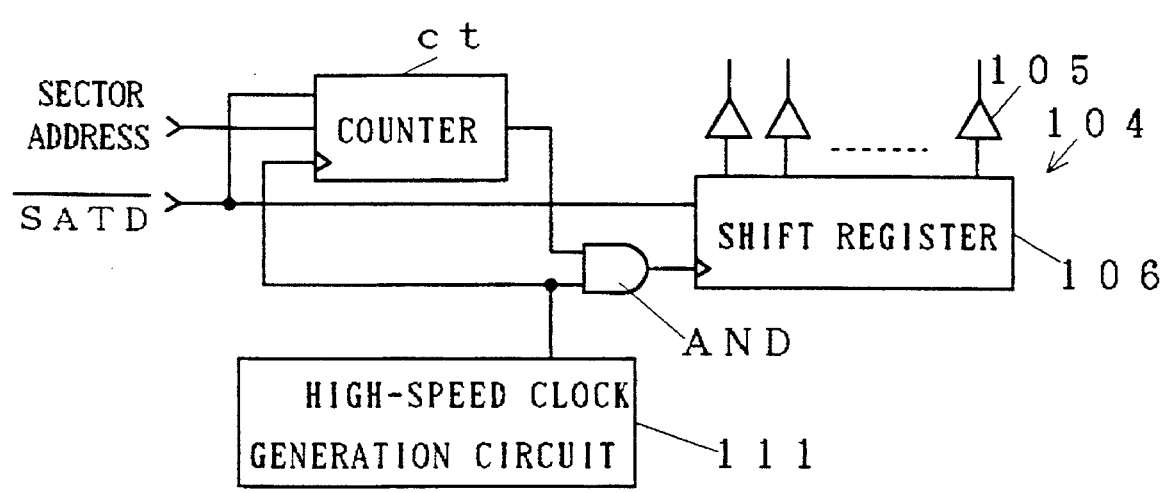
FIG. 37 is a block diagram schematically showing a part of a semiconductor memory device according to an eighth embodiment of the present invention.

In each of the sequential access mask ROMs according to the sixth and seventh embodiments, the data are transferred between adjacent ones of the flip-flops forming the shift register 106 through input of the clock signal. When the technique of the sixth or seventh embodiment is applied to a mass storage random access mask ROM having a large number of flip-flops forming a shift register, improvement of the processing speed is restricted since it takes a period of a clock time (about 1 µs in general) by the number of the flip-flops for completely selecting all bits. In a semiconductor memory device according to an eighth embodiment of the present invention, a high-speed clock generation circuit 111 is connected to a shift register 106 as shown in FIG. 37, thereby increasing a data transition speed of the shift register 106. Referring to FIG. 37, symbol ct denotes a counter, and symbol AND denotes an AND circuit.

In reading, a sector address is inputted in the counter ct in synchronization with a signal/SATD, as shown in FIG. 37. The high-speed clock generation circuit 111 generates a clock which is at the maximum speed being sufficient for driving the shift register 106, with no regard to an external clock. In more concrete terms, the high-speed clock generation circuit 111 is set at a high-speed clock time of about 10 ns. This clock decrements the counter ct to drive the shift register 106 until its count value reaches zero. This speed is sufficiently short with respect to an access time of this mask ROM, and hence the former exerts no influence on the latter. According to this embodiment, it is possible to reduce the area of an X address decoder, thereby reducing the cost. The internal structure of the address decoder is similar to that of the sixth or seventh embodiment, while an operation in the address decoder, such as data propagation through the shift register 106 in this embodiment, for example, is carried out in a procedure which is similar to that described with reference to the sixth or seventh embodiment.

According to this embodiment, the clock time is reduced to about $\frac{1}{1000}$ as compared with the clock time of 1 μs according to the sixth or seventh embodiment, whereby the data transition speed of the shift register 106 can be remarkably increased thereby attaining an effect which is similar to that of the sixth or seventh embodiment without reducing the processing speed of the random access mask ROM. Particularly when the X address decoder for specifying a sector address takes a random access system, processing speeds of the X address decoder and a Y address decoder are unbalanced if these decoders have the same structures.

When the Y address decoder is structured similarly to that in the sixth or seventh embodiment while a counter and a high-speed clock signal are employed for the X address decoder according to this embodiment, however, the X address decoder can be driven at a processing speed which is similar to that of the Y address decoder. When this embodiment is applied to a sequential access mask ROM, it is possible to extremely increase the overall processing speed.

[Ninth Embodiment]

Figure 38:
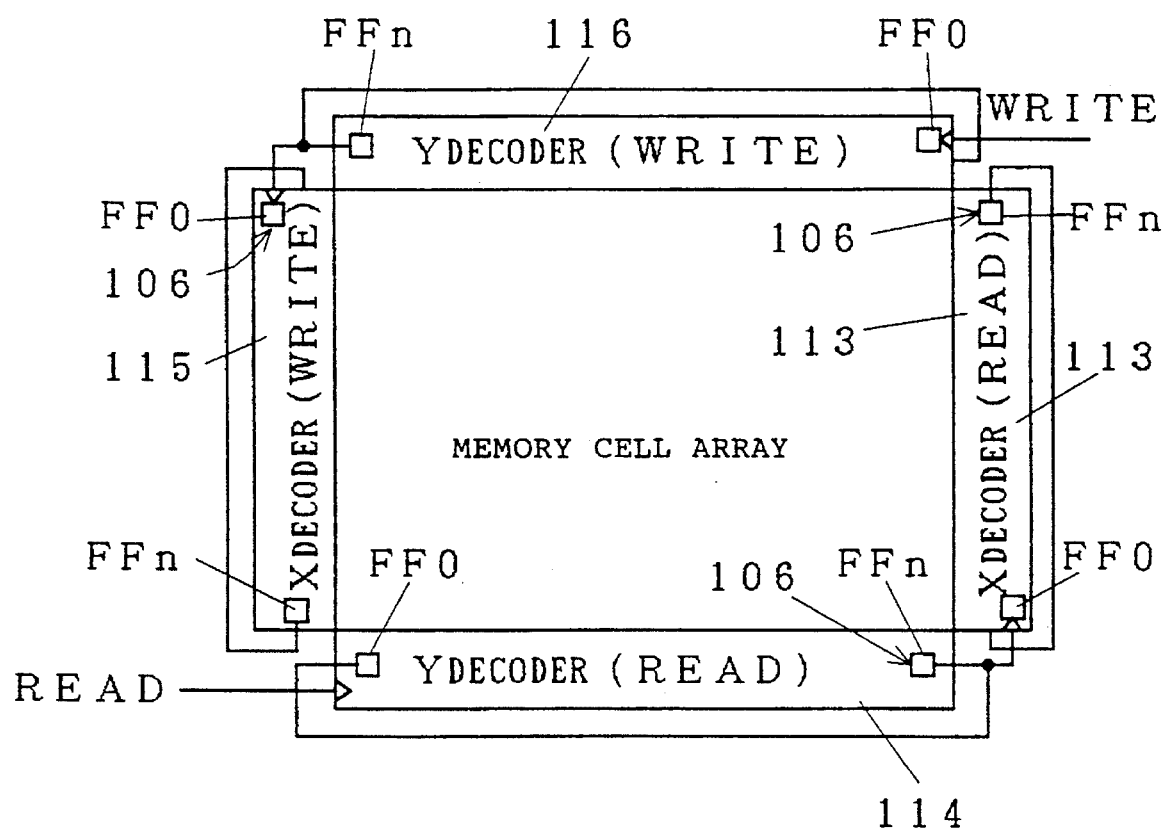
FIG. 38 is a plan view schematically showing a semiconductor memory device according to a ninth embodiment of the present invention.

A semiconductor memory device according to a ninth embodiment of the present invention is applied to a high-speed FIFO (first-in first-out memory) among sequential access memories. FIG. 38 is a plan view showing the semiconductor memory device according to this embodiment. Similarly to the sixth embodiment, the semiconductor memory device according to the ninth embodiment comprises a memory cell array 101 provided with a plurality of vertically and transversely arranged memory cells, a plurality of connection lines 102 which are connected with the plurality of memory cells provided in the memory cell array 101 and arranged in parallel along a single direction, and an address decoder 104 for selecting the plurality of connection lines 102, while both of an X address decoder (first address decoder) and a Y address decoder (second address decoder) require read address decoders 113 and 114 and write address decoders 115 and 116, which are in structures similar to those of the sixth embodiment, respectively. A data output terminal Q of a rearmost (final) flip-flop FFn forming a shift register 106 of the read Y address decoder 114 is connected in series with a data input terminal D of a frontmost (first) flip-flop FF0 forming a shift register 106 of the read X address decoder 113. Similarly, a data output terminal Q of a rearmost (final) flip-flop FFn forming a shift register 106 of the write Y address decoder 116 is connected in series with a data input terminal D of a frontmost (first) flip-flop FF0 forming a shift register 106 of the write X address decoder 115. In each of the Y address decoders 114 and 116, the data output terminal Q of the rearmost (final) flip-flop FFn is connected in series with the data input terminal D of the frontmost (first) flip-flop FF0. When pulses are successively transmitted through the shift registers 106 provided in the Y address decoders 114 and 116, outputs from the rearmost flip-flops FFn forming the shift registers 106 are inputted in the frontmost flip-flops FF0 as well as the shift registers 106 of the corresponding X address decoders 113 and 115 simultaneously with clocks. The outputs of the rearmost flip-flops FFn forming the shift registers 106 of the respective X address decoders 113 and 115 are inputted in the frontmost flip-flops FF0 of the same shift registers 106.

These operations are identical with respect, to the read and write address decoders. Thus, it is possible to successively access all memory cells with read and write pulses respectively. The FIFO requires a full flag and an empty flag, which are generated through comparison of counters (read and write pointers) similarly to a conventional one. According to this embodiment, the connection lines (word lines and bit lines) 102 are selected at a high speed, whereby a high-speed FIFO can be implemented. Further, it is possible to simultaneously implement low power consumption and a low cost.

[Tenth Embodiment]

Figure 53:
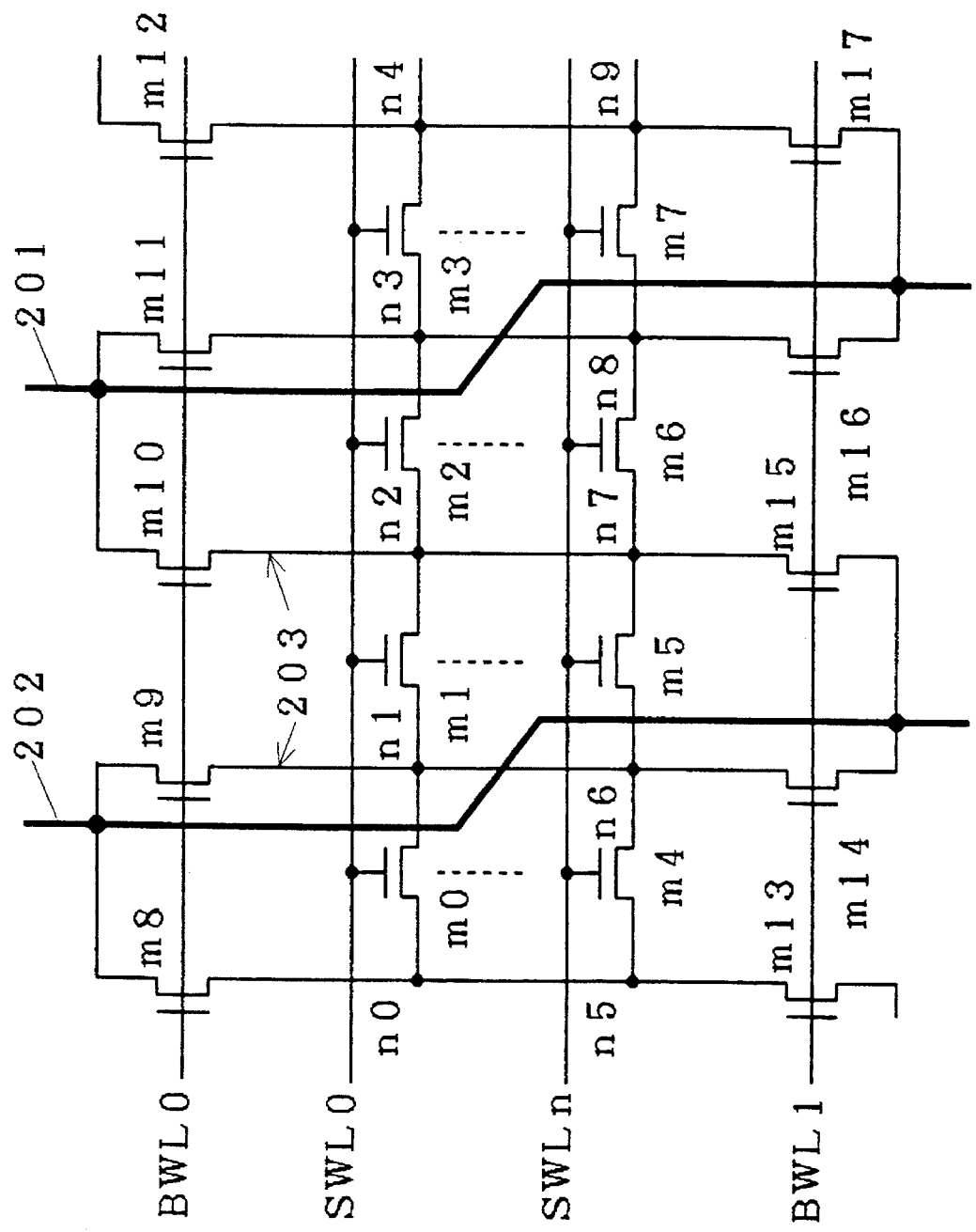
FIG. 53 is a circuit diagram showing the memory cell array according to the fourth prior art.

Consider that the memory cells of a multivalue ROM such as that according to any of the first to fifth embodiments are applied to a structure which is similar to that of the fourth prior art shown in FIG. 53, for example. First, a path of a current flowing from (1) the main bit line 201 through (2) the block selecting transistor m10, (3) the node n7, (4) the memory cell transistor m5, (5) the node n6 and (6) the block selecting transistor m9 in (7) the virtual GND line 202 can be implemented only when the memory cell transistors m4 and m6 are in OFF states. When the memory cell transistors m4 and m6 are in ON states, a path of a current successively flowing from (1) the main bit line 201 along the block selecting transistor m11, the node n8, the memory cell transistor m6 and the node n7, and a path of a current successively flowing from (5) the node n6 along the memory cell transistor m4, the node n5, the block selecting transistor m8 and the virtual GND line 202 are added as current paths.

Comparing the memory cell transistors m1 and m5 shown in FIG. 53 with each other, the local bit line 203 between the main bit line 201 and the memory cell transistor m1 is short and hence the memory cell transistor m1 has a low resistance value of about several 100 Ω, while the local bit line 203 between the main bit line 201 and the memory cell transistor m5 is at the maximum length and hence the memory cell transistor m5 has a high resistance value of about several KΩ to several 10 KΩ.

If the current paths are complicated or the lengths of the local bit lines 203 are extremely varied with the positions of the selected memory cell transistors, virtual ON-state current values are extremely changed when the memory cells are multivalued as in the first to fourth embodiments, for example, leading to malfunctions.

Figure 54:
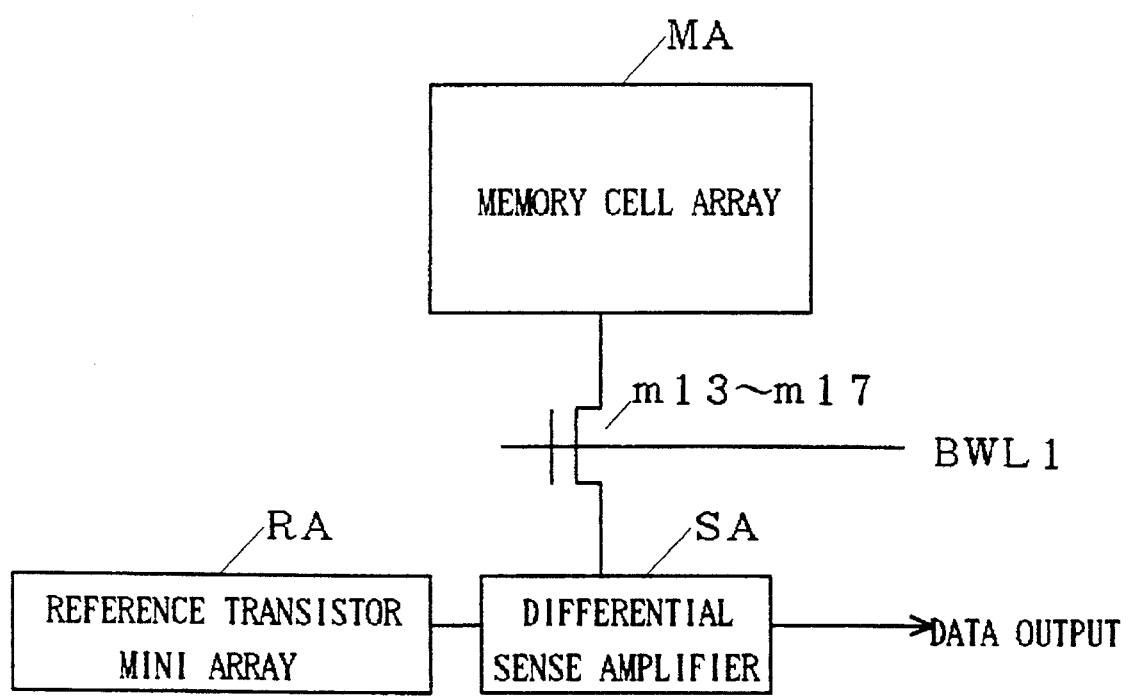
FIG. 54 is a circuit block diagram schematically showing a semiconductor memory device according to the fourth prior art.

When the reference circuit for setting reference values for deciding the types of the memory cells is formed by a mini array independently of the memory cell array as shown in FIG. 54, on the other hand, the ON-state current values of the memory cells and those of the reference transistors are disadvantageously dispersed due to process dispersion to cause malfunctions, while the resistance values of the local bit lines 203 are extremely varied with the positions of the selected memory cell transistors as hereinabove described, to cause remarkable virtual difference between the ON-state current values. It is impossible to absorb such difference by the structure shown in FIG. 54.

Figure 49:
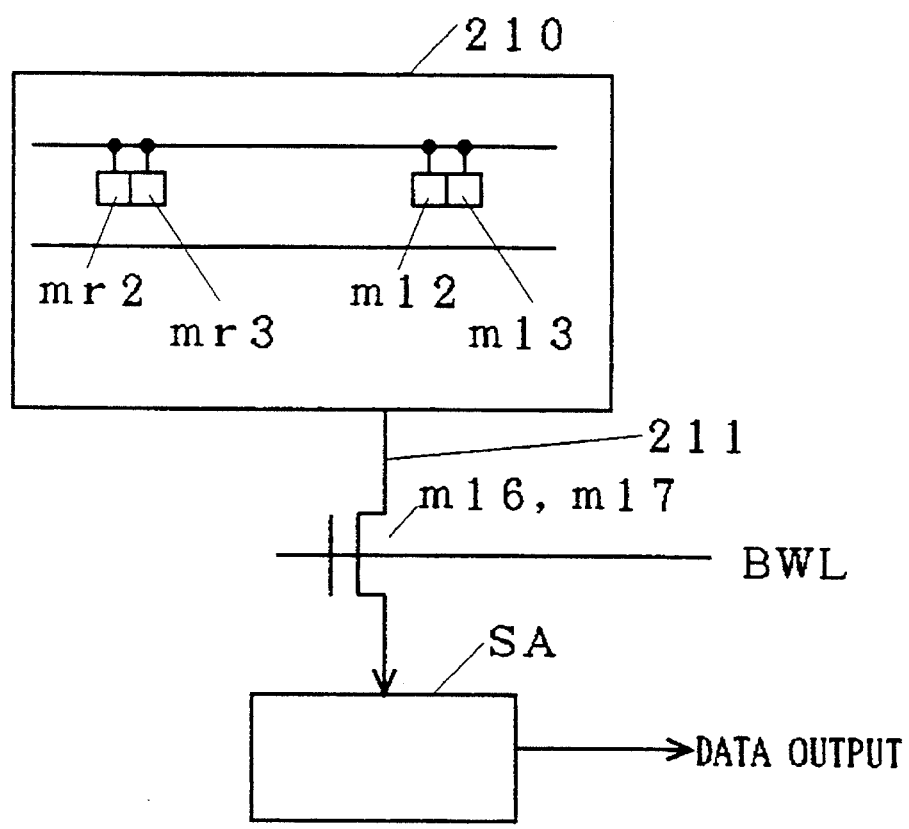
FIG. 49 is a circuit block diagram schematically showing a semiconductor memory device according to a tenth embodiment of the present invention.

According to a tenth embodiment of the present invention, a plurality of reference transistors mr2 and mr3 (reference elements) are incorporated in a memory cell transistor array 210 to attain conditions substantially identical to those of respective memory cell transistors m12 and m13, thereby absorbing the aforementioned dispersion of ON-state current values. Referring to FIG. 49, symbols m16 and m17 denote block selecting transistors, symbols m12 and m13 denote memory cell transistors, numeral 211 denotes a main bit line, and symbol SA denotes a differential sense amplifier which serves as a comparison circuit for comparing current values of the memory cell transistors m12 and m13 and the reference transistors mr2 and mr3 with each other.

Figure 50:
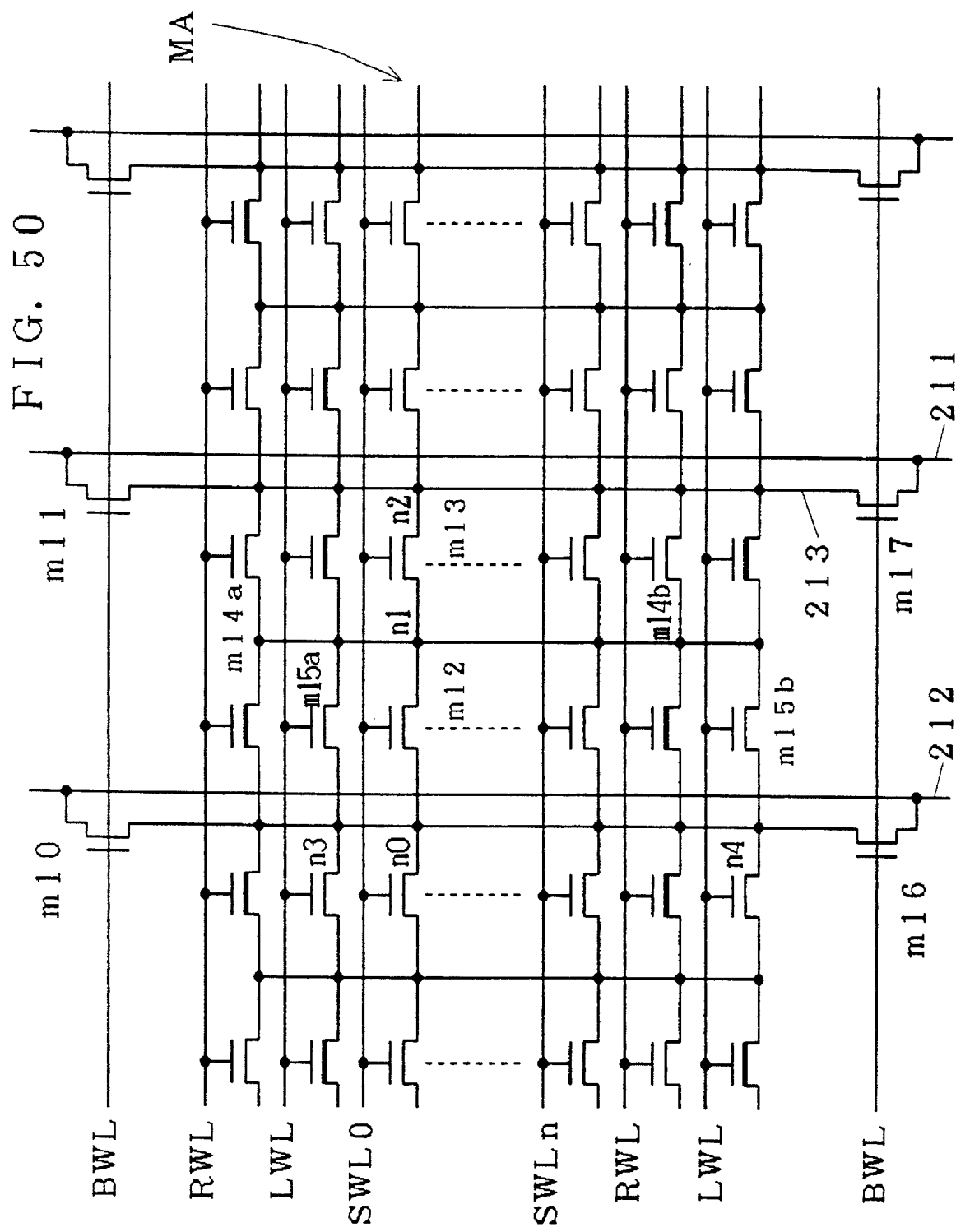
FIG. 50 is a circuit diagram showing a memory cell array of the semiconductor memory device according to the tenth embodiment of the present invention.

FIG. 50 is a block circuit diagram of the memory cell array 210 according to this embodiment. A semiconductor memory device according to this embodiment is a tertiary ROM including three types of memory cell transistors in the memory cell array 210, similarly to the fifth embodiment shown in FIG. 30. Referring to FIG. 50, symbol BWL denotes block selecting word lines, symbols m10, m11, m16 and m17 denote block selecting transistors, symbols n0, n1 and n2 denote nodes which are connected to sources/drains of the memory cell transistors m12 and m13, symbols SWL0 to SWLn denote memory cell transistor selecting switching word lines which are gate-inputted in the memory cell transistors m12 and m13, symbols m14a, m14b and m15 denote transistors for deciding which one of the memory cell transistors m12 and m13 is selected, symbols n3 and n4 denote nodes which are connected to a source/drain of the transistor m15, symbols RWL and LWL denote word lines which are gate-inputted in the transistors m14a, m14b and m15, numeral 211 denotes a main bit line of aluminum or the like, numeral 212 denotes a virtual GND line of aluminum or the like, and numeral 213 denotes local bit lines. Referring to FIG. 50, further, transistors having gates shown by thick lines are in OFF states, while those having gates shown by thin lines are in ON states.

Figure 51:
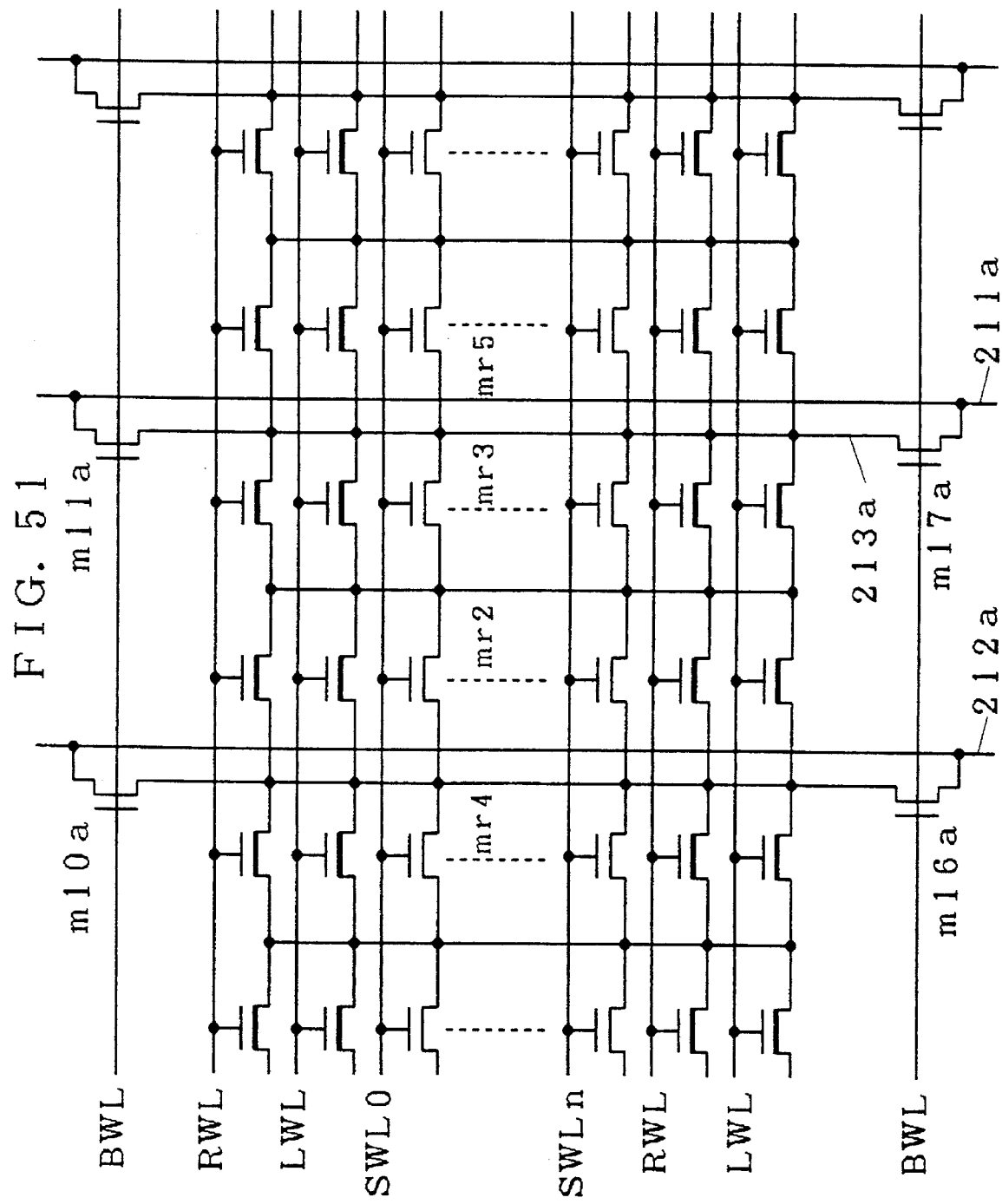
FIG. 51 is a circuit diagram showing a portion close to reference elements in the semiconductor memory device according to the tenth embodiment of the present invention.

As hereinabove described, the memory cell transistors m12 and m13 include three types of memory cell transistors. Therefore, reference circuits shown in FIG. 51 are required as reference transistors for reference values for deciding the types of the memory cell transistors m12 and m13. As shown in FIG. 51, the reference transistors mr2 and mr3 are arranged for every one of memory cell transistor selecting switching word lines SWL0 to SWLn in the memory cell array 210. FIG. 51 illustrates a region which is arranged on a side of a memory array MA shown in FIG. 50, and respective word lines BWL, RWL, LWL and SWL0 to SWLn shown in FIGS. 51 and 50 are identical to each other. Referring to FIG. 51, transistors having gates shown by thick lines are in OFF states, while those having gates shown by thin lines are in ON states. While transistors mr4 and mr5 which are adjacent to the reference transistors mr2 and mr3 respectively are illustrated as ON-state transistors in FIG. 51, these transistors are generally brought into OFF states to prevent flowing of currents from transverse portions. Referring to FIG. 51, symbols m10a, m11a, m16a and m17a denote reference selecting transistors for selecting the reference transistors mr2 and mr3, numeral 211a denotes a main bit line of aluminum or the line, numeral 212a denotes a virtual GND line of aluminum or the like, and numeral 213a denotes local bit lines. All transistors which are gate-connected to the word lines RWL and LWL are in OFF states. Thus, a single reference current path is provided for each of the reference transistors mr2 and mr3, to be smaller in number than two memory cell current paths for each of the memory cell transistors m12 and m13, as described later. In reference, the main bit line 211a forms reference input for the differential sense amplifier SA. While this embodiment requires binary reference values for distinguishing three values from each other since the same is directed to a tertiary ROM, a general multivalue ROM requires reference transistors in a number corresponding to that of types of memory cell transistors excluding an "OFF" transistor. For example, a quaternary ROM requires three reference transistors, while a quinary ROM requires four reference transistors. Therefore, such a number of reference transistors may be replaced by respective types of reference transistors in place of employing the same as those for data storage. In more concrete terms, the transistors mr2 and mr3 shown in FIG. 51 may form two types of reference circuits of "0" and "1" transistors in a case of a ROM which can take three values (0, 1, OFF). Similarly, three types of reference circuits are formed in a quaternary ROM.

The operation of the semiconductor memory device having the aforementioned structure is now described with reference to a case of selecting the memory cell transistor m13 shown in FIG. 50, for example. In operation of this embodiment, the value of the memory cell transistor m13 is loaded by the differential sense amplifier SA shown in FIG. 49, and then the values of the reference transistors mr2 and mr3 which are connected to the same word lines SWL0 to SWLn as the memory cell transistor m13 are loaded. Alternatively, the values of the reference transistors mr2 and mr3 may be loaded in advance so that the value of the memory cell transistor m13 is thereafter loaded. In either case, the word lines BWL, RWL, LWL and SWL0 and the remaining word lines SWL for the memory cell transistor m13 are set at high, low, high, high and low levels respectively. Consider current paths between the main bit line 211 and the virtual GND line 212 in this case. First, two paths are formed between the main bit line 211 and the memory cell transistor m13 along the block selecting transistor m11 →the node n2 and along the block selecting transistor m17→the node n2, while two paths are formed between the memory cell transistor m13 and the virtual GND line 212 along the node n1→the memory cell transistor m15a→the node n3→the block selecting transistor m10 and along the node n1→the memory cell transistor m15b→the node n4→the block selecting transistor m16.

Considering influence by the local bit lines 213, the maximum resistance of the current path is about 2R in the prior art shown in FIG. 53 assuming that R represents the resistance value per local bit line 213, while the maximum resistance is about 1/2 R in the embodiment shown in FIG. 50 due to formation of two paths, whereby influence by the resistance value of the local bit line 213 is 1/4 as compared with the prior art. Thus, it is possible to suppress the range of a virtual ON-state current value by the position of the selected memory cell transistor.

Considering such cases that the transistor m12 is in an ON state and in an OFF state while neglecting resistance values of the local bit lines 213 and the lower half from the word line SWLn in FIG. 50, the resistance value between the main bit line 211 and the virtual GND line 212 is 4R when the transistor m12 is in an OFF state and 7/2 R when the transistor m12 is in an ON state assuming that R represents the resistance of a single transistor, whereby the ratio is 1:1.14. Similarly, the resistance value is 3 R when both of the transistors m10 and m12 are in OFF states and 7/3 R when the transistors m10 and m12 are in ON states in FIG. 53, and hence the ratio is 1:1.29. Thus, the present invention is improved also in relation to influence by peripheral memory cell transistors.

According to this embodiment, the reference transistors mr2 and mr3 are arranged in the interior of the memory cell array 210, as shown in FIG. 51. Therefore, when the transistor m13 is selected in FIG. 50, for example, transistors (mr2 and mr3 in FIG. 51) having gates on the same word line SWL0 are selected as reference. When the transistor m13 in FIG. 50 is read with respect to a single path of mr3→mr2, multiple (three) paths are formed as m13→m15a/m13→m15b/m13→m12, whereby it is guaranteed that the reference transistors mr2 and mr3 necessarily have lower ON-state current values. This also applies to a multivalue case. Thus, even if difference in length is caused between current paths (local bit lines 213) toward transistors between a memory cell transistor which is connected to a certain word line and that connected to another word line to cause difference between resistance values of the current paths, i.e., values of currents flowing in the memory cells, it is possible to guarantee that the reference transistor necessarily has a lower ON-state current value by employing absolutely identical ones for a sense circuit part to which a bit line for data reading is connected and a circuit to which a reference bit line is connected so far as the transistor for reading is identical to the reference transistor, since the reference transistor is connected to the same word line as each memory cell. Further, the number of memory cell current paths per memory cell is larger than that of the reference current paths per reference element, whereby it is possible to suppress a voltage drop toward each memory cell transistor below that toward the reference transistor. Thus, it is possible to maintain the terminal potential of each memory cell transistor as high as possible and to reduce a leakage current from another current path such as an adjacent memory cell transistor, thereby maintaining electrical properties in high accuracy. Therefore, it is possible to prevent errors in the threshold voltages of the memory cell transistors m12 and m13 with respect to the reference values of the reference transistors mr2 and mr3. Thus, it is possible to commercialize a multivalue ROM having accurate electrical properties. Consequently, it is possible to reduce the chip area to about 25 to 30% in a tertiary ROM or to about 40% in a quaternary ROM, as compared with a conventional ROM through a fine process which is substantially identical to that of the prior art.

Figure 52:
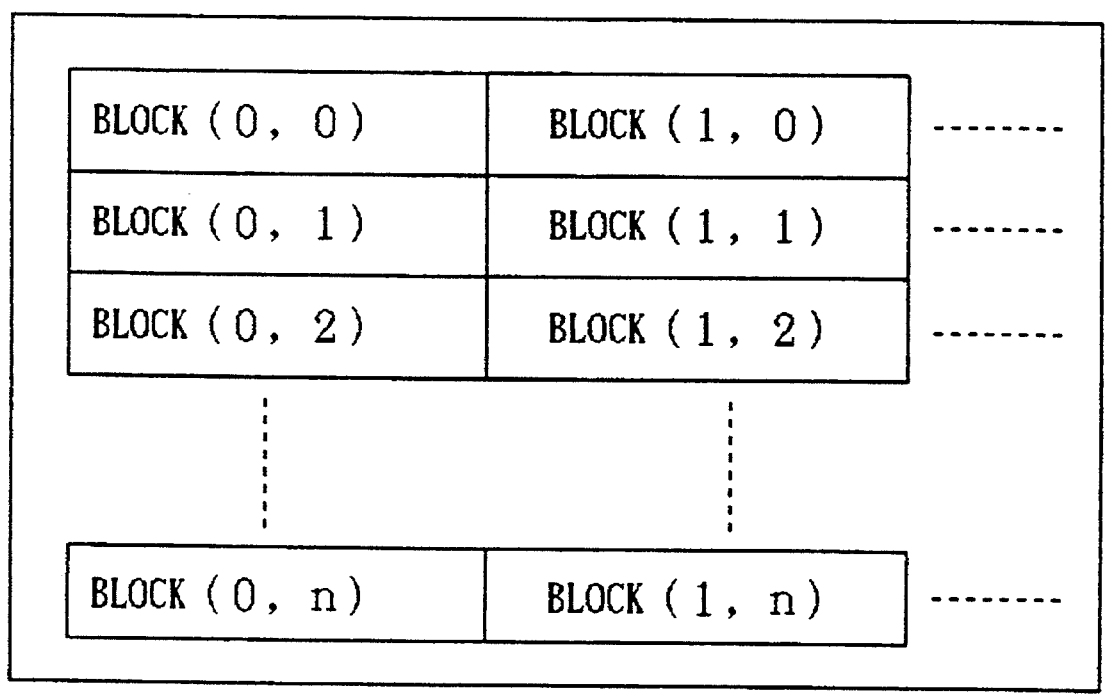
FIG. 52 schematically illustrates a memory cell array according to fourth prior art.

Now, the semiconductor memory device of the present preferred embodiment and the conventional semiconductor memory device of the fourth prior art will be compared. In semiconductor memory device of the fourth prior art shown in FIG. 53, to read the data of the memory cell m5, the path from the main bit line 201 to the virtual GND line 202 is the only one path m10→n7→m5→n6→m9 when the transistors m6 and m4 are in an OFF state. Hence, assuming that the local bit line 203 from the block selecting transistor m10 to the memory cell transistor m5 has a resistance R, a resistance of at the maximum 2R is applied to this path. Since the device cannot operate at a high speed due to this resistance, in general, the memory cell arrays are divided into blocks as shown in FIG. 52 to avoid this. In the case of the fourth prior art, the memory cell arrays must be divided into a number of vertical blocks in order to attain a high-speed operation. However, division into a great number of vertical blocks increases the area which the transistors m8 to m12 and m13 to m17 occupy in the memory cell array area, which in turn increases the chip size.

On the other hand, in the preferred embodiment of FIG. 50, to read the data of the memory cell transistor m13, two paths m1→n2 and m17→n2 are available as a path from the main bit line 211 to the transistor m13. As to a path from the transistor m13 to the virtual GND line 212, two paths n1→m15a→n3→m10 and n1→m15b→n4→m16 are available even if the transistor m12 is in an OFF state. Here, assuming that the local bit line 203 has a resistance R as in the prior art case, a resistance applied to the paths is at most only R/2. Hence, the device can operate as fast as the prior art device even if the number of divided blocks is reduced to ¼. In this preferred embodiment, although an area the transistors except for the memory cell transistors occupy in each block is about three times larger than in the fourth prior art, a total area those transistors occupy in the whole memory cell array area is smaller than in the fourth prior art. This reduces the chip size, and therefore, makes it possible to manufacture large capacity storage ROMs at a reduced manufacturing cost with a high yield.

[Eleventh Embodiment]

Figure 55:
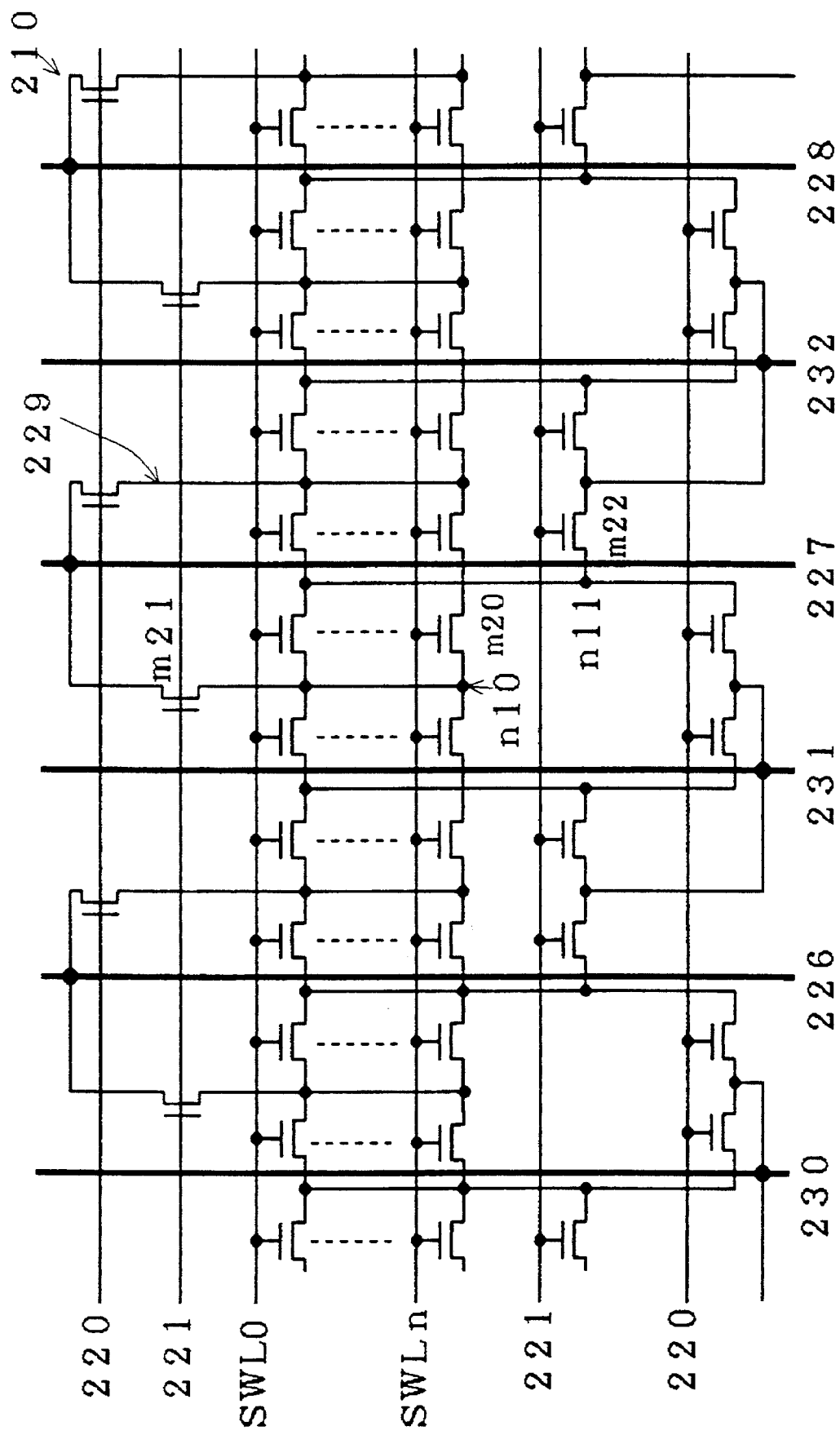
FIG. 55 is a circuit diagram showing a memory cell array of a semiconductor memory device according to an eleventh embodiment of the present invention.
Figure 56:
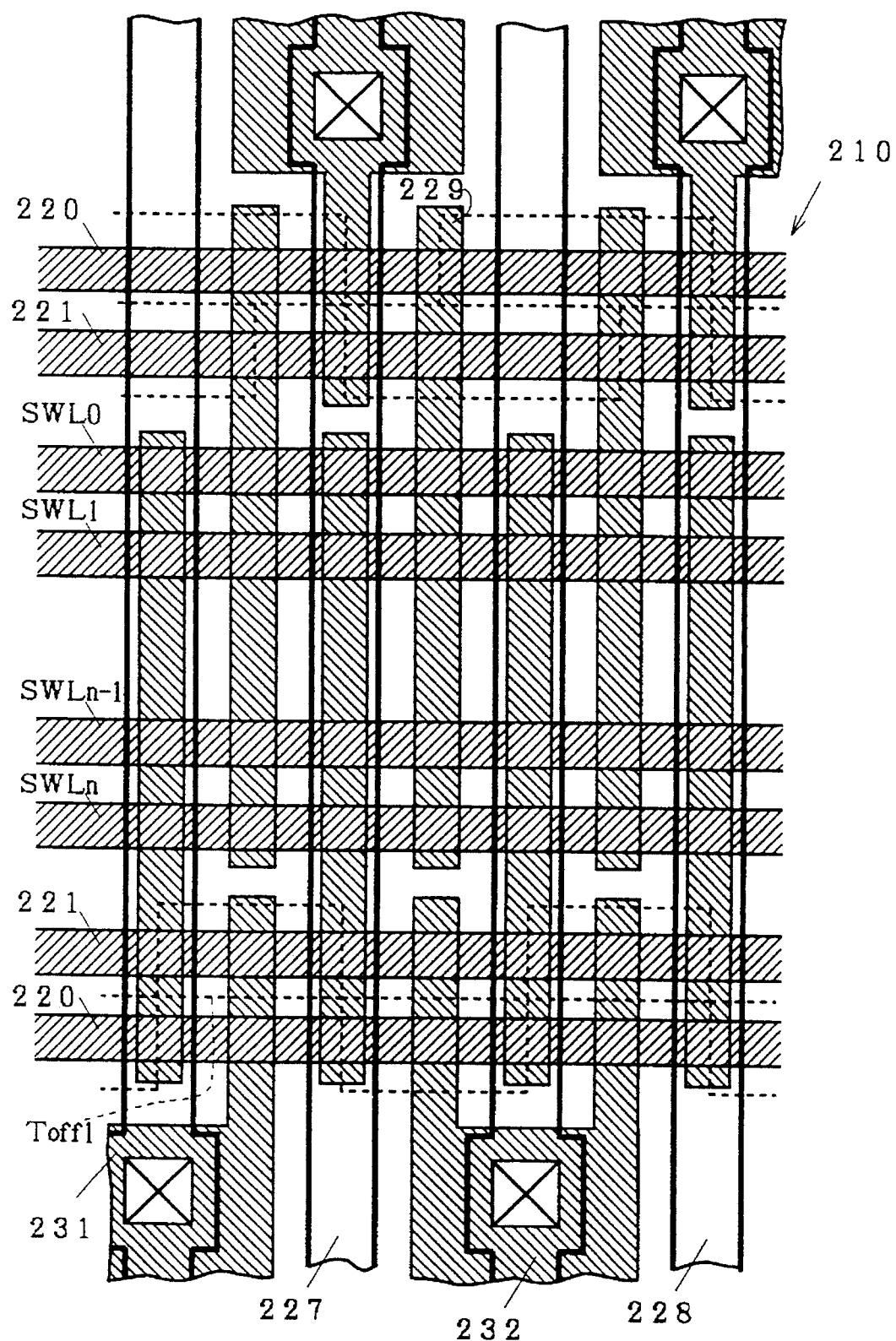
FIG. 56 is a layout block diagram showing the wiring configuration of the semiconductor memory device according to the eleventh embodiment of the present invention.
Figure 57:
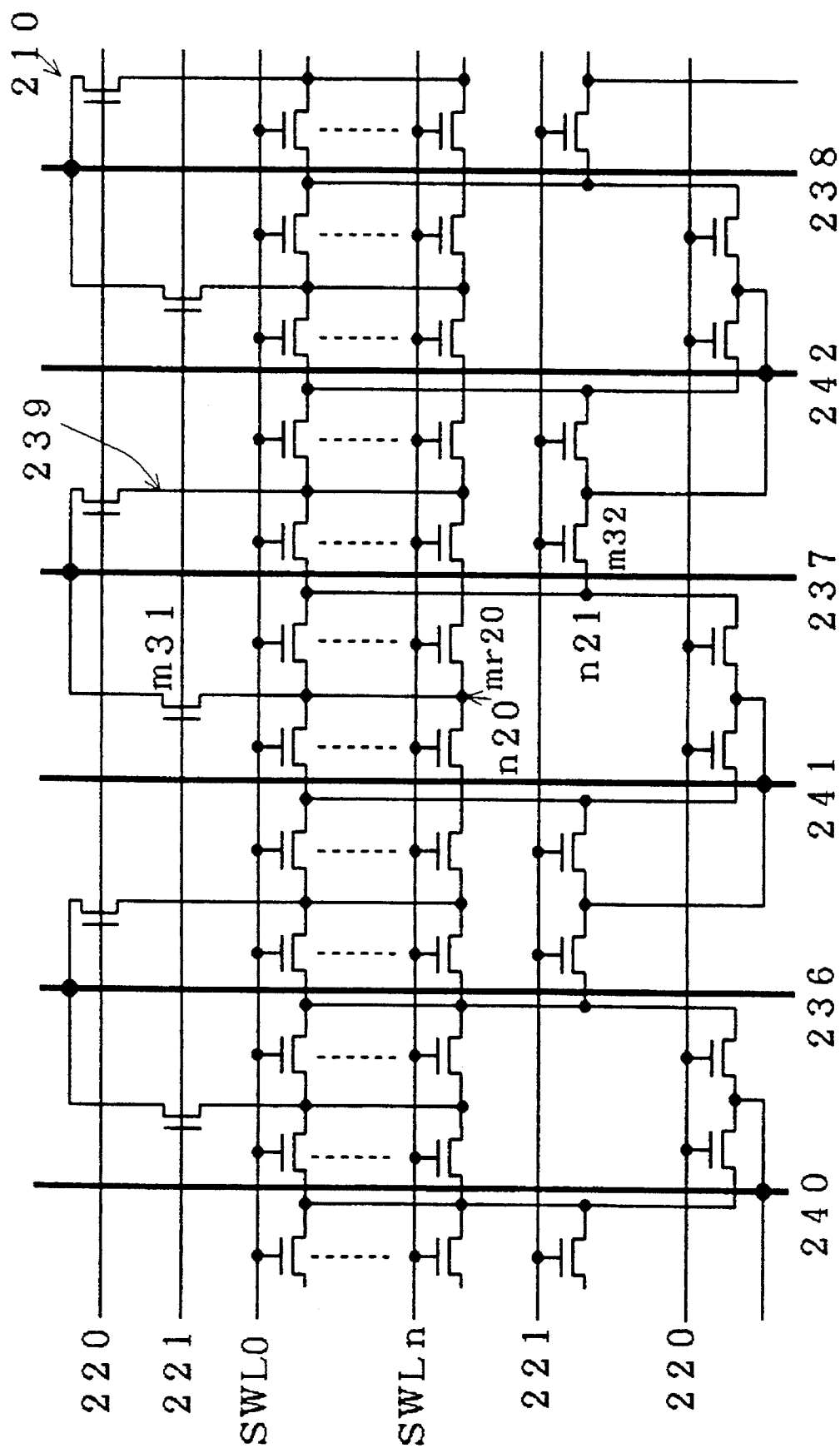
FIG. 57 is a circuit diagram showing a portion close to reference elements in the semiconductor memory device according to the eleventh embodiment of the present invention.
Figure 58:
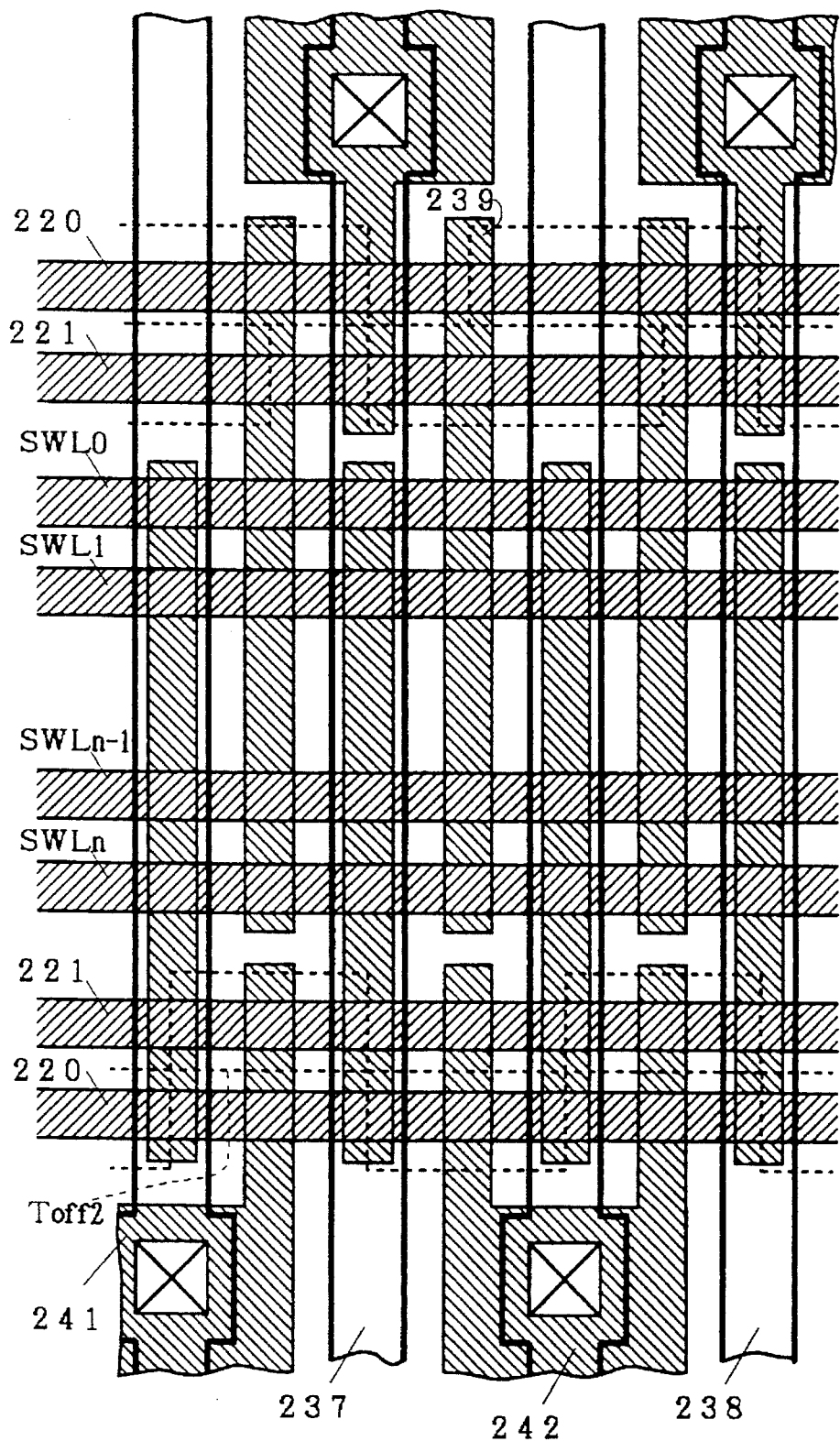
FIG. 58 is a layout block diagram showing the wiring configuration in the vicinity of the reference elements in the semiconductor memory device according to the eleventh embodiment of the present invention.

FIGS. 55 and 56 show a memory cell array according to an eleventh embodiment of the present invention. Referring to FIGS. 55 and 56, numeral 220 denotes a first block selecting word line, numeral 221 denotes a second block selecting word line, symbols SWL0 to SWLn denote section selecting word lines, numeral 226 denotes a first memory cell main bit line, numeral 227 denotes a second memory cell main bit line, numeral 228 denotes a third memory cell bit line, numeral 230 denotes a first memory cell virtual GND line, numeral 231 denotes a second memory cell virtual GND line, numeral 232 denotes a third memory cell virtual GND line, numeral 229 denotes a memory cell local bit line, symbol m20 denotes a memory cell, symbols m21 and m22 denote block selecting transistors in which the first block selecting word line 221 is gate-inputted, and symbol Toff1 denotes an OFF-state transistor. On the other hand, FIGS. 57 and 58 illustrate reference circuits according to this embodiment. Referring to these figures, symbol mr20 denotes a reference transistor, symbols m31 and m32 denote block selecting transistors in which the first block selecting word line 221 is gate-inputted similarly to the transistors m21 and m22 shown in FIG. 55, numeral 236 denotes a first reference main bit line, numeral 237 denotes a second reference main bit line, numeral 238 denotes a third reference main bit line, numeral 239 denotes a reference local bit line, numeral 240 denotes a first reference virtual GND line, numeral 241 denotes a second reference virtual GND line, numeral 242 denotes a third reference virtual GND line, and symbol Toff2 denotes an OFF-state transistor.

Referring to FIGS. 55 to 58, memory cell current paths are formed for supplying a current from the memory cell main bit line 227 to the memory cell m20 through the local bit line 229 and for supplying a current from the reference main bit line 237 to the reference transistor mr20 through the local bit line 239 respectively. A single memory cell current path and a single reference current path of the same shape are connected to a single memory cell m20 and a single reference transistor mr20 respectively. The same numbers of block selecting transistors are connected to the respective memory cell current paths and the respective reference current paths. While single current paths are provided for each memory cell m20 and each reference transistor mr20 according to this embodiment, plural current paths may alternatively be provided for each memory cell m20 and each reference transistor mr20 when the shapes and numbers of the current paths are equal to each other and the numbers of the block selecting transistors m21, m22, m31 and m32 for the respective current paths are set at the same numbers with each other.

<Employing Method>

Considering data reading from the memory cell m20 shown in FIG. 55 in the aforementioned structure, the second memory cell main bit line 227 is connected to a sense circuit, and the second memory cell virtual GND line 232 is connected to the ground. Further, the block selecting word line 221 is brought into a high level, an n-th section word line SWLn is brought into a high level, and the remaining word lines 220 and SWL0 . . . are brought into low levels. At this time, a current path between the second memory cell main bit line 227 and the second memory cell virtual GND line 232 is limited to a single path along the main bit line 227→m21→n10→m20→n11→m22→the second memory cell virtual GND line 232.

Considering reference data reading from the reference transistor mr20 shown in FIG. 57, on the other hand, the second reference main bit line 237 is connected to the sense circuit, and the second reference virtual GND line 242 is connected to the ground. The block selecting word line 221 is brought into a high level, the n-th section word line SWLn is brought into a high level, and the remaining word lines 220 and SWL0 . . . are brought into low levels. At this time, a current path between the second reference main bit line 237 and the second reference virtual GND line 242 is limited to a single path along the main bit line 237→m31→n20→mr20→n21→m32→the second reference virtual GND line 242.

Thus, the current paths toward the memory cell m20 and the reference transistor mr20 are identical in number and shape to each other and the numbers of the block selecting transistors forming the paths are also identical to each other, whereby resistance values developed in the memory cell current path and the reference current path are substantially completely equal to each other. Thus, it is possible to remarkably improve accuracy in comparison of these current values.

When the second memory cell main bit line 227 and the second reference main bit line 237 are connected to the sense circuit and the second memory cell virtual GND line 232 and the second reference virtual GND line 242 are connected to the ground, for example, the remaining main bit lines 226 228, 236 and 238 may be precharged. When the block selecting word line 221 and the n-th section word line SWLn are brought into high levels in this case, for example, all transistors which are gate-inputted from the block selecting word line 221 and the n-th section word line SWLn are turned on and currents by precharging may flow into the nodes n10 and n20 through such transistors. Also in paths of these leakage currents, however, those toward the memory cell m20 and the reference transistor mr20 are identical in number and shape to each other and the numbers of the block selecting transistors forming the paths are also identical to each other, whereby resistance values developed in the memory cell and reference current paths are substantially completely equal to each other. Thus, it is possible to remarkably improve accuracy for reference also in consideration of the total of currents from the sense circuit and those by precharging.

Figure 59:
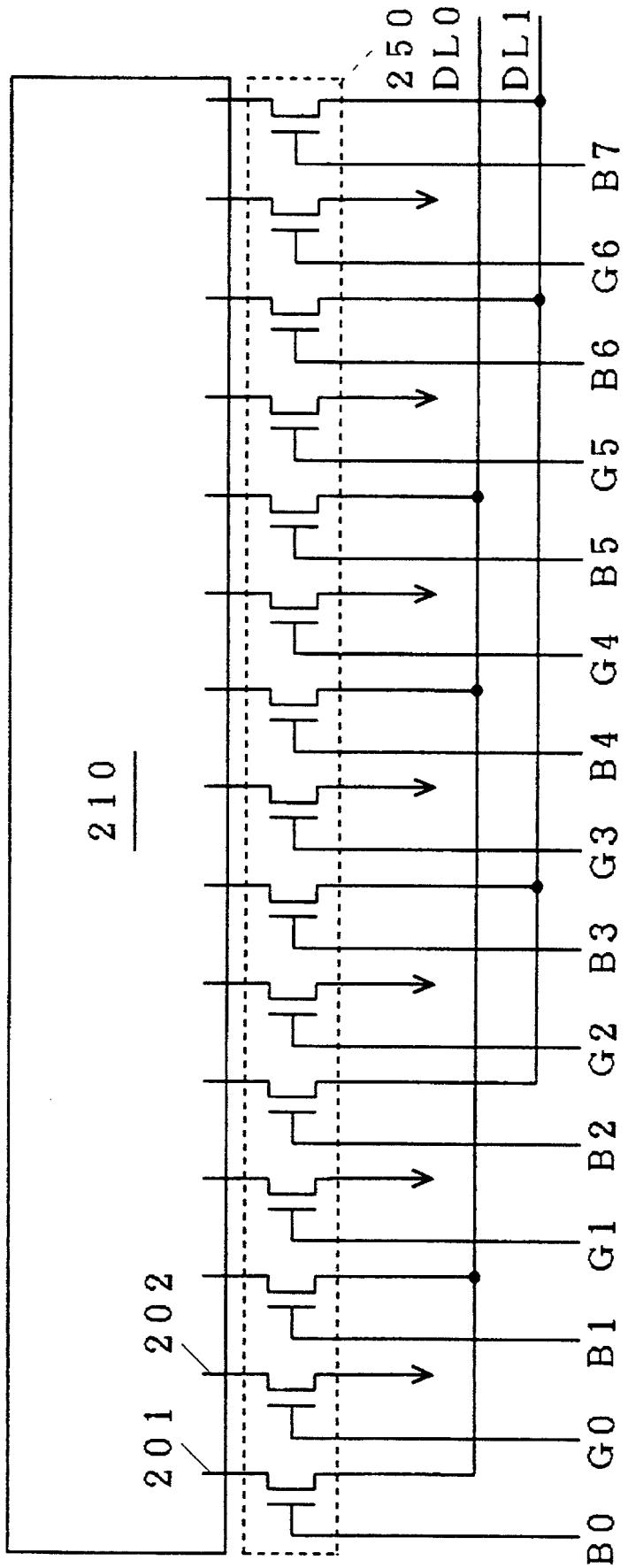
FIG. 59 is a view showing a selecting circuit for selecting a main bit line and an virtual GND line of the fourth prior art semiconductor memory device.

Now, the present preferred embodiment and the fourth prior art will be compared with each other. In actually selecting a main bit line and an virtually GND line and connecting the main bit line to a sense circuit and the virtual GND line to the GND in the semiconductor memory device of the fourth prior art shown in FIG. 53, the main bit line 201 is connected to the sense circuit and the virtual GND line 202 is connected to the GND, for instance. Here, in order to prevent a current flow into the virtual GND line 202 from the left-hand side of the drawing (not shown), an virtual GND line to the left-hand side of the virtual GND line 202 (not shown), and hence, a local bit line which is connected to this virtual GND line are customarily connected to the GND. That is, in general, adjacent virtual GND lines and a local bit line which is connected to the virtual GND lines through a block selecting transistor are connected to the GND to thereby read data. For this reason, a main bit line/virtual GND line selecting circuit 250 of the fourth prior art is typically constructed as shown in FIG. 59. In FIG. 59, a symbol DL0 denotes a data line which is connected to one of the sense circuits of the selecting circuit 250, a symbol DL1 denotes a data line which is connected to other one of the sense circuits of the selecting circuit 250, symbols B0 to B6 denote gate electrodes of selecting transistors for selecting a main bit line, and symbols G0 to G7 denote gate electrodes of selecting transistors for selecting an virtual GND line. FIG. 60 shows the levels of input signals which are supplied to the gate electrodes B0 to B6 and G0 to G7 of FIG. 59 (i.e., H or L). In FIGS. 59 and 60, indicated at S0 to S7 are the numbers of blocks which are to operate.

Figure 61:
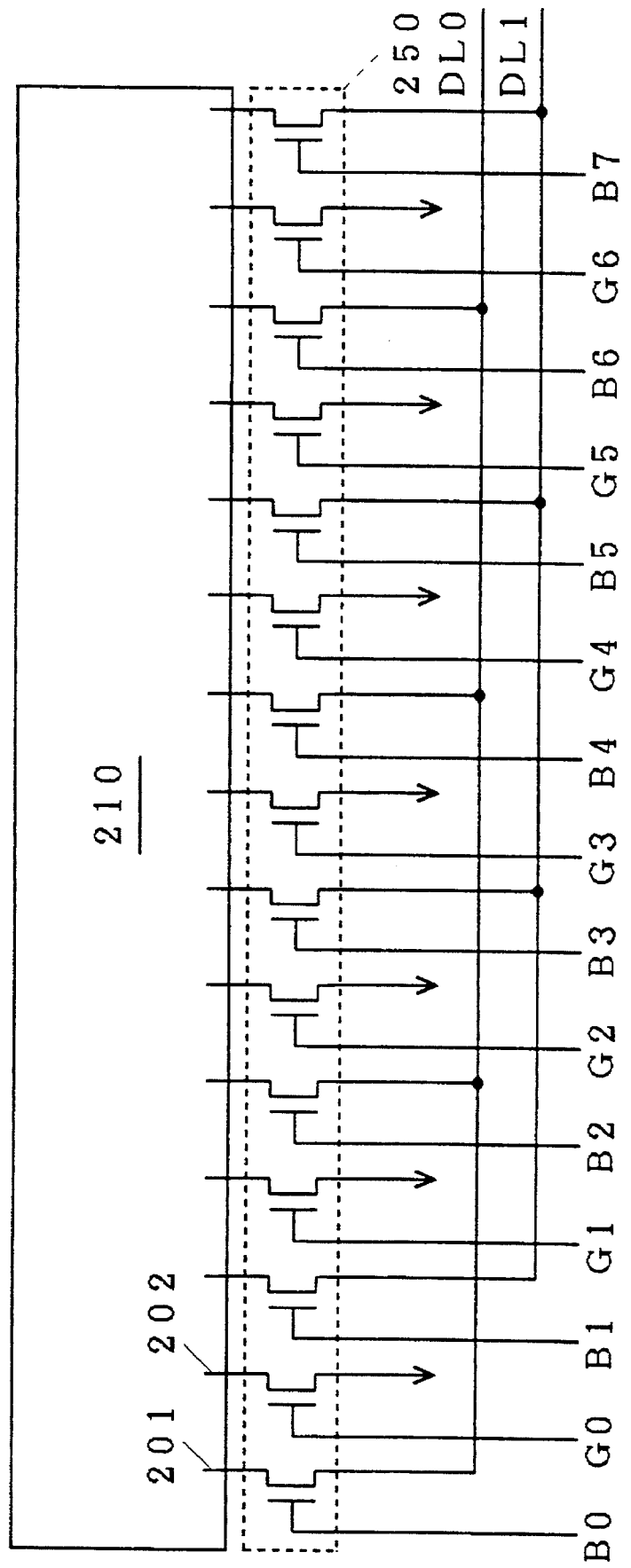
FIG. 61 is a view showing a selecting circuit for selecting a main bit line and an virtual GND line of the semiconductor memory device of the eleventh embodiment of the present invention.

On the other hand, since the memory cell array structure of the preferred embodiment of FIG. 55 requires two local bit lines to be connected to one virtual GND line through a block selecting transistor, there is no need to select two virtual GND lines as in the fourth prior art. Hence, a main bit line/virtual GND line selecting circuit 250 of the preferred embodiment has a structure as that shown in FIG. 61. FIG. 62 shows the levels of input signals which are supplied to the gate electrodes B0 to B6 of the selecting transistors for selecting a main bit line and the gate electrodes G0 to G7 of the selecting transistors for selecting an virtual GND line. In FIGS. 61 and 62, indicated at S0 to S7 are the numbers of blocks which are to operate.

As can be understood by comparing FIG. 60 with FIG. 62, the fourth prior art demands to select two virtual GND lines and main bit lines on the both sides of the two virtual GND lines and to leave a main bit line between the two virtual GND lines and the other remaining main bit and virtual GND lines not selected. In contrast, the preferred embodiment only requires one virtual GND line and main bit lines on the both sides of the same to be selected and the other remaining main bit and virtual GND lines to be left not selected. Thus, since the main bit lines and the virtual GND lines are decoded in a simpler manner than in the fourth prior art of FIG. 60, only a reduced number of decode circuits are necessary. Hence, a reduction in the chip size, and therefore, high-yield less-expensive manufacturing of large capacity storage ROMs are possible.

In general, the main bit lines of the memory cell arrays are set in advance at a voltage level which is close to the sense level of the sense circuits so that the memory can operate at a high speed. In the fourth prior art, since the virtual GND lines to be connected to the GND are those lines on the both sides of one main bit line as described earlier, a current is initiated from the main bit line to these virtual GND lines through a block selecting transistor and a memory cell transistor in some cases. Hence, when the memory cell transistor from which data is to be read is in an ON state, a current flows into these two virtual GND lines from two main bit lines which are connected to the sense circuits and three main bit lines which are sandwiched by the virtual GND lines, via two local bit lines which are connected to the virtual GND lines through the block selecting transistor.

Unlike the fourth prior art, since there is no current path created which extends from main bit lines which are not connected to sense circuits in the preferred embodiment, when the memory cell transistor from which data is to be read is in an ON state, from two main bit lines which are connected to the sense circuits, a current flows into one virtual GND line through two local bit lines which are connected to the virtual GND line through a block selecting transistor. Thus, in the preferred embodiment, a less number of current paths are created which extend from the main bit line to the virtual GND line than in the fourth prior art, the virtual GND line reaches the GND potential in a shorter period of time than in the prior art, thereby attaining a high-speed operation.

Although only one virtual GND line is connected to the GND while two virtual GND lines are connected to the GND in the prior art, since the virtual GND lines are typically made of a material which has a sufficiently low resistance, e.g., aluminum, there is no influence on the operation time as far as the same number of the local bit lines are connected to the virtual GND line.

[Modifications]

Figure 39:
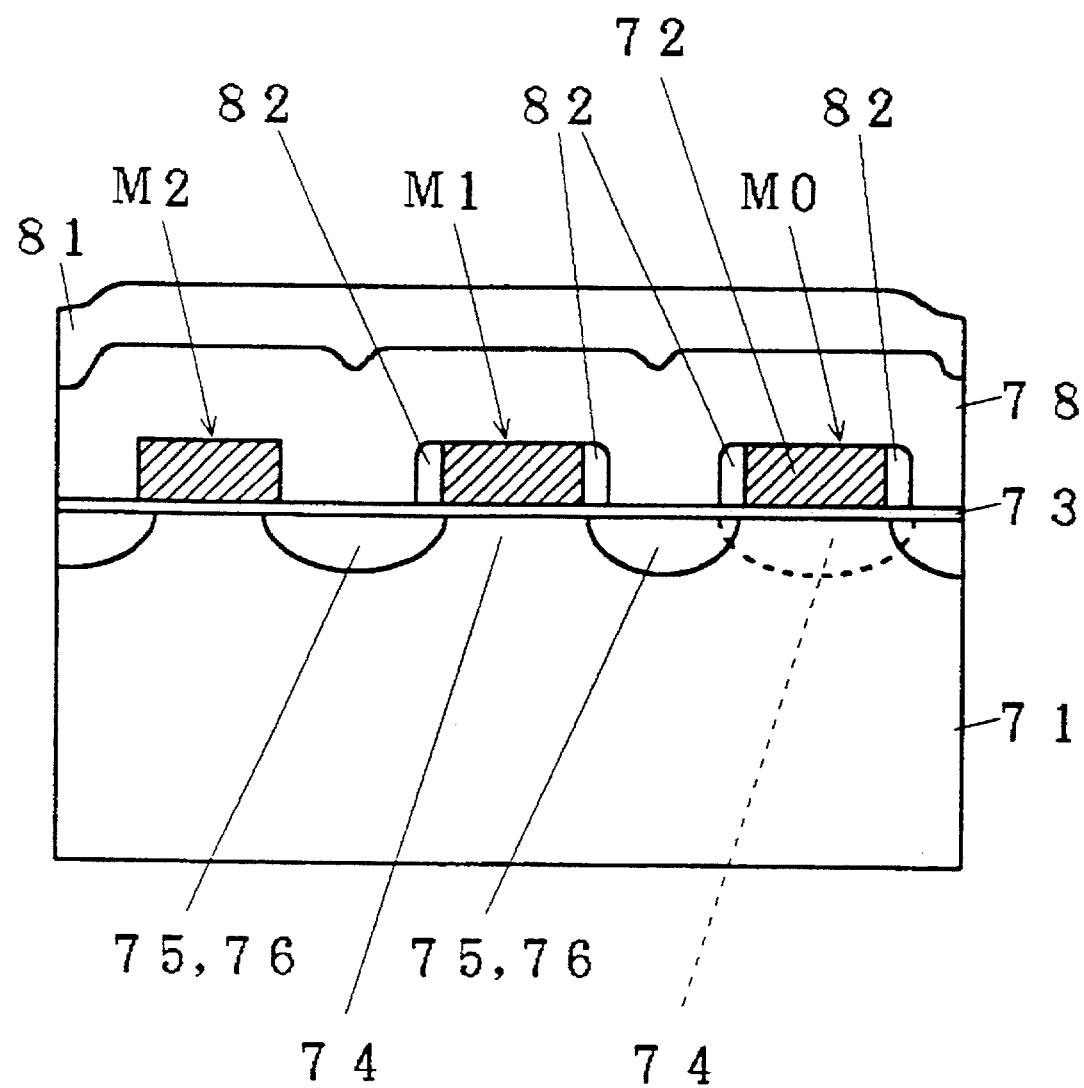
FIG. 39 is a sectional view showing a semiconductor memory device according to a modification of the present invention.
Figure 40:
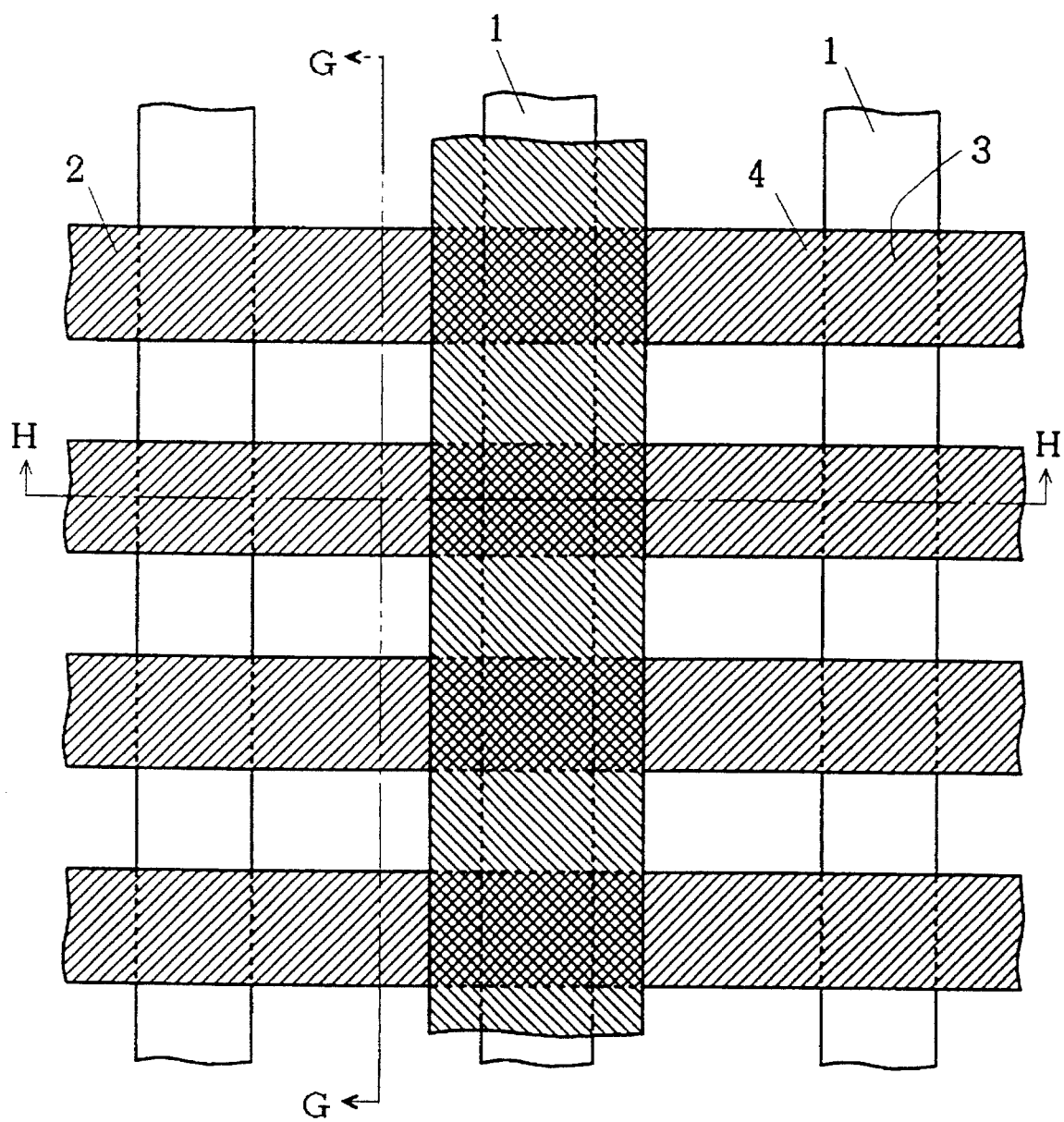
FIG. 40 is a plan view showing a semiconductor memory device according to first prior art.
Figure 41:
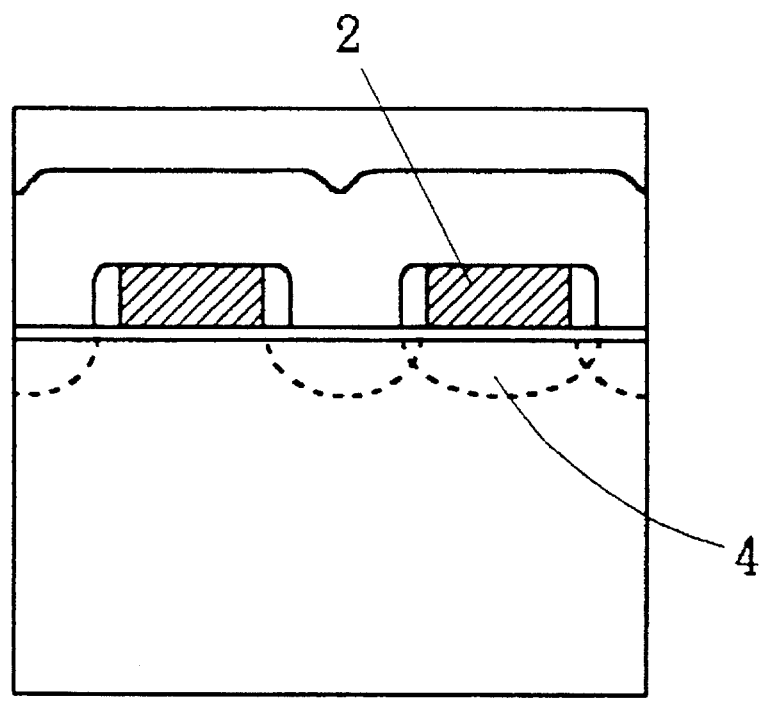
FIG. 41 is a sectional view taken along the line G—G in FIG. 40.
Figure 42:
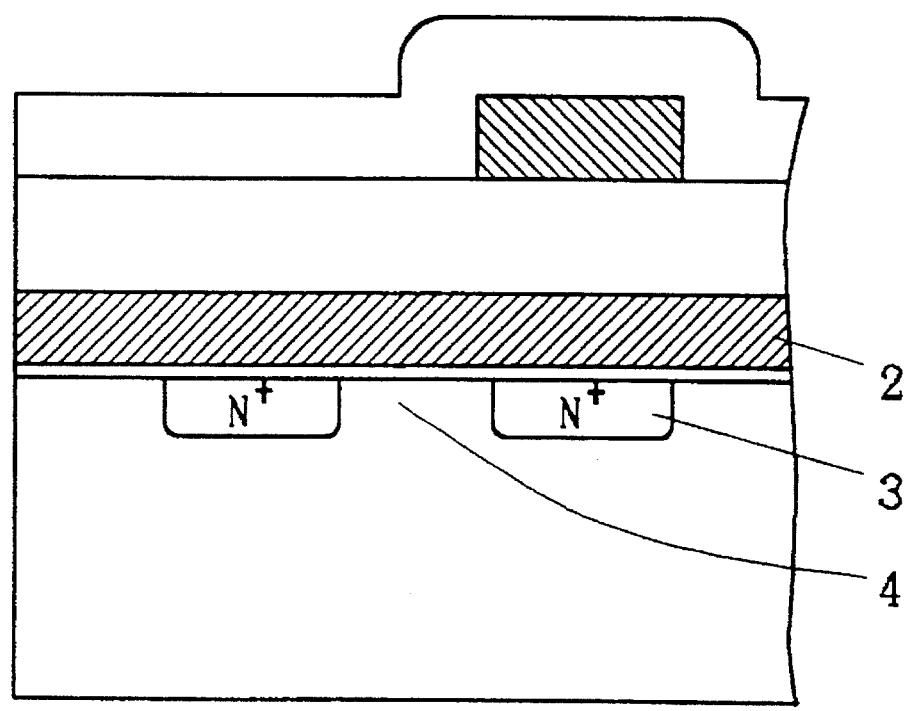
FIG. 42 is a sectional view taken along the line H—H in FIG. 40.
Figure 43:
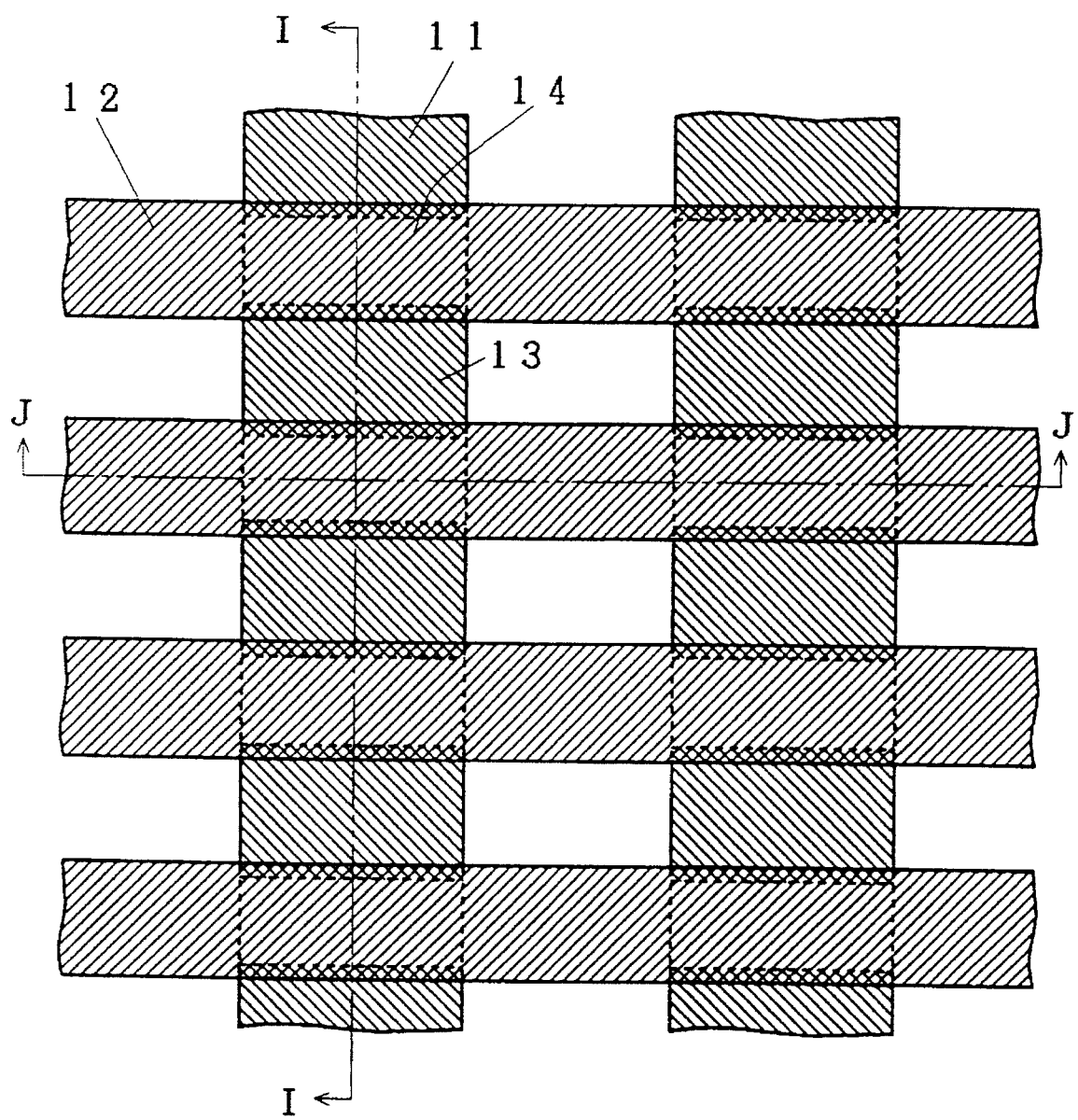
FIG. 43 is a plan view showing a semiconductor device according to second prior art.
Figure 44:
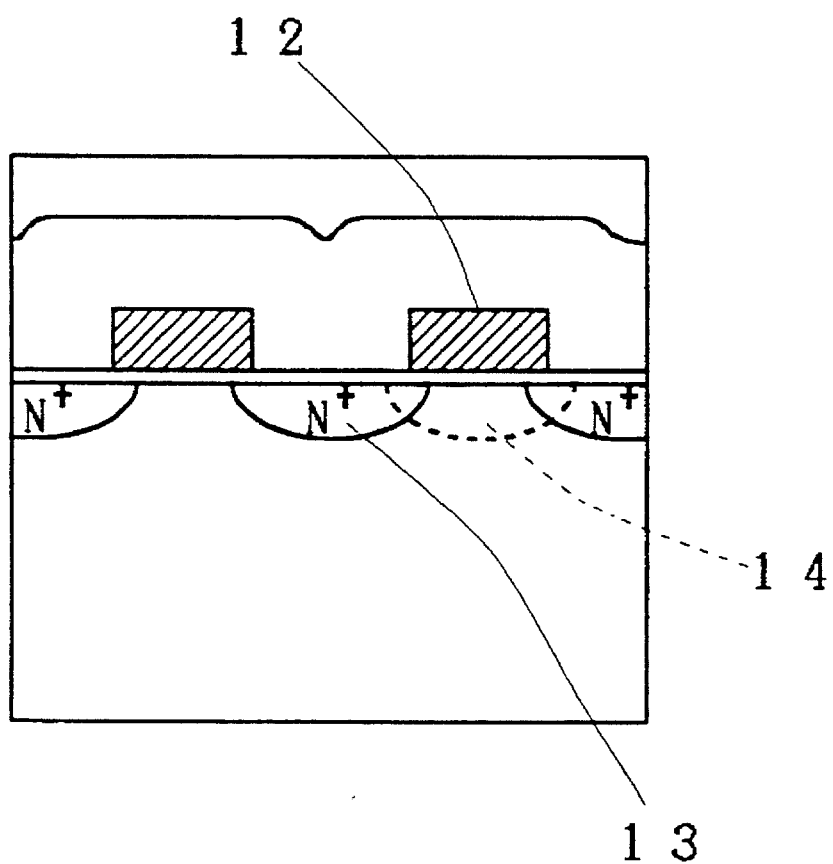
FIG. 44 is a sectional view taken along the line I—I in FIG. 40.
Figure 45:
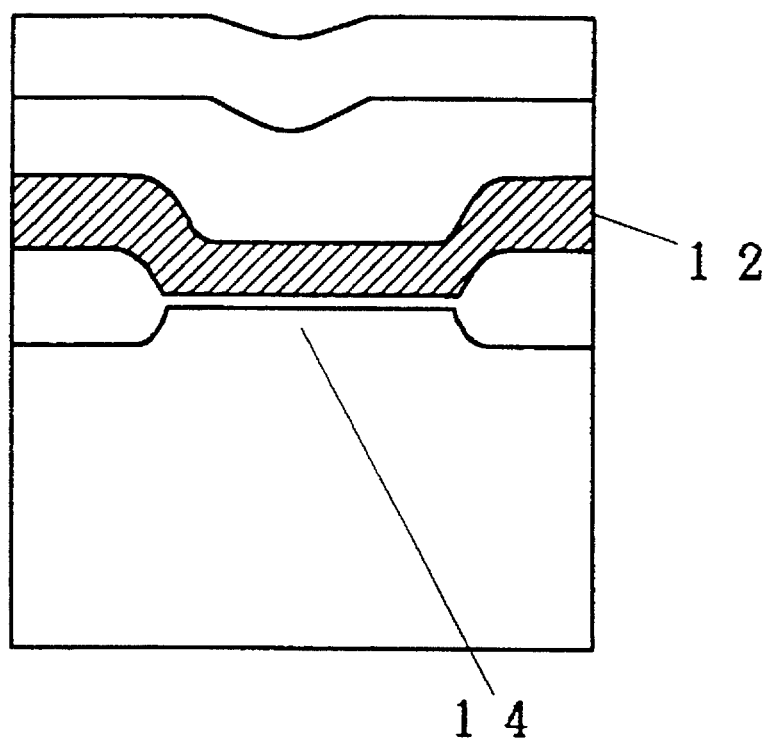
FIG. 45 is a sectional view taken along the line J—J in FIG. 40.
Figure 46:
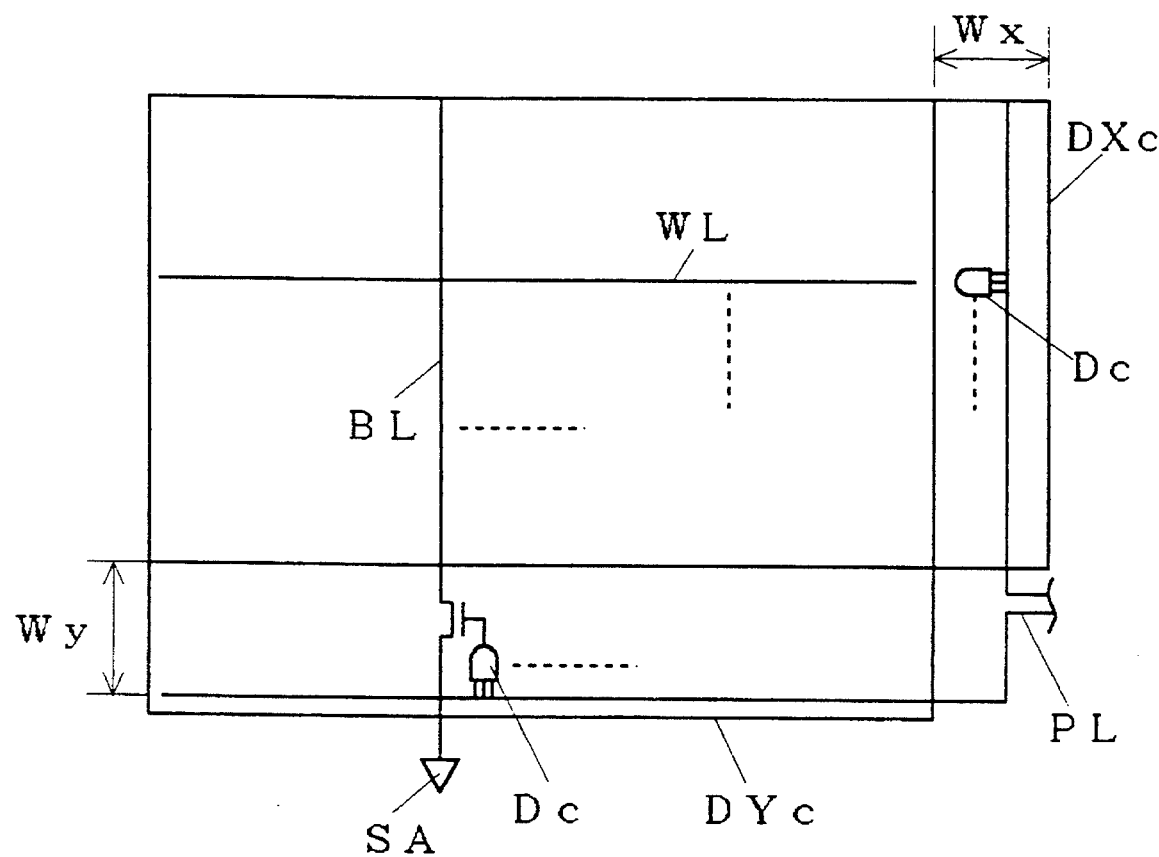
FIG. 46 is a plan view schematically showing a semiconductor memory device according to third prior art.
Figure 47:
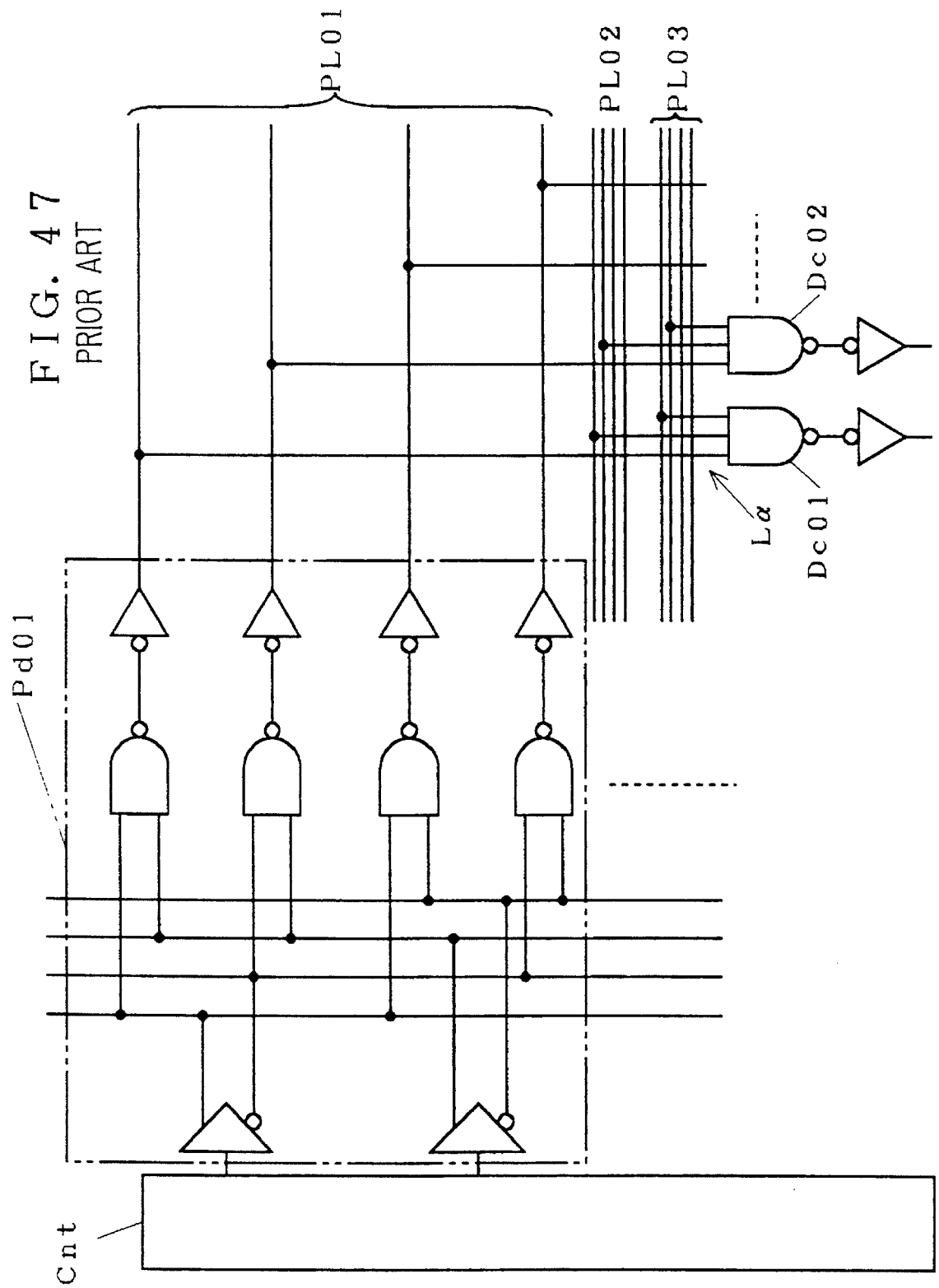
FIG. 47 is a circuit diagram schematically showing a peripheral circuit part of the semiconductor memory device according to the third prior art.
Figure 48:
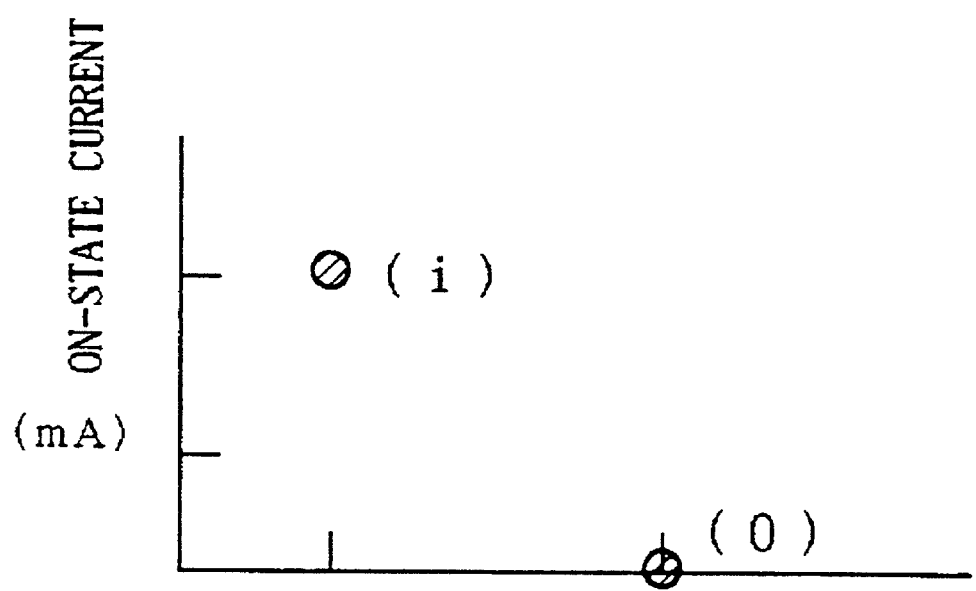
FIG. 48 illustrates output data in respective parts of the semiconductor memory devices according to the first prior art and the second prior art.

(1) While the ternary memory cell array is formed in a NOR flat cell system in the fifth embodiment, the same may be replaced by a NAND system one as shown in FIG. 39. Referring to FIG. 39, elements having functions which are similar to those in the third embodiment are denoted by the same reference numerals.

(2) While the respective address decoders according to the ninth embodiment are similar in structure to those in the sixth embodiment, the same may alternatively be structured similarly to those in the seventh or eighth embodiment.

While the invention has been shown and described in detail, the foregoing description is in all aspects illustrative and not restrictive. It is therefore understood that numerous modifications and variations can be devised without departing from the scope of the invention.

What is claimed is:

1. A semiconductor memory device being provided with a plurality of memory cells having gates, gate dielectric films, active regions, sources and drains, said semiconductor memory device comprising:

a semiconductor substrate;

a plurality of parallel strip-shaped bit lines formed in said semiconductor substrate, for forming said sources and said drains; and a plurality of parallel strip-shaped world lines provided on an upper surface of said semiconductor substrate above said bit lines and in a direction perpendicular to said bit lines, for forming said gates for respective said memory cells, said active regions being formed in regions between said sources and said drains immediately under said word lines, isolating zones being formed for isolating active regions of different memory cells from each other in regions between word lines, said plurality of word lines having identical widths, side walls being formed at least on first ones of cross-directional side surfaces of said plurality of word lines, said isolating zones being formed by impurity implantation carried out through said word lines and said side walls serving as masks, widths of said active regions between pairs of isolating zones being set by presence/absence of said side walls.

2. A semiconductor memory device in accordance with claim 1, wherein said memory cells include any of a first memory cell having a threshold voltage of said active region different from those of other memory cells, a second memory cell having a first resistance value in said active region, and a third memory cell having a second resistance value in said active region, a word line corresponding to said second memory cell being provided with no side walls on its cross-directional side surfaces, and a side wall of said third memory cell being formed at least on one cross-directional side surface of a corresponding word line.

3. A semiconductor memory device in accordance with claim 1, wherein said memory cells include any of a first memory cell having a threshold voltage of said active region different from those of other memory cells, a second memory cell having a first resistance value in said active region, a third memory cell having a second resistance value in said active region, and a fourth memory cell having a third resistance value in said active region, a word line corresponding to said second memory cell being provided with no side walls on its cross-directional side surfaces, a side wall of said third memory cell being formed only on one cross-directional side surface of a corresponding word line, and side walls of said fourth memory cell being formed on both cross-directional side surfaces of a corresponding word line.

4. A semiconductor memory device in accordance with claim 1, further comprising:

a reference elements provided the every word line and connected to each memory cell, for setting a reference value to determine the type of each memory cell, and a comparison circuit for comparing currents or voltages of each reference elements and each memory cell with each other.

5. A semiconductor memory device in accordance with claim 4, wherein a main bit line is provided for supplying currents to said bit lines, a plurality of memory cell current paths are formed for supplying currents from said main bit line to respective memory cells through said bit lines, reference bit lines are connected to a plurality of said reference elements being provided for respective word lines, and reference current paths are formed to supply currents to respective reference elements through said reference bit lines, the number of said memory cell current paths per memory cell is larger than the number of said reference current paths per reference element.

6. A semiconductor memory device in accordance with claim 4, wherein a main bit line is provided for supplying currents to said bit lines, a plurality of memory cell current paths are formed for supplying currents from said main bit line to respective memory cells through said bit lines, reference bit lines are connected to a plurality of said reference elements being provided for respective word lines, and reference current paths are formed to supply currents to respective reference elements through said reference bit lines, said memory cell current paths per memory cell being identical in number and shape to said reference current paths per reference element, a memory cell bock selecting transistor is connected to each memory cell current path for selecting any block of said memory cells, and a reference block selecting transistor is connected to each reference current path for selecting any block of said reference elements, the number of said block selecting transistors and said current paths being identical.

7. A semiconductor memory device comprising:

a semiconductor substrate;

sources and drains formed on an upper layer of said semiconductor substrate for respective memory cells;

active regions formed between said sources and said drains for respective said memory cells;

a gate dielectric film formed at least on upper surfaces of said active regions; and a plurality of parallel strip-shaped word lines for forming gates formed on an upper surface of said gate dielectric film in regions immediately above said active regions, said plurality of word lines having the same widths, side walls being formed at least on first ones of cross-directional side surfaces of said plurality of word lines, and lengths of said active regions between said sources and said drains being set up by presence/absence of said side walls.

8. A semiconductor memory device in accordance with claim 7, wherein said memory cells include any of a first memory cell having a threshold voltage of said active region different from those of other memory cells, a second memory cell having a first resistance value in said active region, and a third memory cell having a second resistance value in said active region, a word line corresponding to said second memory cell being provided with no side walls on its cross-directional side surfaces, and a side wall of said third memory cell being formed at least on one cross-directional side surface of a corresponding word line.

9. A semiconductor memory device in accordance with claim 7, wherein said memory cells include any one of a first memory cell having a threshold voltage of said active region different from those of other memory cells, a second memory cell having a first resistance value in said active region, a third memory cell having a second resistance value in said active region, and a fourth memory cell having a third resistance value in said active region, a word line corresponding to said second memory cell being provided with no side walls on its cross-directional side surfaces, a side wall of said third memory cell being formed only on one cross-directional side surface of a corresponding word line, and side walls of said fourth memory cell being formed on both cross-directional side surfaces of a corresponding word line.

10. A semiconductor memory device in accordance with claim 7, further comprising:

a reference element provided for every word line and connected to each memory cell, for setting a reference value to determine the type of each memory cell, and a comparison circuit for comparing current or voltages of each reference element and each memory cell with each other.

11. A semiconductor memory device provided with a plurality of memory cells having gates, gate dielectric films, active regions, sources and drains, said semiconductor memory device comprising:

a semiconductor substrate;

a plurality of parallel strip-shaped bit lines formed in said semiconductor substrate for forming said sources and said drains; and a plurality of parallel strip-shaped word lines provided on an upper surface of said semiconductor substrate above said bit lines and in a direction perpendicular to said bit lines, for forming said gates for respective said memory cells, said memory cells including any of a first memory cell having a first threshold voltage in said active region, a second memory cell having a second threshold voltage in said active region, a third memory cell having a third threshold voltage in said active region, and a fourth memory cell having a fourth threshold voltage in said active region.

12. A semiconductor memory device in accordance with claim 11, wherein isolating zones are formed to isolate active regions of different memory cells from each other in regions between word lines, and side walls are formed at least on first cross-directional side surfaces of said word lines, said isolating zones being formed by impurity implantation being carried out through said word lines and said side walls serving as masks.

13. A semiconductor memory device in accordance with claim 11, further comprising:

a reference element provided for every word line and connected to each memory cell, for setting a reference value to determine the type of each memory cell, and a comparison circuit for comparing currents or voltages of each reference element and each memory cell with each other.

14. A semiconductor memory device in accordance with claim 13, wherein a main bit line is provided for supplying currents to said bit lines, a plurality of memory cell current paths are formed for supplying currents from said main bit line to respective memory cells through said bit lines, reference bit lines are connected to a plurality of said reference elements being provided for respective word lines, and reference current paths are formed to supply currents to respective reference elements through said reference bit lines, the number of said memory cell current paths per said memory cell is larger than the number of said reference current paths per reference element.

15. A semiconductor memory device in accordance with claim 13, wherein a main bit line is provided for supplying currents to said bit lines, a plurality of memory cell current paths are formed for supplying currents from said main bit line to respective memory cells through said bit lines, reference bit lines are connected to a plurality of said reference elements being provided for respective word lines, and reference current paths are formed to supply currents to respective reference elements through said reference bit lines, said memory cell current paths per memory cell being identical in number and shape to said reference current paths per reference element, a memory cell block selecting transistor is connected to each memory cell current path for selecting any block of said memory cells, and a reference block selecting transistor is connected to each reference current path for selecting any block of said reference elements, the numbers of said block selecting transistors and said current paths being identical.

16. A semiconductor memory device comprising:

a semiconductor substrate;

sources and drains formed on an upper layer of said semiconductor substrate for respective memory cells;

active regions formed between said sources and said drains for respective memory cells;

a gate dielectric film formed at least on upper surfaces of said active regions;

a plurality of parallel strip-shaped word lines for forming gates formed on an upper surface of said gate dielectric film in regions immediately above said active regions;

a reference element provided for every word line and connected to each memory cell, for setting a reference value to determine the type of each memory cell; and a comparison circuit for comparing currents or voltages of each reference element of each memory cell with each other, said memory cells including any of a first memory cell having a first threshold voltage in said active region, a second memory cell having a second threshold voltage in said active region, a third memory cell having a third threshold voltage in said active region, and a fourth memory cell having a fourth threshold voltage in said active region.

17. A semiconductor memory device provided with a plurality of memory cells having gates, gate dielectric films, active regions, sources and drains, said semiconductor memory device comprising:

a semiconductor substrate;

a plurality of parallel strip-shaped bit lines formed in said semiconductor substrate for forming said sources and said drains;

a plurality of parallel strip-shaped word lines provided on an upper surface of said semiconductor substrate above said bit lines and in a direction perpendicular to said bit lines, for forming said gates for respective said memory cells, said memory cells including any of a first memory cell having a first threshold voltage in said active region, a second memory cell having a second threshold voltage in said active region, a third memory cell having a third threshold voltage in said active region, and a fourth memory cell having a fourth threshold voltage in said active region, wherein isolating zones are formed to isolate active regions of different memory cells from each other in regions between word lines, and side walls are formed at least on first cross-directional side surfaces of said word lines, said isolating zones being formed by impurity implantation carried out through said word lines and said side walls serving as masks.

18. A semiconductor memory device provided with a plurality of memory cells having gates, gate dielectric films, active regions, sources and drains, said semiconductor memory device comprising:

a semiconductor substrate;

a plurality of parallel strip-shaped bit lines formed in said semiconductor substrate for forming said sources and said drains;

a plurality of parallel strip-shaped word lines provided on an upper surface of said semiconductor substrate above said bit lines and in a direction perpendicular to said bit lines, for forming said gates for respective said memory cells;

a reference element provided for every word line and connected to each memory cell, for setting a reference value to determine the type of each memory cell; and a comparison circuit for comparing currents or voltages of each reference element and each memory cell with each other, said memory cells including any of a first memory cell having a first threshold voltage in said active region, a second memory cell having a second threshold voltage in said active region, a third memory cell having a third threshold voltage in said active region, and a fourth memory cell having a fourth threshold voltage in said active region.

* * * * *